(12) United States Patent
Sugiura et al.

(10) Patent No.: US 10,833,100 B2
(45) Date of Patent: *Nov. 10, 2020

(54) THREE-DIMENSIONAL MEMORY DEVICE INCLUDING A DEFORMATION-RESISTANT EDGE SEAL STRUCTURE AND METHODS FOR MAKING THE SAME

(71) Applicant: SANDISK TECHNOLOGIES LLC, Addison, TX (US)

(72) Inventors: Kenji Sugiura, Yokkaichi (JP); Mitsuteru Mushiga, Kuwana (JP); Yuji Fukano, Yokkaichi (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,552

(22) Filed: Mar. 12, 2020

(65) Prior Publication Data

US 2020/0235123 A1 Jul. 23, 2020

Related U.S. Application Data

(63) Continuation of application No. 16/251,782, filed on Jan. 18, 2019, now Pat. No. 10,665,607.

(51) Int. Cl.
*H01L 27/11582* (2017.01)
*H01L 21/768* (2006.01)
(Continued)

(52) U.S. Cl.
CPC .. *H01L 27/11582* (2013.01); *H01L 21/76829* (2013.01); *H01L 23/5226* (2013.01);
(Continued)

(58) Field of Classification Search
CPC ......... H01L 27/11582; H01L 27/11556; H01L 27/11568; H01L 23/5226; H01L 27/10844; H01L 21/76829; H01L 27/1052
(Continued)

(56) References Cited

U.S. PATENT DOCUMENTS 5,915,167 A  6/1999  Leedy
9,691,784 B2 * 6/2017  Saito ................. H01L 27/11582
(Continued)

OTHER PUBLICATIONS

U.S. Appl. No. 15/873,101, filed Jan. 17, 2018, SanDisk Technologies LLC.
(Continued)

*Primary Examiner* — Fernando Hidalgo
(74) *Attorney, Agent, or Firm* — The Marbury Law Group, PLLC

(57) ABSTRACT

A vertically alternating stack of insulating layers and dielectric spacer material layers is formed over a semiconductor substrate. The vertically alternating stack is patterned into a first alternating stack located at a center region of a memory die and a second alternating stack that laterally encloses the first alternating stack. Memory stack structures are formed through the first alternating stack, and portions of the dielectric spacer material layers in the first alternating stack are replaced with electrically conductive layers while maintaining the second alternating stack intact. At least one metallic wall structure is formed through the second alternating stack. An edge seal assembly is provided, which includes at least one vertical stack of metallic seal structures. Each vertical stack of metallic seal structures vertically extends contiguously from a top surface of the semiconductor substrate to a bonding-side surface of the memory die, and includes a respective metallic wall structure.

20 Claims, 67 Drawing Sheets

(51) Int. Cl.
  *H01L 27/11568* (2017.01)
  *H01L 23/522* (2006.01)
  *H01L 27/11556* (2017.01)
  *H01L 27/105* (2006.01)
  *H01L 27/108* (2006.01)
(52) U.S. Cl.
  CPC .... *H01L 27/1052* (2013.01); *H01L 27/10844* (2013.01); *H01L 27/11556* (2013.01); *H01L 27/11568* (2013.01)
(58) Field of Classification Search
  USPC .......................................................... 365/51
  See application file for complete search history.

(56) References Cited

U.S. PATENT DOCUMENTS

| | | | |
|---|---|---|---|
| 9,793,139 | B2* | 10/2017 | Sharangpani ....... H01L 27/1157 |
| 9,806,088 | B2* | 10/2017 | Inatsuka ........... H01L 27/11565 |
| 10,115,681 | B1 | 10/2018 | Ariyoshi |
| 2016/0079255 | A1 | 3/2016 | Sonehara et al. |
| 2017/0103995 | A1 | 4/2017 | Tatano et al. |
| 2017/0125538 | A1 | 5/2017 | Sharangpani et al. |
| 2018/0012903 | A1 | 1/2018 | Kim et al. |
| 2018/0130743 | A1 | 5/2018 | Shigetoshi |
| 2018/0342455 | A1 | 11/2018 | Nosho et al. |
| 2018/0366487 | A1 | 12/2018 | Okizumi et al. |
| 2019/0371813 | A1* | 12/2019 | Oike ................. H01L 27/11565 |

OTHER PUBLICATIONS

U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 62/720,327, filed Aug. 21, 2018, SanDisk Technologies LLC.
Endoh, T. et al., "Novel Ultra High Density Memory with a Stacked-Surrounding Gate Transistor (S-SGT) Structured Cell," IEDM Proc., (2001), 33-36.
Notification of Transmittal of the International Search Report and Written Opinion of the International Search Authority or International Patent Application No. PCT/US2019/062736, dated Apr. 8, 2020, 12 pages.

* cited by examiner

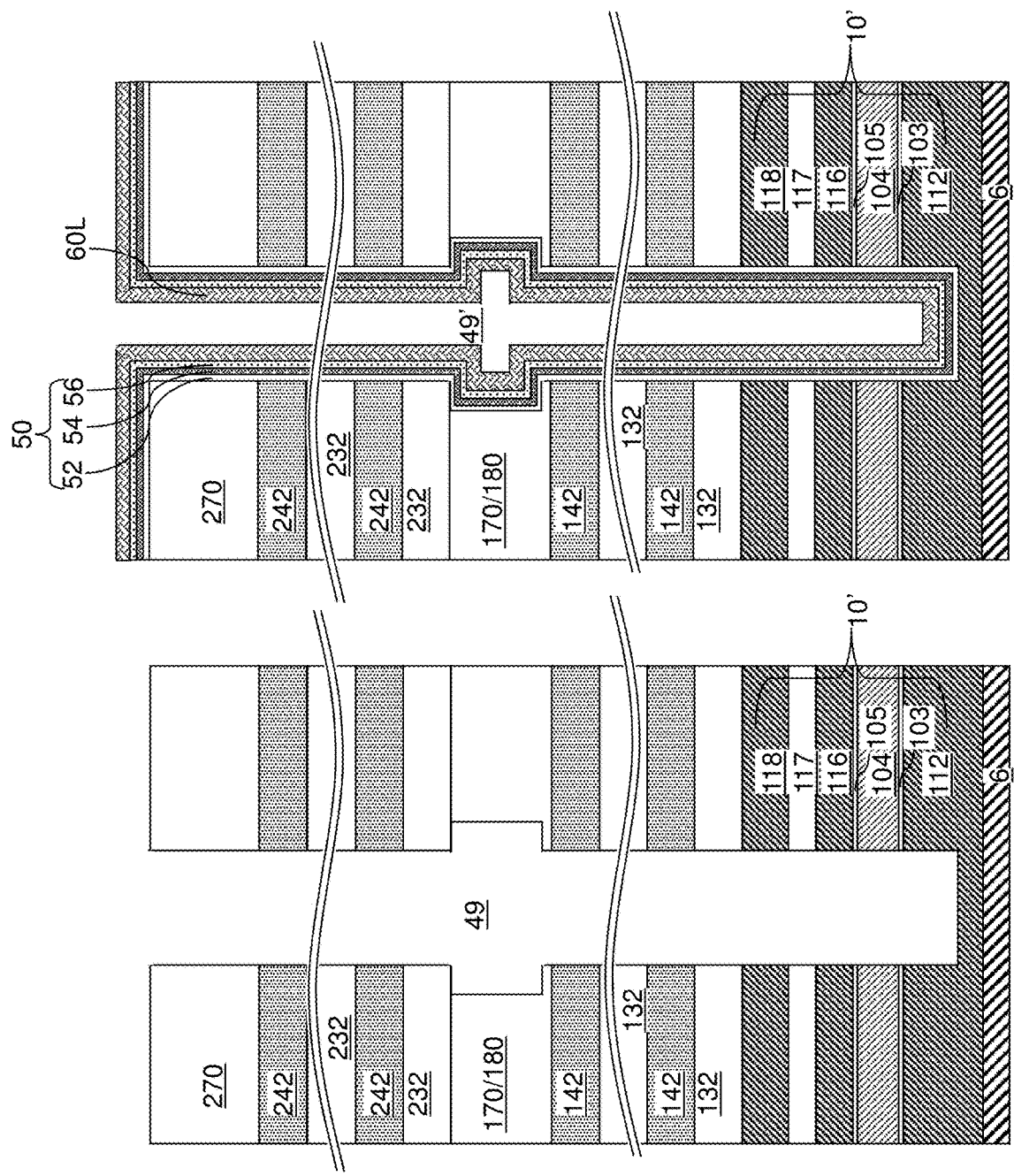

THREE-DIMENSIONAL MEMORY DEVICE INCLUDING A DEFORMATION-RESISTANT EDGE SEAL STRUCTURE AND METHODS FOR MAKING THE SAME

FIELD

The present disclosure relates generally to the field of semiconductor devices, and particular to a three-dimensional memory device including a deformation-resistant edge structure and methods of manufacturing the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided including a memory die that comprises a first alternating stack of first insulating layers and electrically conductive layers located over a semiconductor substrate; memory stack structures vertically extending through the first alternating stack and comprising vertical stacks of memory elements; a second alternating stack of second insulating layers and spacer dielectric layers that laterally surrounds the first alternating stack and located over the semiconductor substrate; memory-die bonding pads included in upper-level dielectric material layers and located on a bonding-side surface of the memory die; and an edge seal assembly comprising at least one vertical stack of metallic seal structures, wherein each of the at least one vertical stack of metallic seal structures vertically extends contiguously from a top surface of the semiconductor substrate to the bonding-side surface of the memory die and comprises a respective metallic wall structure that extends through the second alternating stack and laterally encloses the first alternating stack, wherein the second alternating stack comprises multiple nested portions divided by the respective metallic wall structure.

According to another aspect of the present disclosure, a method of forming a three-dimensional memory device is provided. The method comprises forming a memory die using the processing steps of: forming a vertically alternating stack of insulating layers and dielectric spacer material layers over a semiconductor substrate; patterning the vertically alternating stack into a first alternating stack of first insulating layers and sacrificial material layers and a second alternating stack of second insulating layers and spacer dielectric layers, wherein the second alternating stack laterally encloses, and is laterally spaced from, the first alternating stack; forming memory stack structures comprising vertical stacks of memory elements through the first alternating stack; replacing the sacrificial material layers with electrically conductive layers while retaining the second alternating stack intact; forming at least one metallic wall structure vertically through the second alternating stack, wherein the at least one metallic wall structure divides the second alternating stack into multiple nested portions; forming memory-die bonding pads within dielectric material layers over the first alternating stack; and forming an edge seal assembly comprising at least one vertical stack of metallic seal structures, wherein each of the at least one vertical stack of metallic seal structures vertically extends contiguously from a top surface of the semiconductor substrate to a bonding-side surface of the dielectric material layers, and comprises a respective one of the at least one metallic wall structure.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

DETAILED DESCRIPTION

Figure 1A:
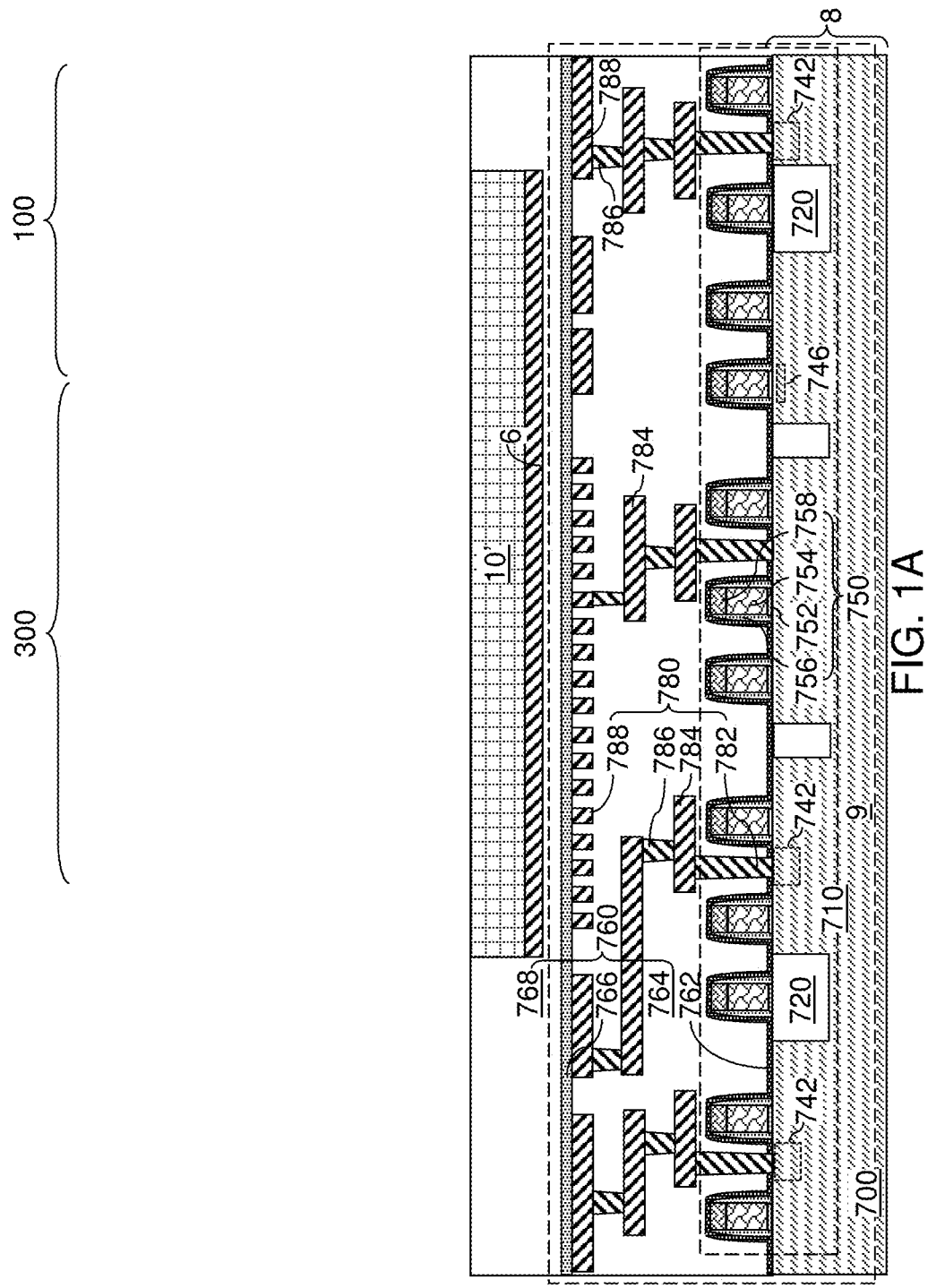
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

As discussed above, the embodiments of the present disclosure are directed to a three-dimensional memory device including a deformation-resistant edge structure and methods of manufacturing the same, the various aspects of which are described herein in detail. An edge seal is used to provide a protective barrier around a memory die of a three-dimensional memory device. As the total number of word lines increases in a three-dimensional memory device, deformation of memory dies increases, thereby increasing the difficulty in bonding or mounting of the memory dies. Various embodiments of the present disclosure provide a memory die that includes a deformation-resistant edge seal. This configuration reduces distortion of a semiconductor die, such as a memory die, and enhances bonding between two semiconductor dies. The embodiments of the present disclosure can be used to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
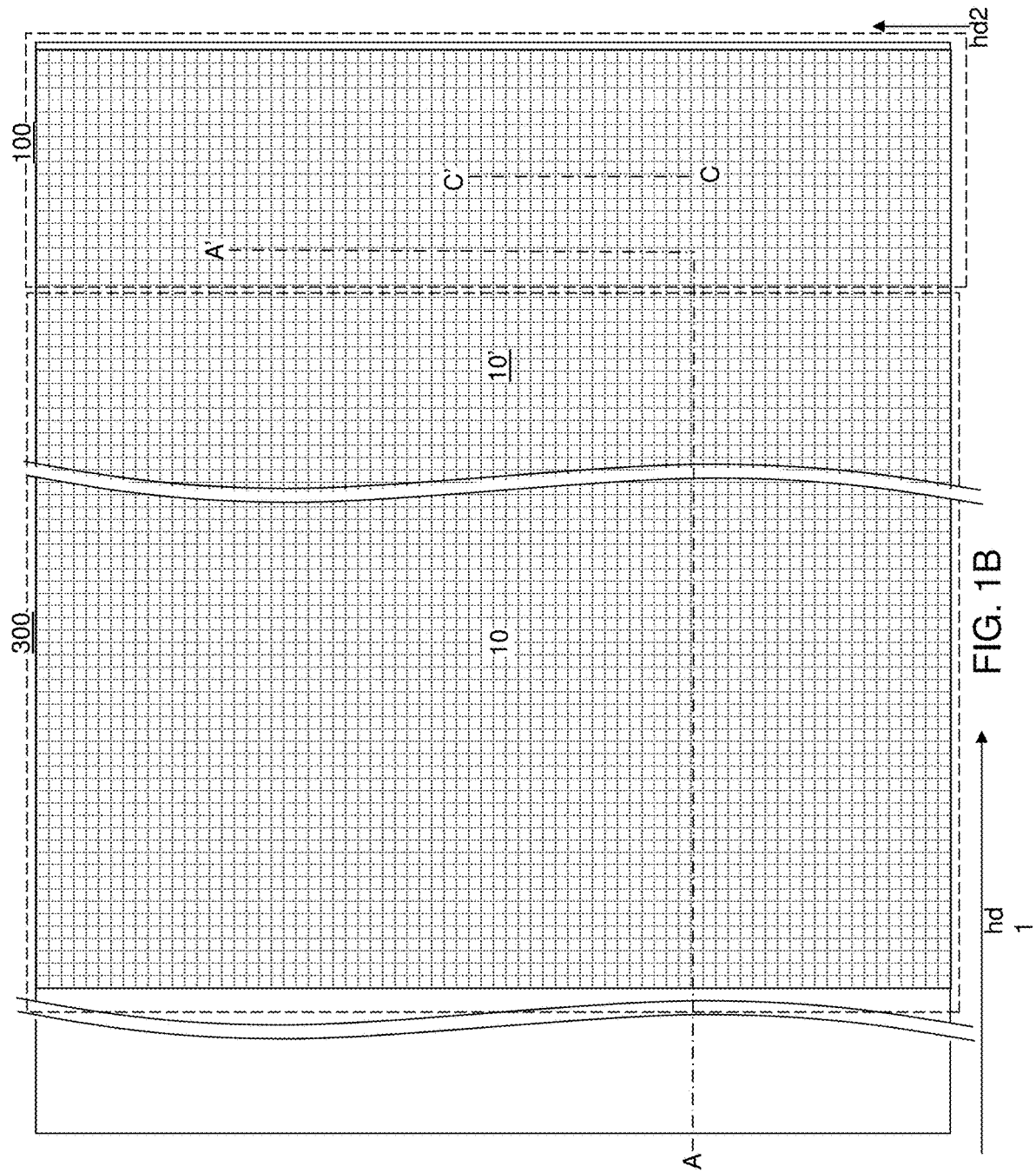
FIG. 1B is a top-down view of the first exemplary structure of FIG. 1A. The hinged vertical plane A-A' is the plane of the vertical cross-sectional view of FIG. 1A.
Figure 1C:
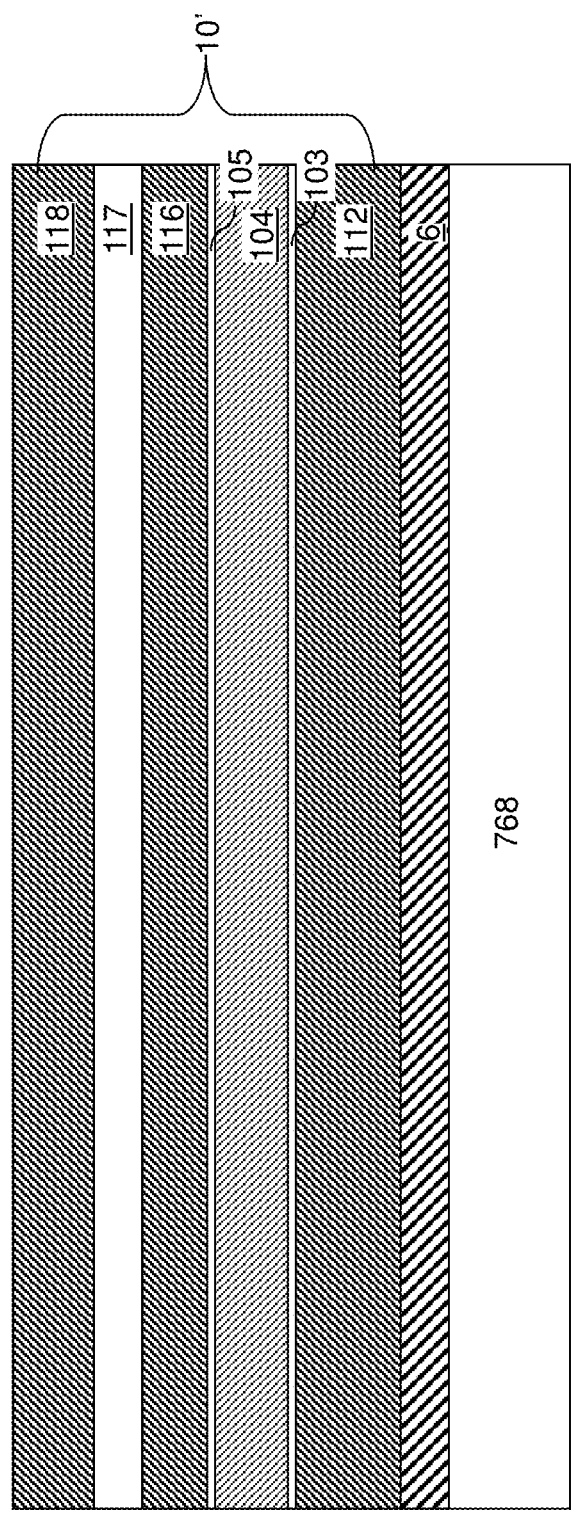
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation from other semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric material layer 768.

The dielectric layer stack including the lower-level dielectric material layers 760 functions as a matrix for lower-level metal interconnect structures 780 that provide electrical wiring between the various nodes of the semiconductor devices and landing pads for through-memory-level contact via structures to be subsequently formed. The lower-level metal interconnect structures 780 are formed or included within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be formed within the first dielectric material layers 764. The first dielectric material layers 764 may be a plurality of dielectric material layers in which various elements of the lower-level metal interconnect structures 780 are sequentially formed. Each dielectric material layer of the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer of the at least one second dielectric material layer 768 may include any of doped silicate glass, undoped silicate glass, and organosilicate glass. In one embodiment, the at least one second dielectric material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses can also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses can also be used.

The in-process source-level material layers 10' can include various layers that are subsequently modified to form source-level material layers. The source-level material layers, upon formation, include a source semiconductor layer that functions as a common source region for vertical field effect transistors of a three-dimensional memory device. In one embodiment, the in-process source-level material layers 10' can include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 can include a doped semiconductor material such as doped polysilicon or doped amorphous silicon. The conductivity type of the lower source-level material layer 112 and the upper source-level semiconductor layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 can be in a range from 10 nm to 300 nm, such as from 20 nm to 150 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' can be patterned such that an opening extends over a staircase region 300 in which contact via structures contacting word line electrically conductive layers are to be subsequently formed. In one embodiment, the staircase region 300 can be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' can be formed within the area of a memory array region 100, in which a three-dimensional memory array including memory stack structures is to be subsequently formed.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are included in the lower-level dielectric material layers 760.

The lower-level metal interconnect structures 780 can be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 2:
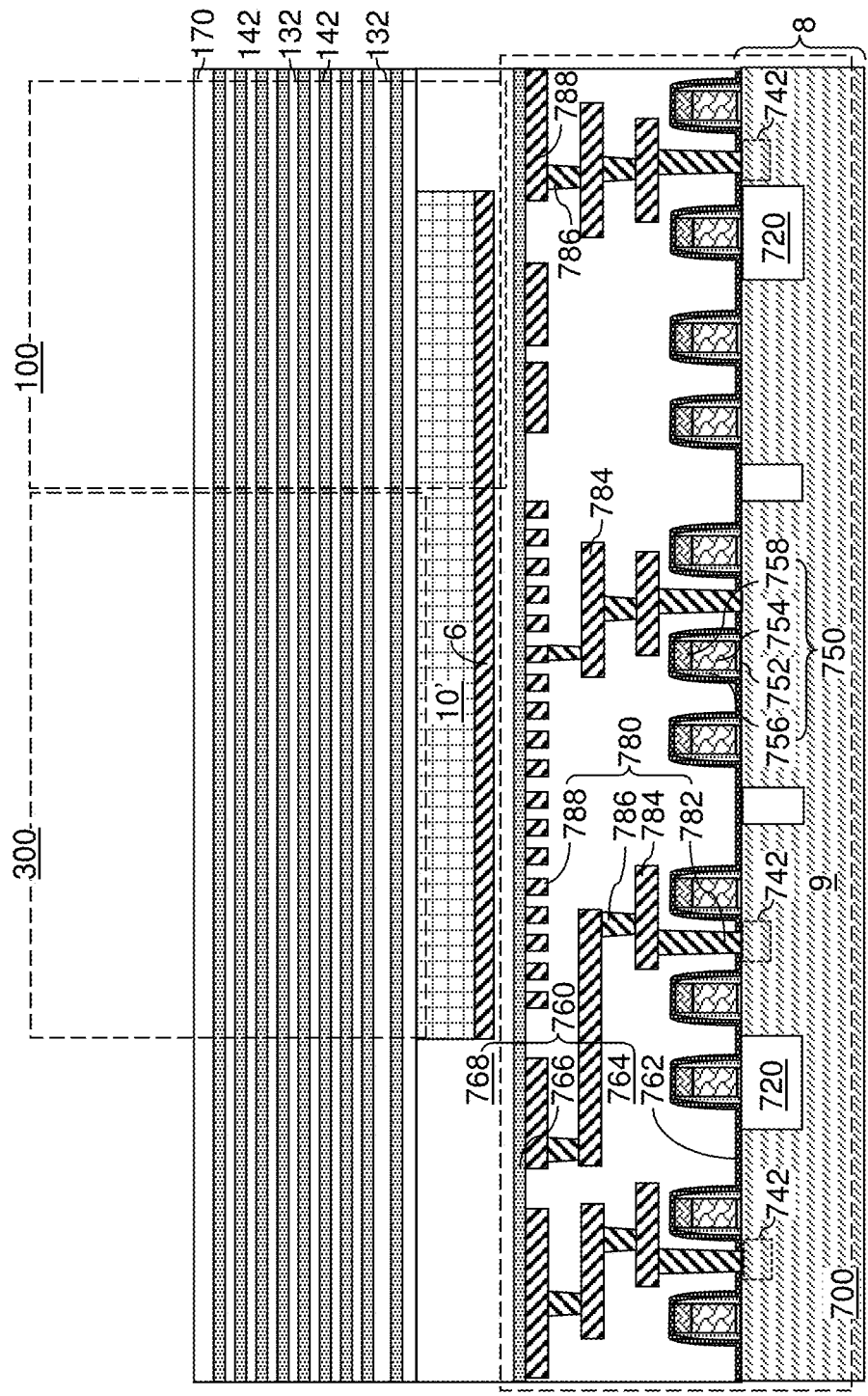
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layer is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first-tier insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first-tier insulating layers 132 and first-tier sacrificial material layers 142, respectively. In one embodiment, each first-tier insulating layer 132 can include a first insulating material, and each first-tier sacrificial material layer 142 can include a first sacrificial material that is a spacer dielectric material, i.e., a dielectric material that vertically spaces the first insulating material. An alternating plurality of first-tier insulating layers 132 and first-tier sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first-tier insulating layers 132 composed of the first material, and first-tier sacrificial material layers 142 composed of the second material, which is different from the first material. The first material of the first-tier insulating layers 132 can be at least one insulating material. Insulating materials that can be used for the first-tier insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first-tier insulating layers 132 can be silicon oxide.

The second material of the first-tier sacrificial material layers 142 is a sacrificial material that can be removed selective to the first material of the first-tier insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first-tier sacrificial material layers 142 may comprise an insulating material, a semiconductor material, or a conductive material. The second material of the first-tier sacrificial material layers 142 can be subsequently replaced with electrically conductive electrodes which can function, for example, as control gate electrodes of a vertical NAND device. In one embodiment, the first-tier sacrificial material layers 142 can be material layers that comprise silicon nitride.

In one embodiment, the first-tier insulating layers 132 can include silicon oxide, and sacrificial material layers can include silicon nitride sacrificial material layers. The first material of the first-tier insulating layers 132 can be deposited, for example, by chemical vapor deposition (CVD). For example, if silicon oxide is used for the first-tier insulating layers 132, tetraethylorthosilicate (TEOS) can be used as the precursor material for the CVD process. The second material of the first-tier sacrificial material layers 142 can be formed, for example, CVD or atomic layer deposition (ALD).

The thicknesses of the first-tier insulating layers 132 and the first-tier sacrificial material layers 142 can be in a range from 20 nm to 50 nm, although lesser and greater thicknesses can be used for each first-tier insulating layer 132 and for each first-tier sacrificial material layer 142. The number of repetitions of the pairs of a first-tier insulating layer 132 and a first-tier sacrificial material layer 142 can be in a range from 2 to 1,024, and typically from 8 to 256, although a greater number of repetitions can also be used. In one embodiment, each first-tier sacrificial material layer 142 in the first-tier alternating stack (132, 142) can have a uniform thickness that is substantially invariant within each respective first-tier sacrificial material layer 142.

A first insulating cap layer 170 is subsequently formed over the first alternating stack (132, 142). The first insulating cap layer 170 includes a dielectric material, which can be any dielectric material that can be used for the first-tier insulating layers 132. In one embodiment, the first insulating cap layer 170 includes the same dielectric material as the first-tier insulating layers 132. The thickness of the first insulating cap layer 170 can be in a range from 20 nm to 300 nm, although lesser and greater thicknesses can also be used.

Figure 3A:
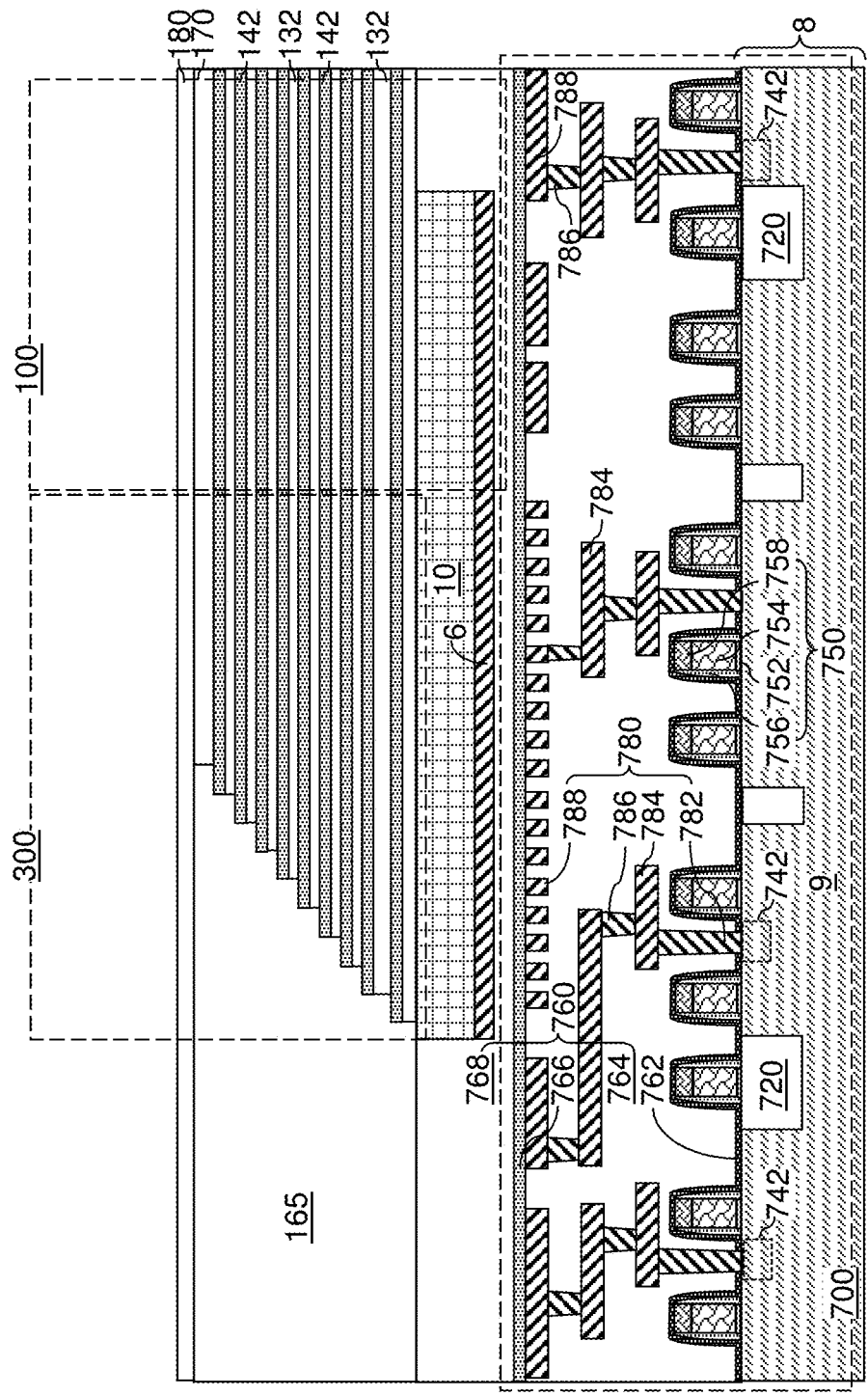
FIG. 3A is a vertical cross-sectional view of the first exemplary structure after patterning a first-tier staircase region, a first retro-stepped dielectric material portion, and an inter-tier dielectric layer according to an embodiment of the present disclosure.
Figure 3B:
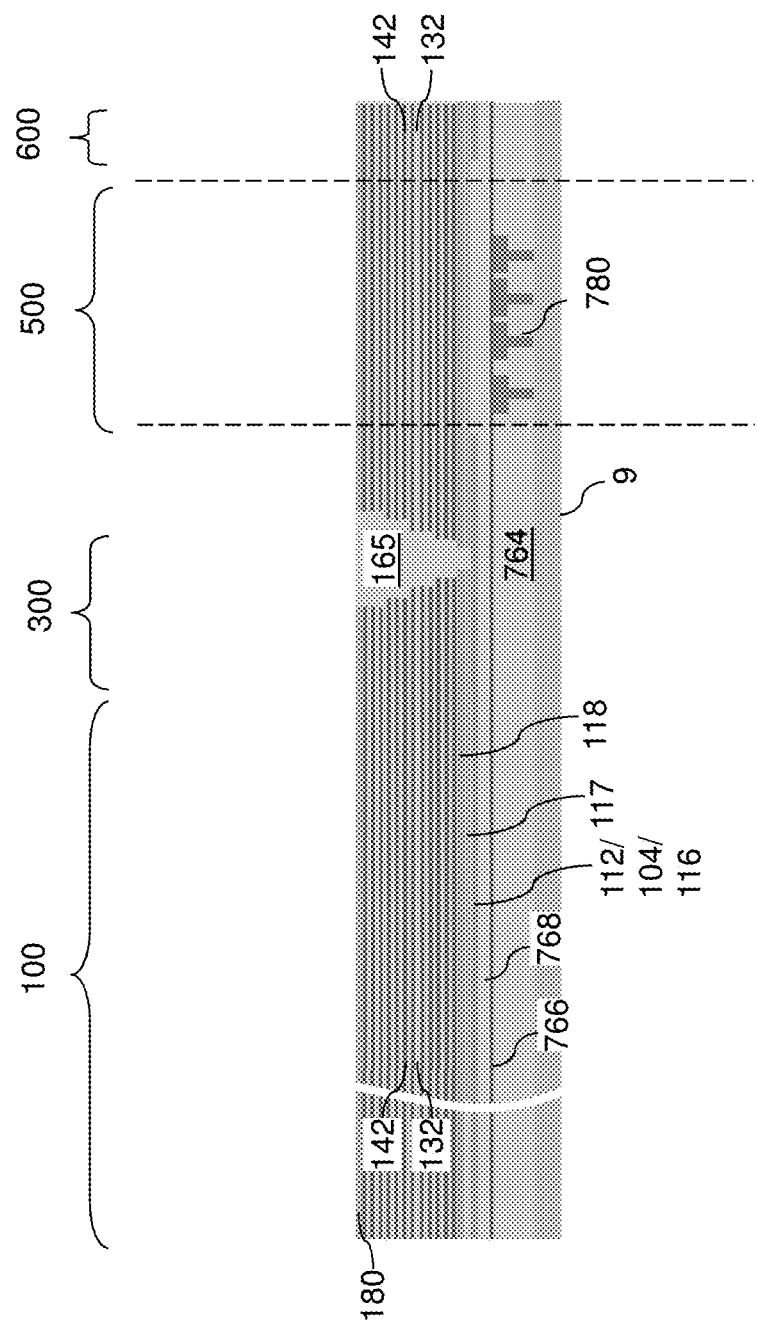
FIG. 3B is another vertical cross-sectional view of the first exemplary structure of FIG. 3A.
Figure 3C:
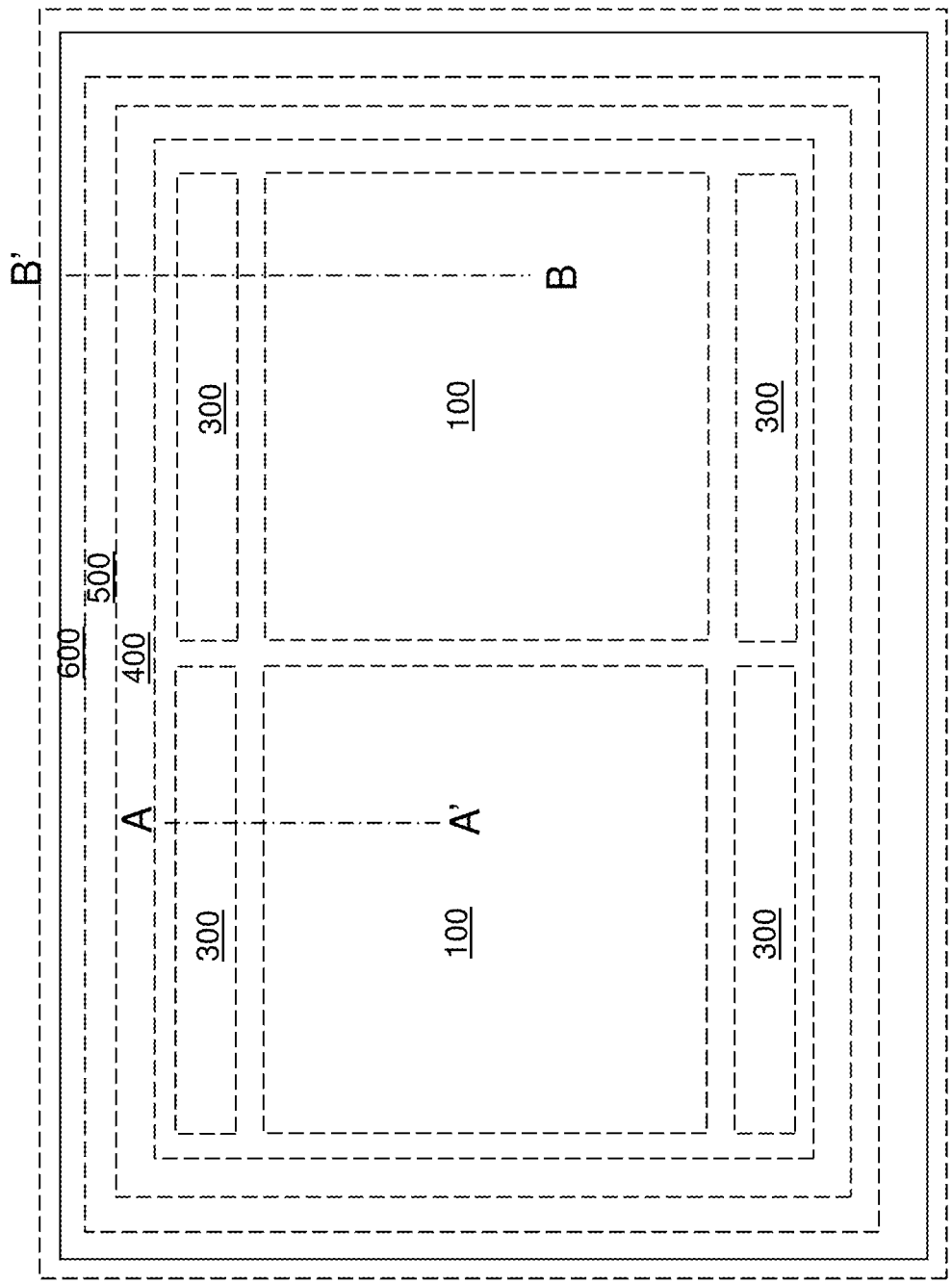
FIG. 3C is a schematic plan view of an in-process memory die that embodies the first exemplary structure of FIGS. 3A and 3B. The plane A-A' is the plane of the vertical cross-sectional view of FIG. 3A, and the plane B-B' is the plane of the vertical cross-sectional view of FIG. 3B.

Referring to FIGS. 3A-3C, the first insulating cap layer 170 and the first-tier alternating stack (132, 142) can be patterned to form first stepped surfaces in each staircase region 300. The area in which the first-tier alternating stack (132, 142) is patterned includes an annular area that is laterally offset from edges of a semiconductor die. A kerf region 600 can be provided on the inside of the edges of a semiconductor die. An edge seal region 500 that continuously extends around the entire edge of the semiconductor die can be provided inside the kerf region. An edge-side staircase region 400 is provided along the inner side of the edge seal region 500. In one embodiment, each staircase region 300 can face the edge-side staircase region 400 around the entire periphery of the semiconductor die.

The staircase region 300 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first-tier insulating layer 132 and a first-tier sacrificial material layer 142 located directly underneath the bottom surface of the etched cavity within the etched area. In one embodiment, top surfaces of the first-tier sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first-tier insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 4A:
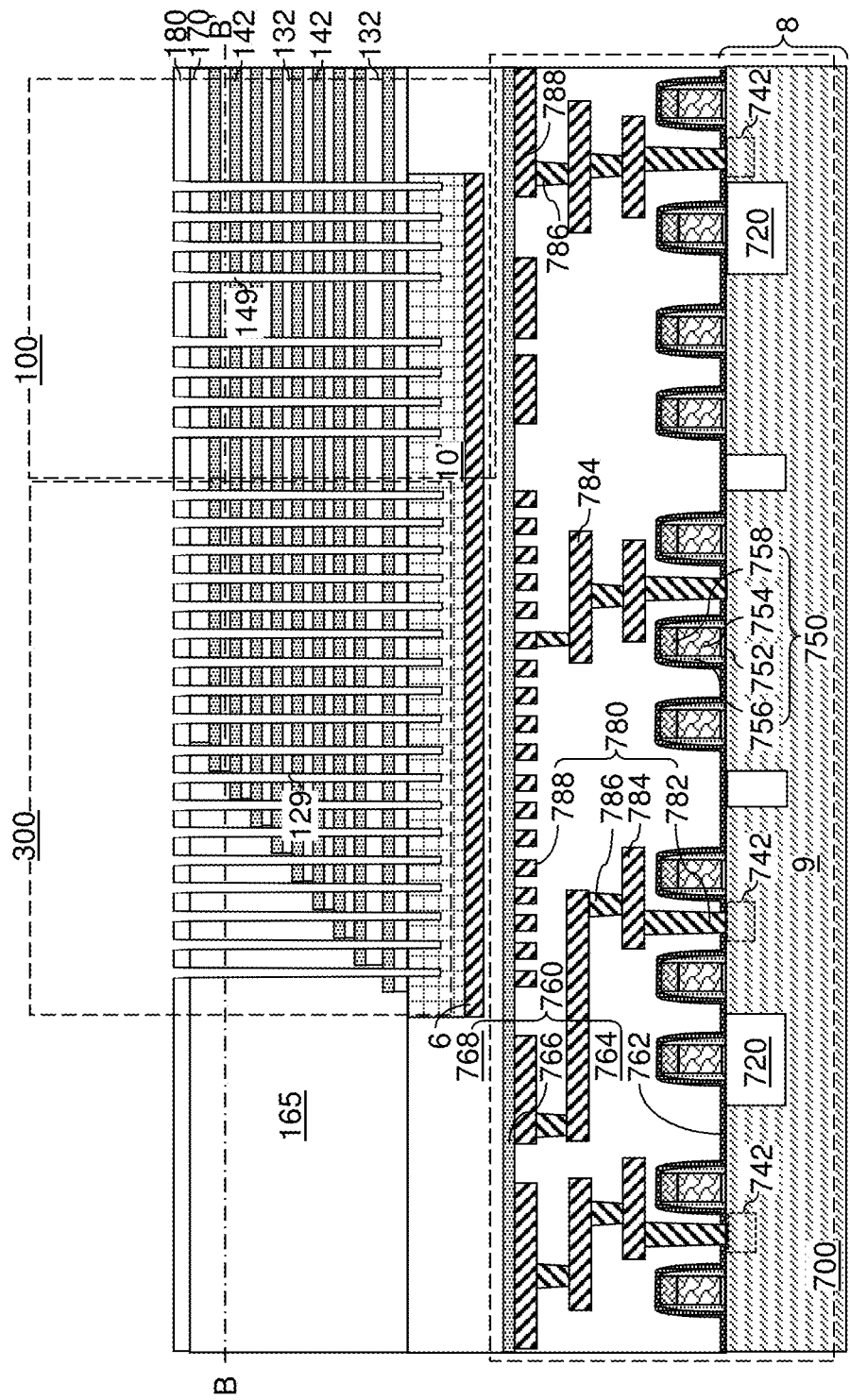
FIG. 4A is a vertical cross-sectional view of the first exemplary structure after formation of first-tier memory openings and first-tier support openings according to an embodiment of the present disclosure.
Figure 4B:
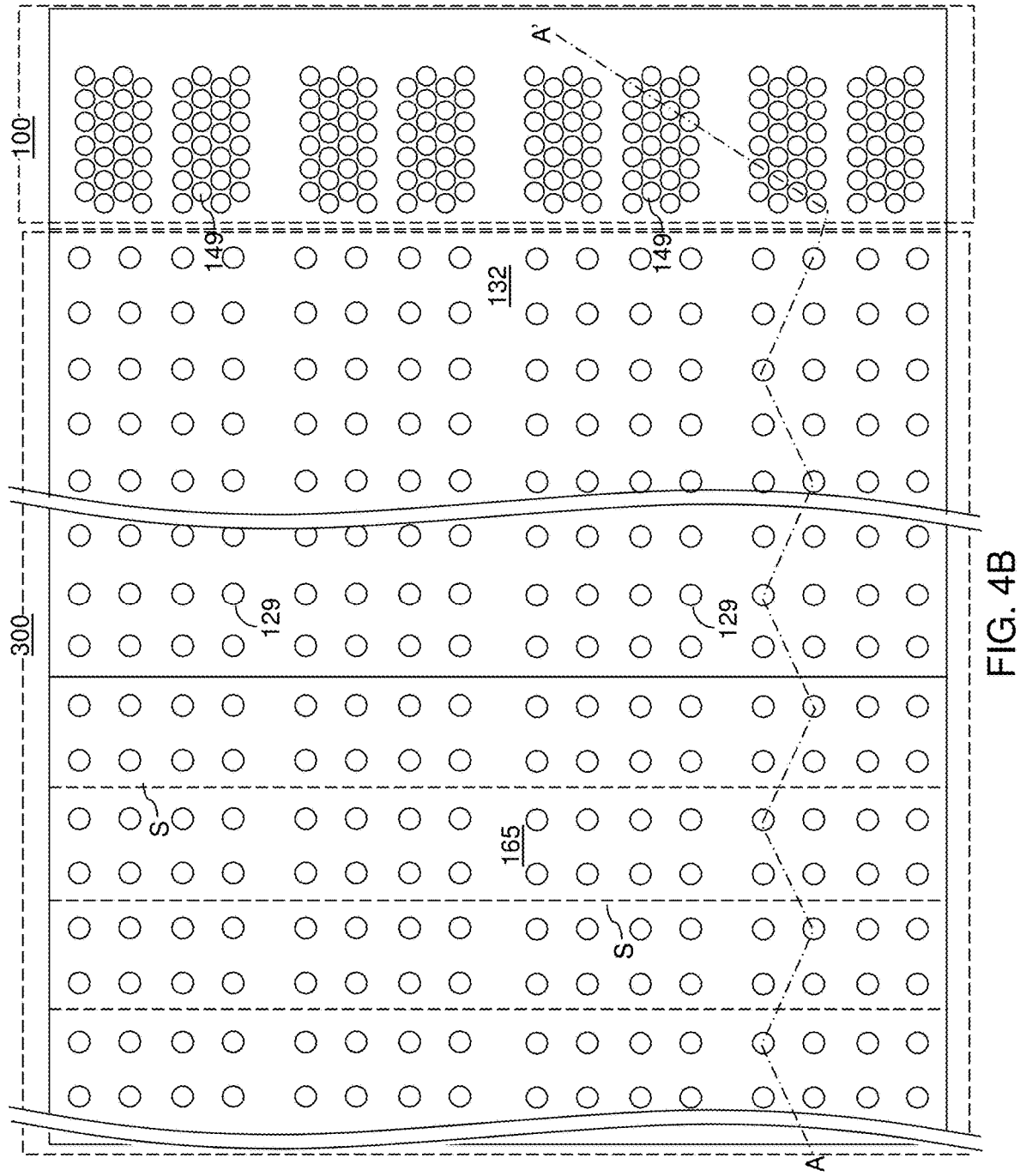
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129) can be formed through the inter-tier dielectric layer 180 and the first-tier structure (132, 142, 170, 165) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) can include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 300 and are subsequently used to form staircase-region contact via structures that interconnect a respective pair of an underlying lower-level metal interconnect structure 780 (such as a landing-pad-level metal line structure 788) and an electrically conductive layer (which can be formed as one of the spacer material layers or can be formed by replacement of a sacrificial material layer within the electrically conductive layer). A subset of the first-tier support openings 129 that is formed through the first retro-stepped dielectric material portion 165 can be formed through a respective horizontal surface of the first stepped surfaces. Further, each of the first-tier support openings 129 can be formed directly above (i.e., above, and with an areal overlap with) a respective one of the lower-level metal interconnect structure 780.

In one embodiment, the first anisotropic etch process can include an initial step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric material layer 768 with a higher etch rate than an average etch rate for the in-process source-level material layers 10'. For example, the terminal portion of the anisotropic etch process may include a step that etches the dielectric material(s) of the at least one second dielectric material layer 768 selective to a semiconductor material within a component layer in the in-process source-level material layers 10'. In one embodiment, the terminal portion of the first anisotropic etch process can etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process can include at least one etch chemistry for etching the various semiconductor materials of the in-process source-level material layers 10'. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first-tier insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
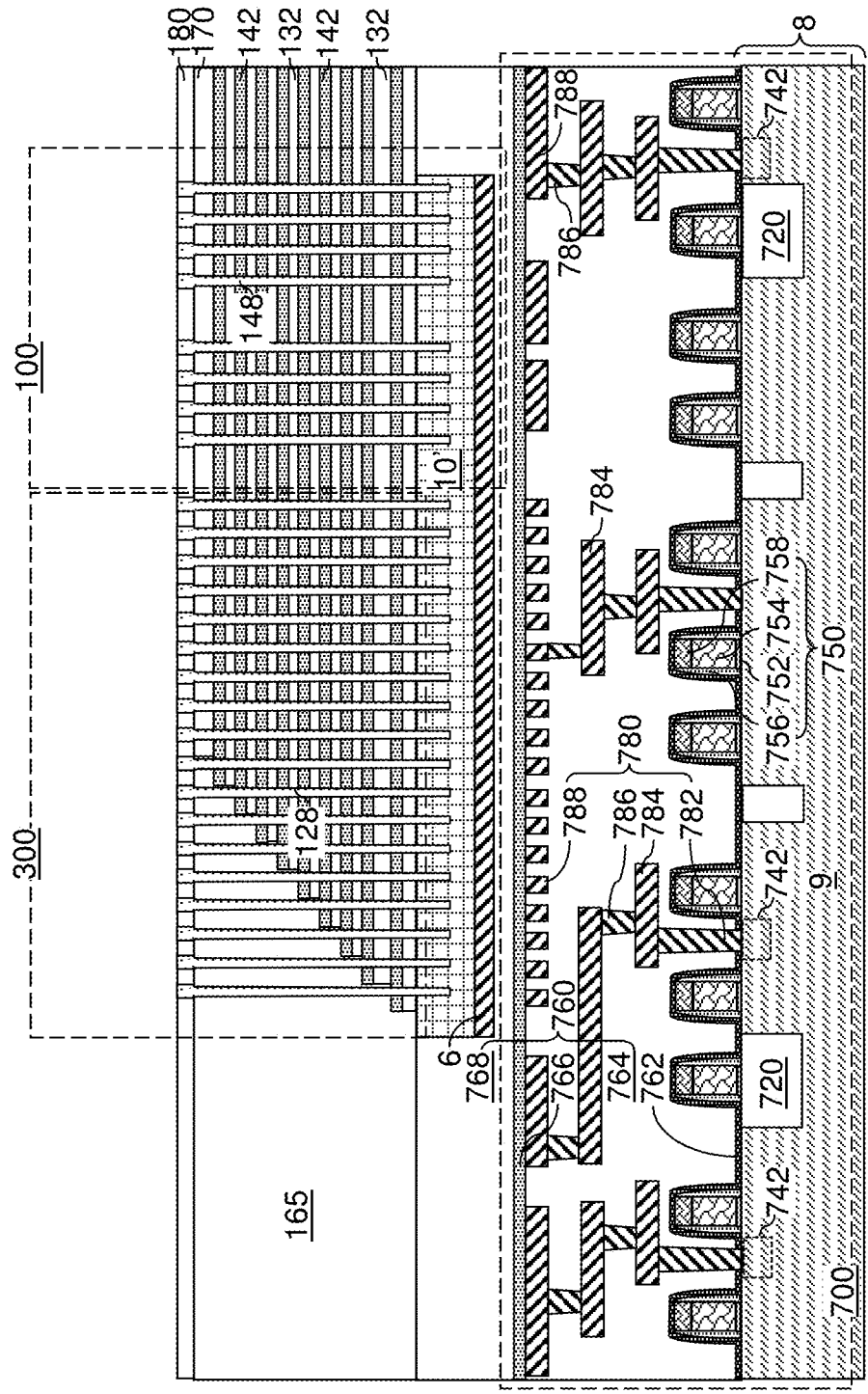
FIG. 5 is a vertical cross-sectional view of the first exemplary structure after formation of various sacrificial fill structures according to an embodiment of the present disclosure.

Referring to FIG. 5, sacrificial first-tier opening fill portions (148, 128) can be formed in the various first-tier openings (149, 129). For example, a sacrificial first-tier fill material is deposited concurrently deposited in each of the first-tier openings (149, 129). The sacrificial first-tier fill material includes a material that can be subsequently removed selective to the materials of the first-tier insulating layers 132 and the first-tier sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first-tier insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 6:
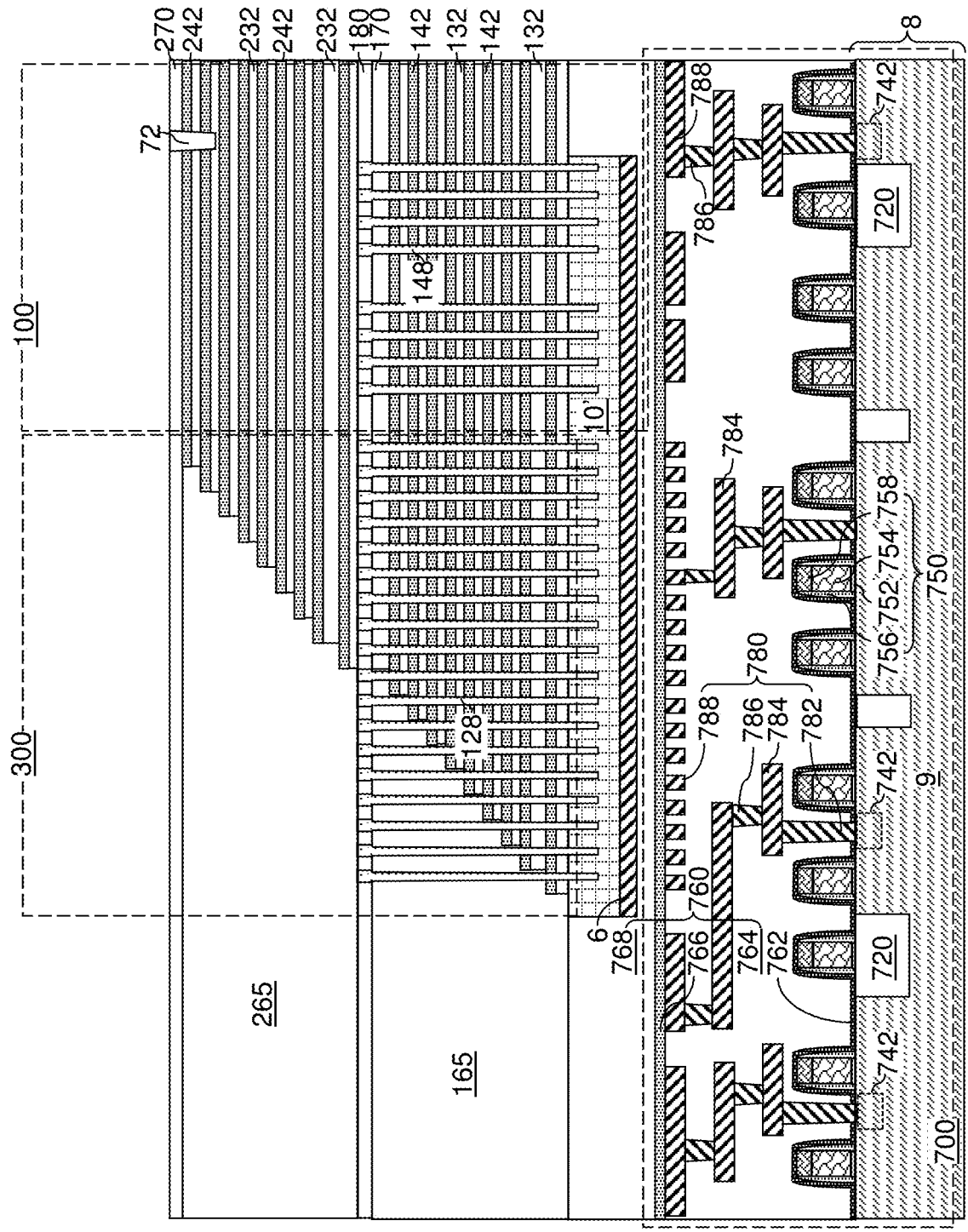
FIG. 6 is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first-tier insulating layer 132, and the fourth material can be the same as the second material of the first-tier sacrificial material layers 142.

In one embodiment, the third material layers can be second-tier insulating layers 232 and the fourth material layers can be second spacer material layers that provide vertical spacing between each vertically neighboring pair of the second-tier insulating layers 232. In one embodiment, the third material layers and the fourth material layers can be second-tier insulating layers 232 and second-tier sacrificial material layers 242, respectively. The third material of the second-tier insulating layers 232 may be at least one insulating material. The fourth material of the second-tier sacrificial material layers 242 may be a sacrificial material that can be removed selective to the third material of the second-tier insulating layers 232. The second-tier sacrificial material layers 242 can include a dielectric spacer material, and thus, can be dielectric spacer layers. The second-tier sacrificial material layers 242 may comprise an insulating material, a semiconductor material, or a conductive material. The fourth material of the second-tier sacrificial material layers 242 can be subsequently replaced with electrically conductive electrodes which can function, for example, as control gate electrodes of a vertical NAND device.

In one embodiment, each second-tier insulating layer 232 can include a second insulating material, and each second-tier sacrificial material layer 242 can include a second sacrificial material. In this case, the second alternating stack (232, 242) can include an alternating plurality of second-tier insulating layers 232 and second-tier sacrificial material layers 242. The third material of the second-tier insulating layers 232 can be deposited, for example, by chemical vapor deposition (CVD). The fourth material of the second-tier sacrificial material layers 242 can be formed, for example, CVD or atomic layer deposition (ALD).

The third material of the second-tier insulating layers 232 can be at least one insulating material. Insulating materials that can be used for the second-tier insulating layers 232 can be any material that can be used for the first-tier insulating layers 132. The fourth material of the second-tier sacrificial material layers 242 is a sacrificial material that can be removed selective to the third material of the second-tier insulating layers 232. Sacrificial materials that can be used for the second-tier sacrificial material layers 242 can be any material that can be used for the first-tier sacrificial material layers 142. In one embodiment, the second insulating material can be the same as the first insulating material, and the second sacrificial material can be the same as the first sacrificial material. The first-tier sacrificial material layers 142 and the second-tier sacrificial material layers 242 can be first dielectric spacer materials and second dielectric spacer materials, respectively, that have the same material composition such as the material composition of silicon nitride.

The thicknesses of the second-tier insulating layers 232 and the second-tier sacrificial material layers 242 can be in a range from 20 nm to 50 nm, although lesser and greater thicknesses can be used for each second-tier insulating layer 232 and for each second-tier sacrificial material layer 242. The number of repetitions of the pairs of a second-tier insulating layer 232 and a second-tier sacrificial material layer 242 can be in a range from 2 to 1,024, and typically from 8 to 256, although a greater number of repetitions can also be used. In one embodiment, each second-tier sacrificial material layer 242 in the second alternating stack (232, 242) can have a uniform thickness that is substantially invariant within each respective second-tier sacrificial material layer 242.

Second stepped surfaces in the second stepped area can be formed in the staircase region 300 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 300.

A second insulating cap layer 270 can be subsequently formed over the second alternating stack (232, 242). The second insulating cap layer 270 includes a dielectric material that is different from the material of the second-tier sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second-tier sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

At least one inner alternating stack {(132, 142), (232, 242)} can be formed within the areas of the memory array regions 100 and the staircase regions 300. Each inner alternating stack {(132, 142), (232, 242)} can be entirely encircled by the edge-side staircase region 400. An outer alternating stack {(132, 142), (232, 242)} encircles the set of all memory array regions 100 and all staircase regions 300. The outer alternating stack {(132, 142), (232, 242)} can be laterally spaced from each of the at least one inner alternating stack {(132, 142), (232, 242)} by a stack a first retro-stepped dielectric material portion 165 and a second retro-stepped dielectric material portion 265.

Figure 7A:
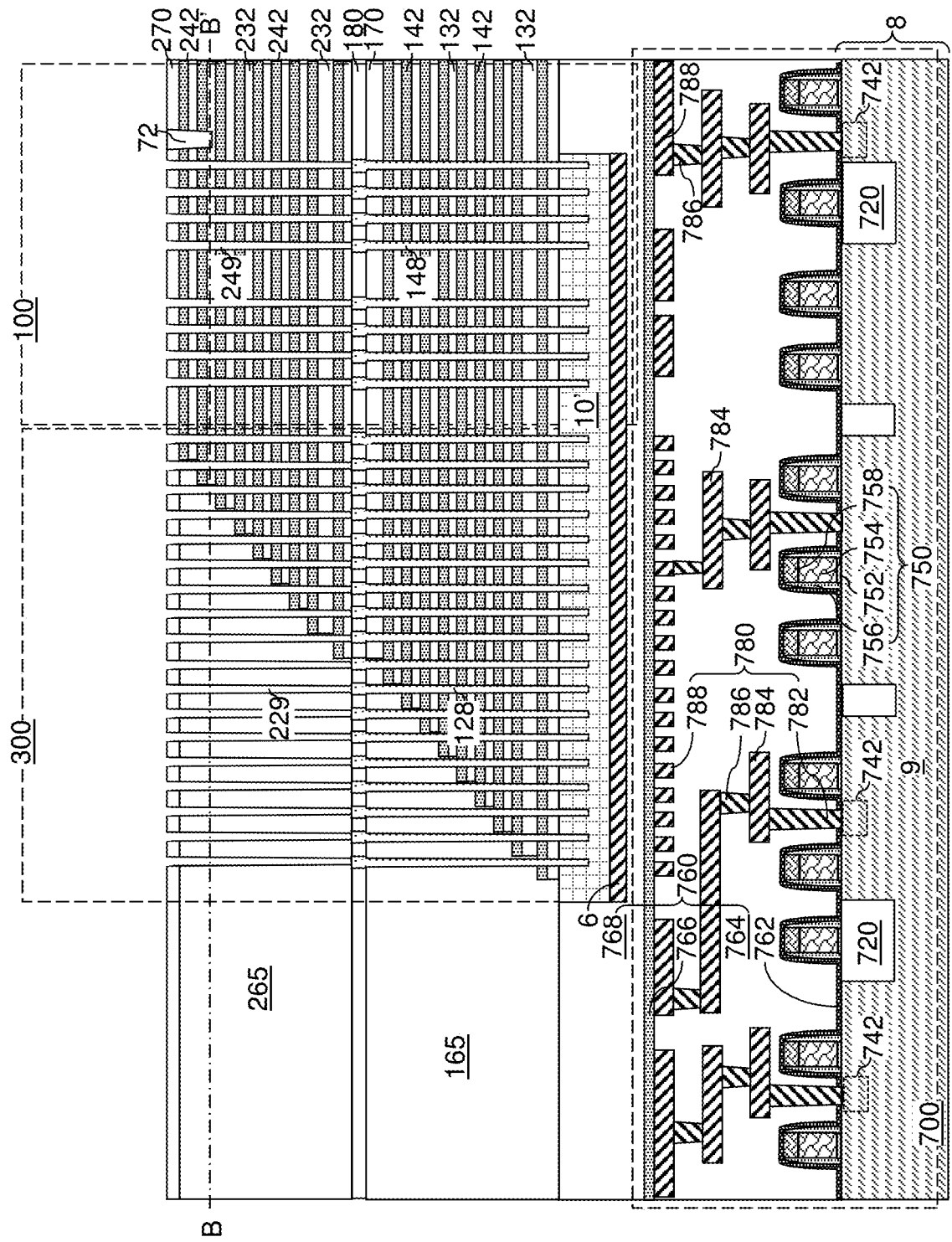
FIG. 7A is a vertical cross-sectional view of the first exemplary structure after formation of second-tier memory openings and second-tier support openings according to an embodiment of the present disclosure.
Figure 7B:
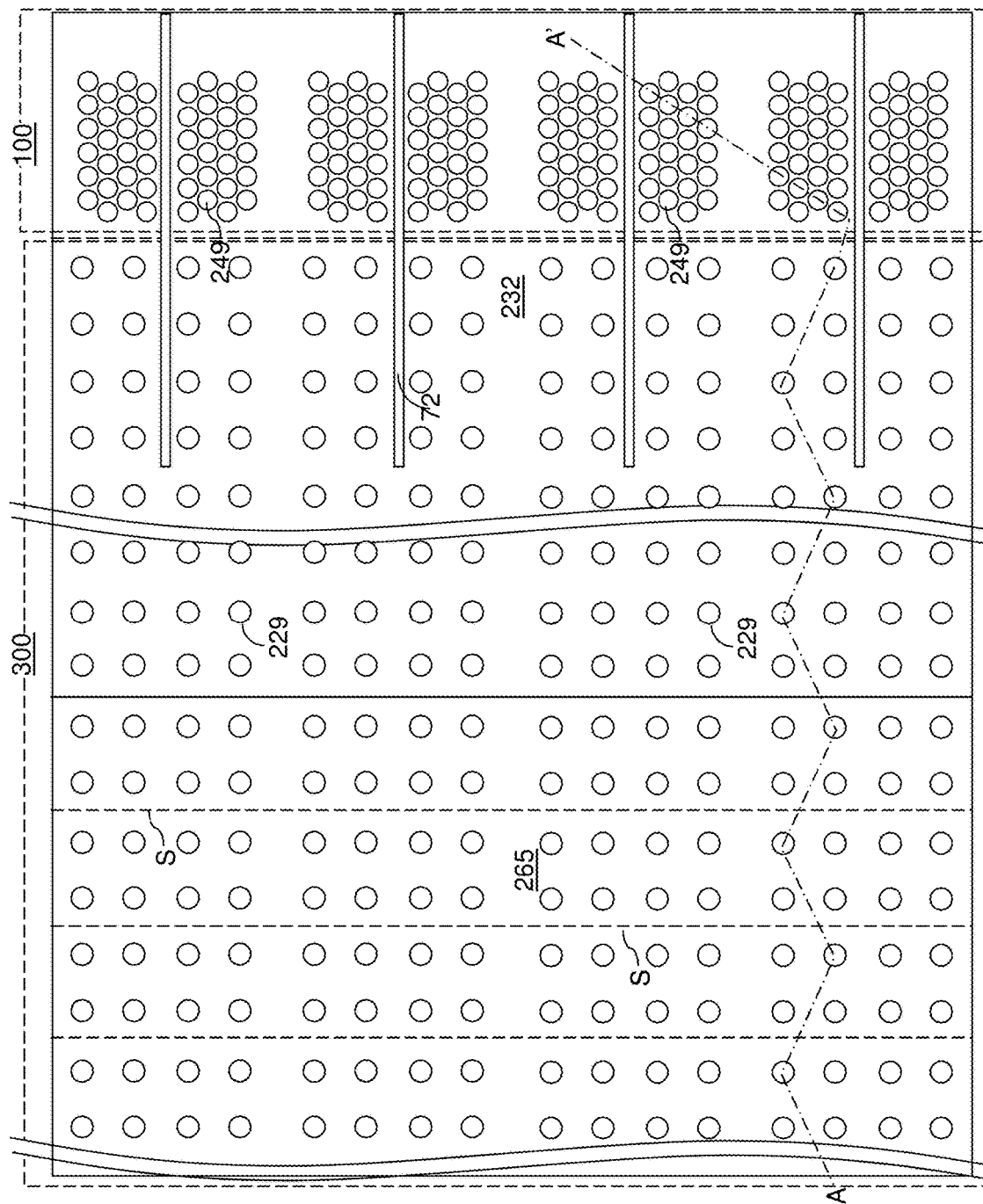
FIG. 7B is a horizontal cross-sectional of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 can be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset, and/or may be located entirely within, a periphery of a top surface of an underlying sacrificial first-tier opening fill portion (148, 128). The photoresist layer can be subsequently removed, for example, by ashing.

Figure 8:
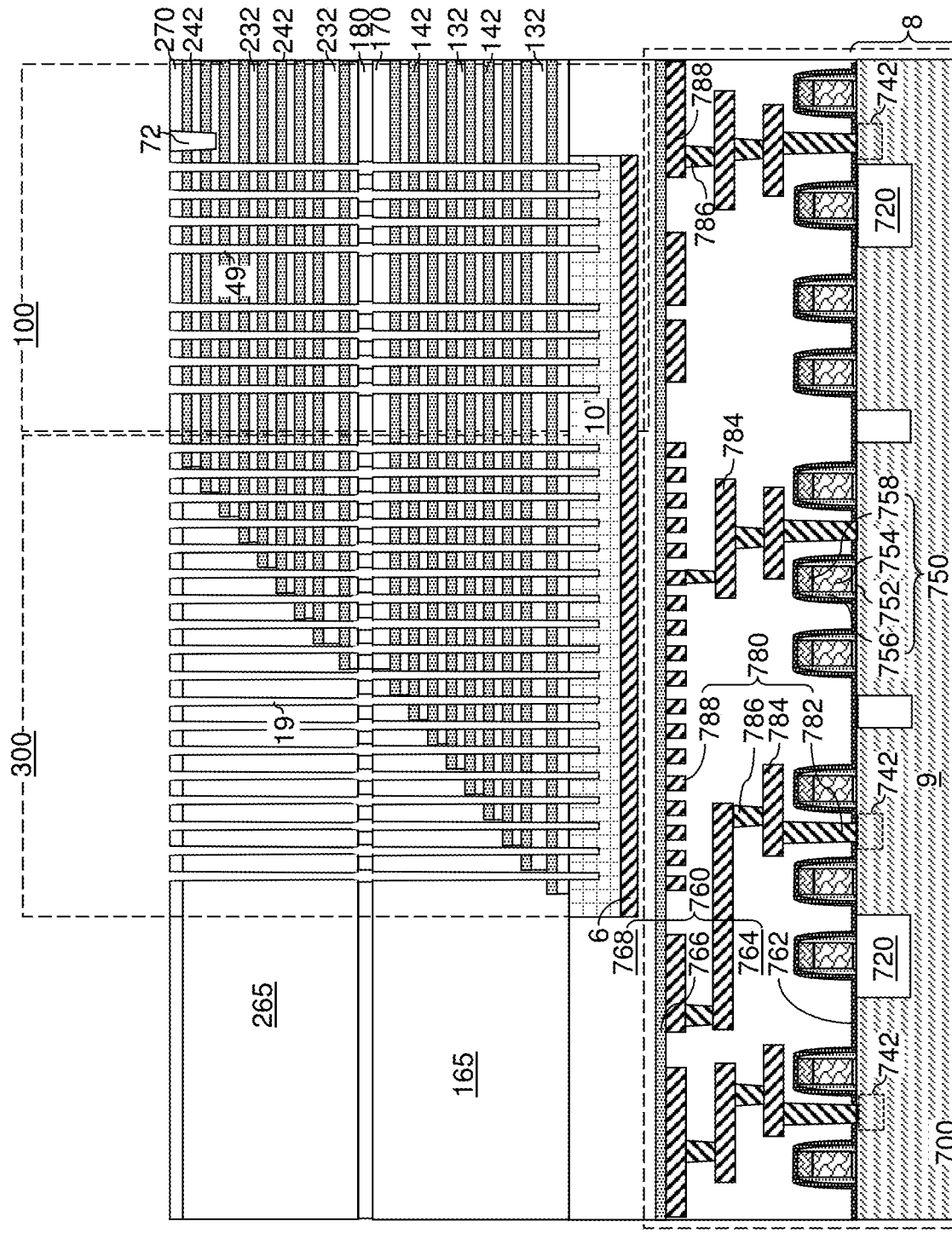
FIG. 8 is a vertical cross-sectional view of the first exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) can be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L can having a uniform doping. In one embodiment, the semiconductor channel material layer 60L can include a doped semiconductor material having a doping of a first conductivity type. In another embodiment, the semiconductor channel material layer 60L can include dopants of the first conductivity type at an atomic concentration in a range from $1.0 \times 10^{14}$/cm$^3$ to $1.0 \times 10^{18}$/cm$^3$, although lesser and greater dopants concentrations can also be used. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A cavity 49' is formed in the volume of each memory opening 49 that is not filled with the deposited material layers (52, 54, 56, 60L).

Figure 9D:
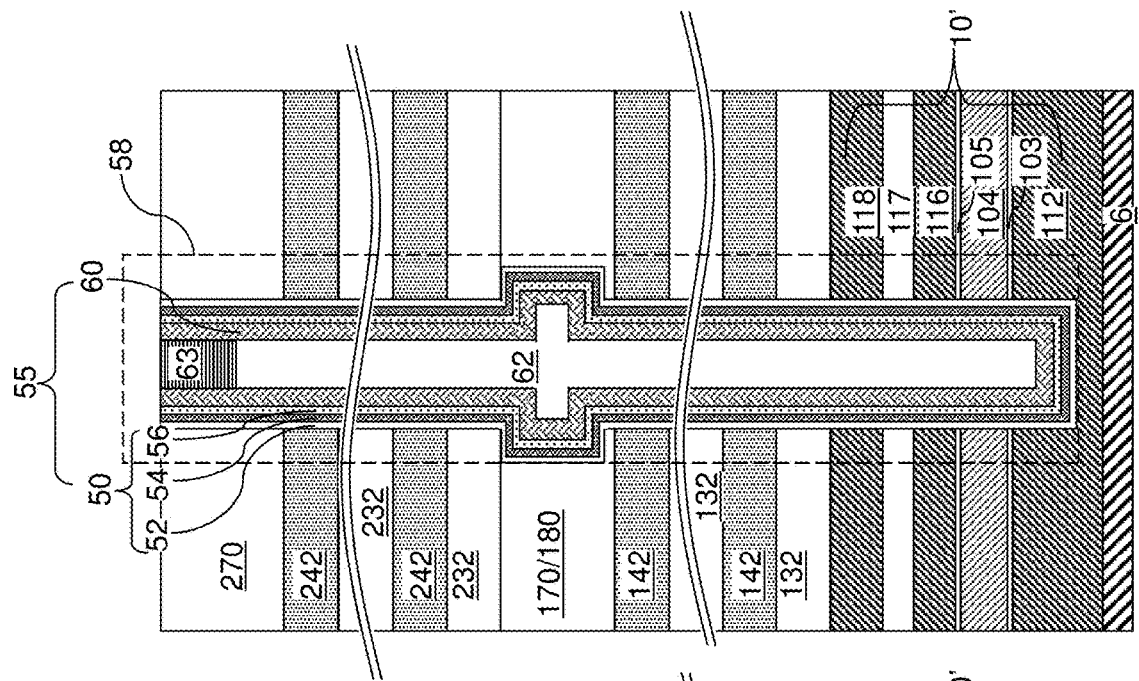
Figure 9C:
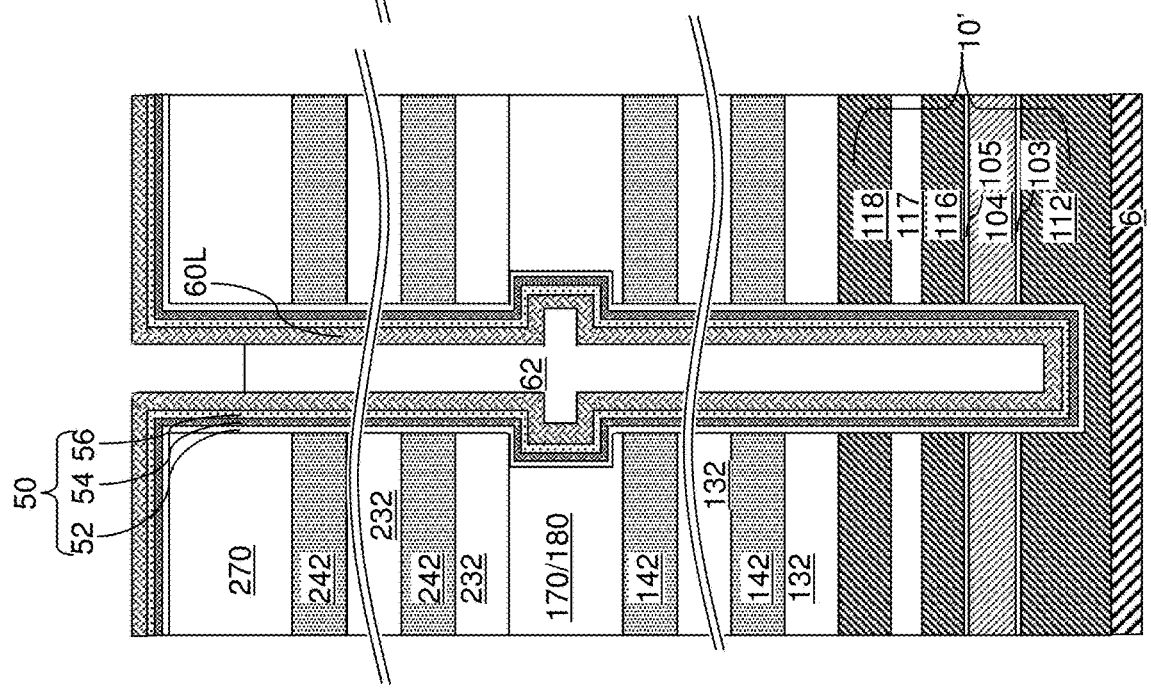

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material can be deposited in cavities overlying the dielectric cores 62. The doped semiconductor material has a doping of a second conductivity type that is the opposite of the first conductivity type. Thus, a p-n junction is formed at each interface between the semiconductor channel material layer 60L having a doping of the first conductivity type and the deposited doped semiconductor material having a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The dopant concentration in the drain regions 63 can be in a range from $5.0 \times 10^{19}$/cm$^3$ to $2.0 \times 10^{21}$/cm$^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10A:
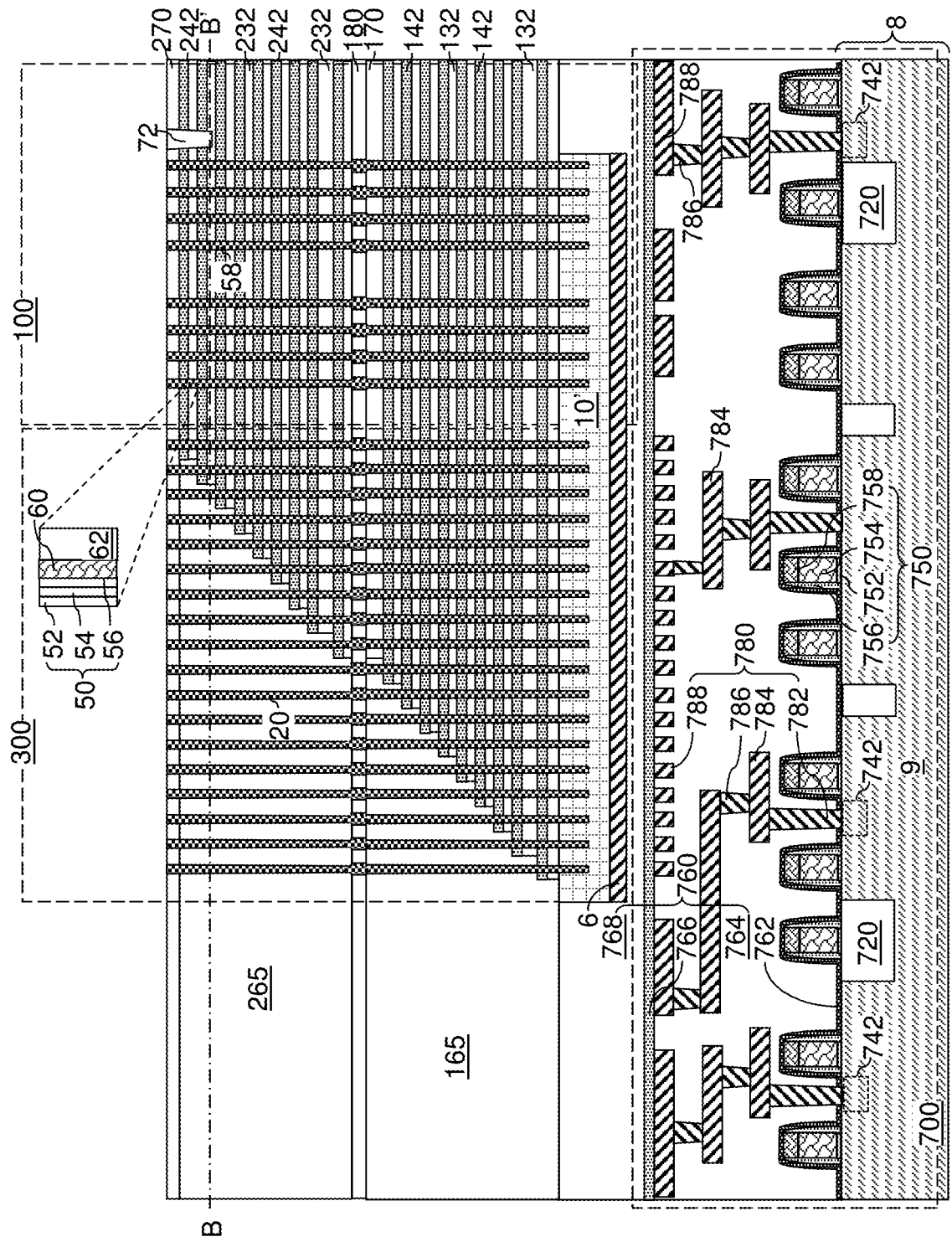
FIG. 10A is a vertical cross-sectional view of the first exemplary structure after formation of memory opening fill structures and support pillar structures according to an embodiment of the present disclosure.
Figure 10B:
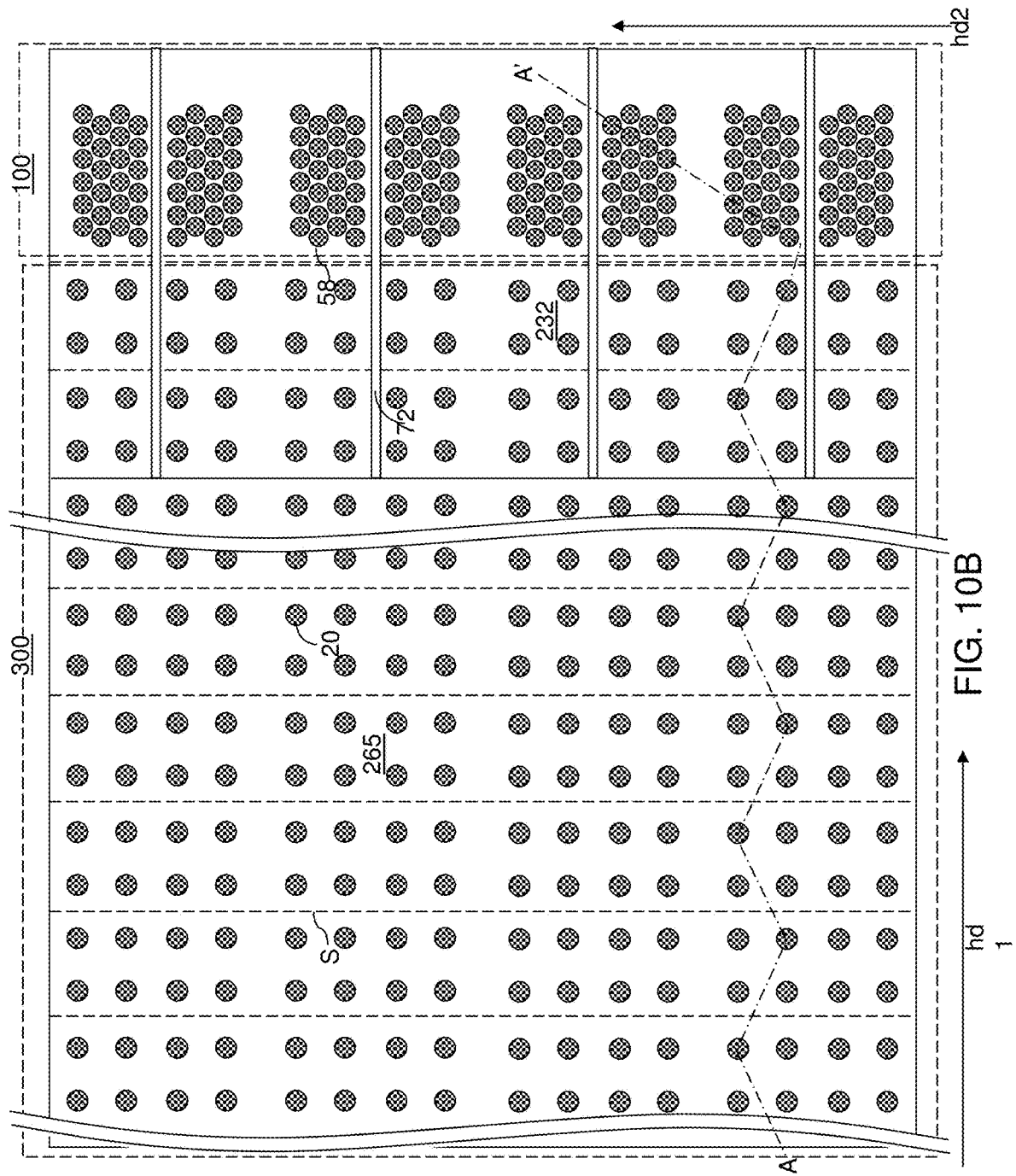
FIG. 10B is a horizontal cross-sectional of the first exemplary structure along the horizontal plane B-B' of FIG. 10A. The hinged vertical plane A-A' corresponds to the plane of the vertical cross-sectional view of FIG. 10A.
Figure 10C:
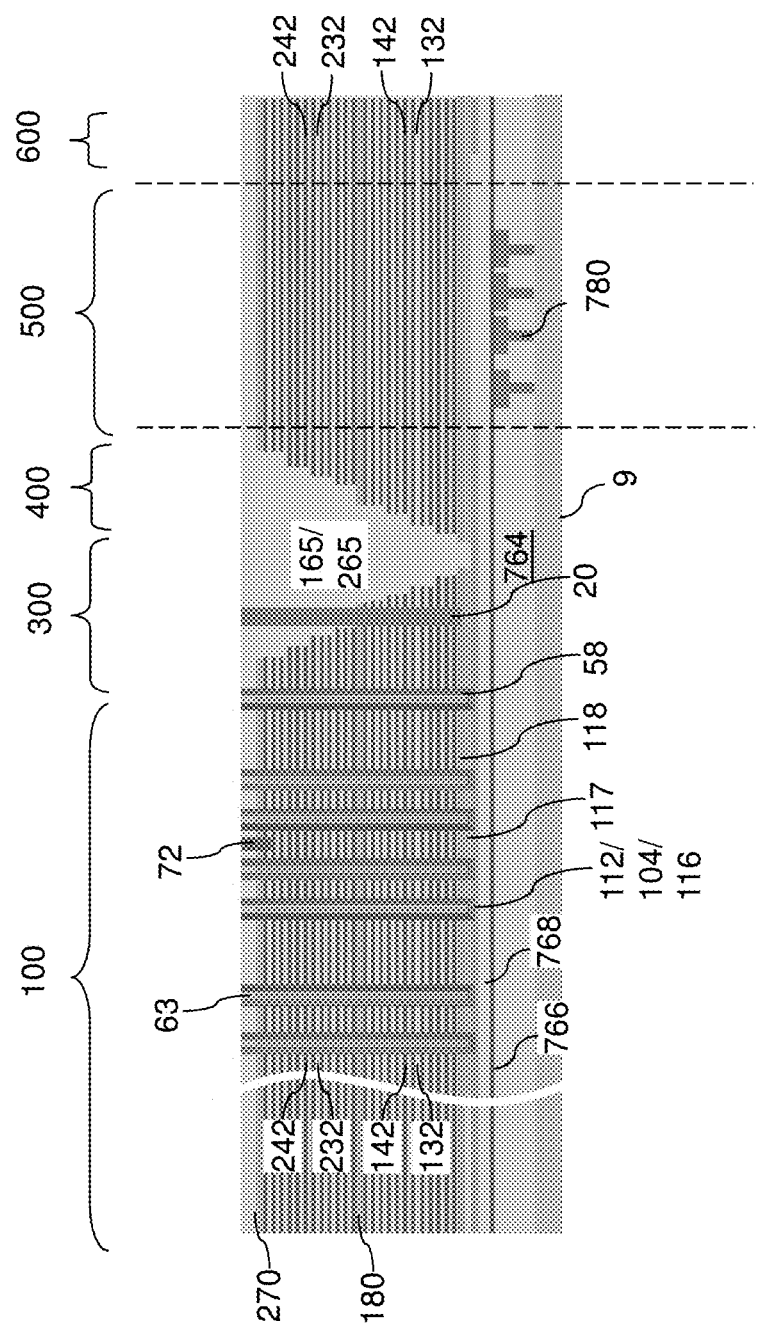
FIG. 10C is another vertical cross-sectional view of first exemplary structure of FIGS. 10A and 10B.

Referring to FIGS. 10A-10C, the first exemplary structure is illustrated after formation of the memory opening fill structures 58. Support pillar structures 20 are formed in the support openings 19 concurrently with formation of the memory opening fill structures 58. Each support pillar structure 20 can have a same set of components as a memory opening fill structure 58. While the present disclosure is described using an embodiment in which the support pillar structures 20 include a same set of structural elements as memory opening fill structures 58, in other embodiments the support pillar structures 20 are formed at a separate processing step than the memory opening fill structures 58. For example, the support openings 19 may be provided as cavities at a different processing step than the processing step at which the memory openings 49 are provided as cavities, and a dielectric material such as silicon oxide may be deposited in the support openings 19 to form support pillar structures that consist of at least one dielectric fill material.

Figure 11:
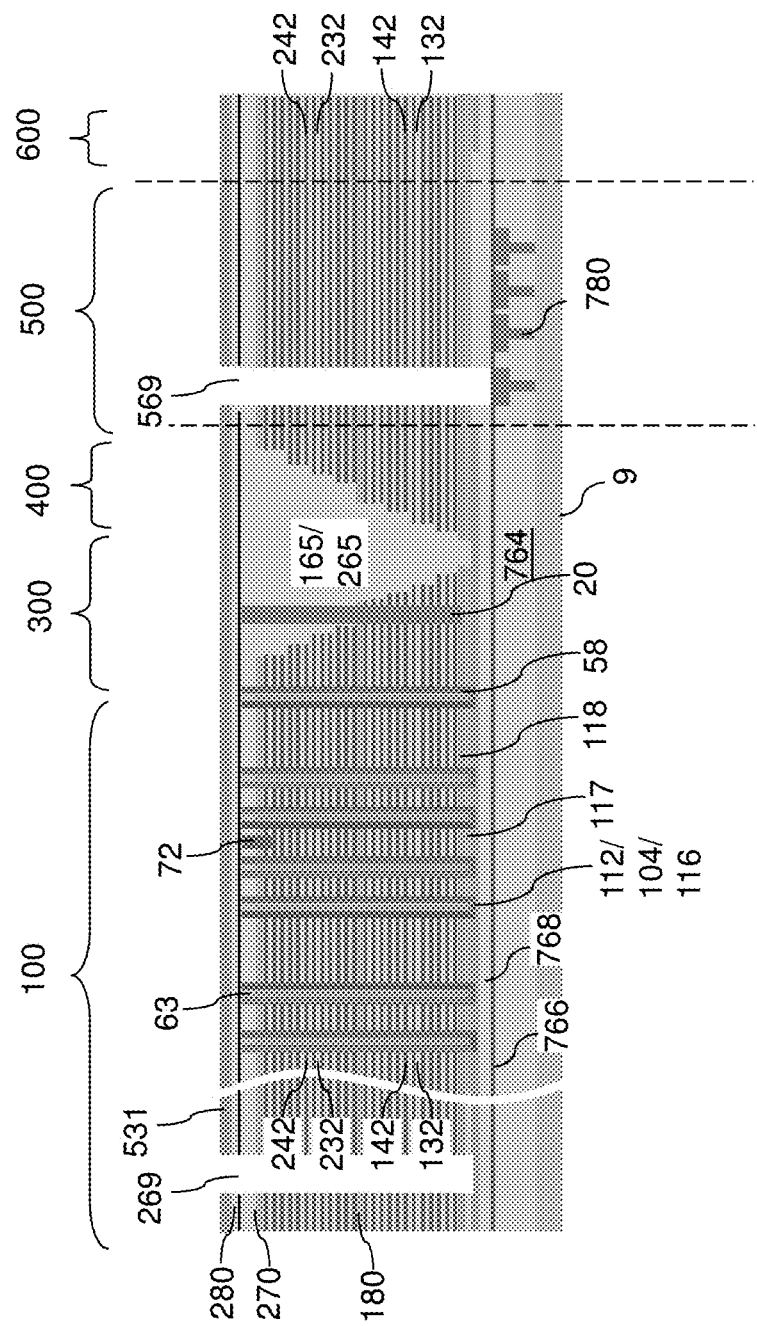
FIG. 11 is a vertical cross-sectional view of the first exemplary structure after formation of a first contact-level dielectric layer, a first sacrificial semiconductor layer, a guard ring trench, and a source contact trench according to an embodiment of the present disclosure.

Referring to FIG. 11, a first contact-level dielectric layer 280 and a first sacrificial semiconductor layer 531 can be sequentially deposited on top of the second insulating cap layer 270. The first contact-level dielectric layer 280 includes a dielectric material such as silicon oxide, and can be formed by a conformal or non-conformal deposition process. For example, the first contact-level dielectric layer 280 can include undoped silicate glass and can have a thickness in a range from 100 nm to 600 nm, although lesser and greater thicknesses can also be used. The first sacrificial semiconductor layer 531 includes a sacrificial semiconductor material such as amorphous silicon, polysilicon, or a silicon-germanium alloy. The thickness of the first sacrificial semiconductor layer 531 can be in a range from 100 nm to 600 nm, although lesser and greater thicknesses can also be used.

A photoresist layer (not shown) can be applied over the first sacrificial semiconductor layer 531, and can be lithographically patterned to form openings in the memory array region 100 and a moat opening that encircles the memory array region 100, the staircase regions 300, and the edge-side staircase region 400 within the edge seal region 500. The pattern in the photoresist layer can be transferred through the first sacrificial semiconductor layer 531, the first contact-level dielectric layer 280, each inner alternating stack {(132, 142), (232, 242)} located in the memory array regions 100 and the staircase regions 300, and the outer alternating stack {(132, 142), (232, 242)} located in the edge seal region 500, the kerf region 600, and the edge-side staircase region 400. Source contact trenches 269 extending to a source-level sacrificial layer 104 can be formed through each inner alternating stack {(132, 142), (232, 242)} within the memory array regions 100. A guard ring trench 569 having a shape of a moat trench can be formed through the outer alternating stack {(132, 142), (232, 242)} within the edge seal region 500. In one embodiment, a subset of the lower-level metal interconnect structures 780 can be configured to provide a lower-level metallic wall structure in the edge seal region between the top surface of the substrate semiconductor layer 9 and the bottom surface of the silicon nitride layer 766. The lower-level metallic wall structure can encircle the entire areas of the memory array regions 100 and the staircase regions 300, and can have an annular configuration. A continuous top surface of the lower-level metallic wall structure can be physically exposed at the bottom of the guard ring trench 569.

Figure 12:
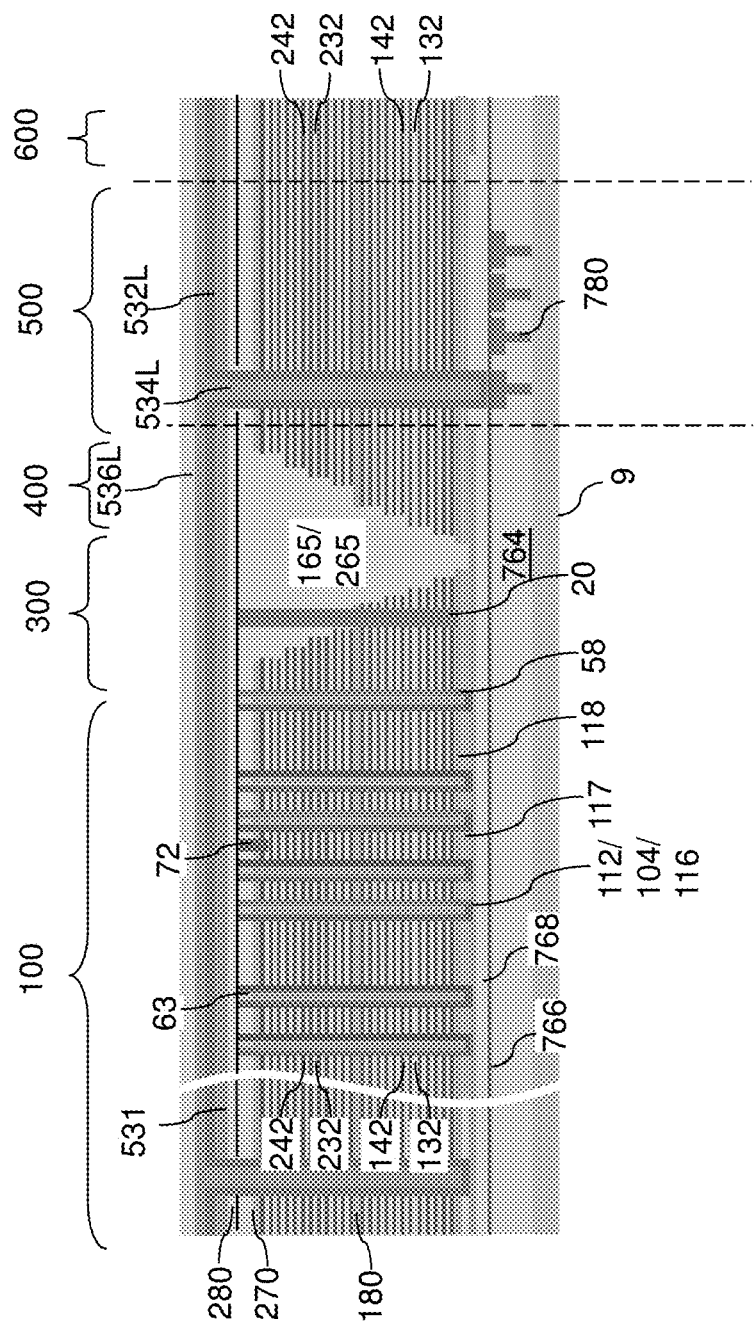
FIG. 12 is a vertical cross-sectional view of the first exemplary structure after formation of a dielectric spacer material layer, a second sacrificial semiconductor layer, and a first sacrificial dielectric layer according to an embodiment of the present disclosure.

Referring to FIG. 12, a dielectric spacer material layer 532L, a second sacrificial semiconductor layer 534L, and a first sacrificial dielectric layer 536L can be sequentially deposited. The dielectric spacer material layer 532L includes a dielectric material such as silicon oxide, and can be formed by a conformal deposition process. The thickness of the dielectric spacer material layer 532L is less than one half of the width of the source contact trenches 269 and is less than one half of the width of the guard ring trench 569. In one embodiment, the dielectric spacer material layer 532L can have a thickness in a range from 10 nm to 60 nm, although lesser and greater thicknesses can also be used.

The second sacrificial semiconductor layer 534L includes a sacrificial semiconductor material such as amorphous silicon, polysilicon, or a silicon-germanium alloy. The second sacrificial semiconductor layer 534L can fill voids in the source contact trenches 269 and the guard ring trench 569. The thickness of the second sacrificial semiconductor layer 534L can be in a range from 300 nm to 2,000 nm, although lesser and greater thicknesses can also be used. The first sacrificial dielectric layer 536L includes a dielectric material such as undoped silicate glass or a doped silicate glass, and can be formed by a conformal or non-conformal deposition process. For example, the first sacrificial dielectric layer 536L can include undoped silicate glass and can have a thickness in a range from 100 nm to 600 nm, although lesser and greater thicknesses can also be used.

Figure 13:
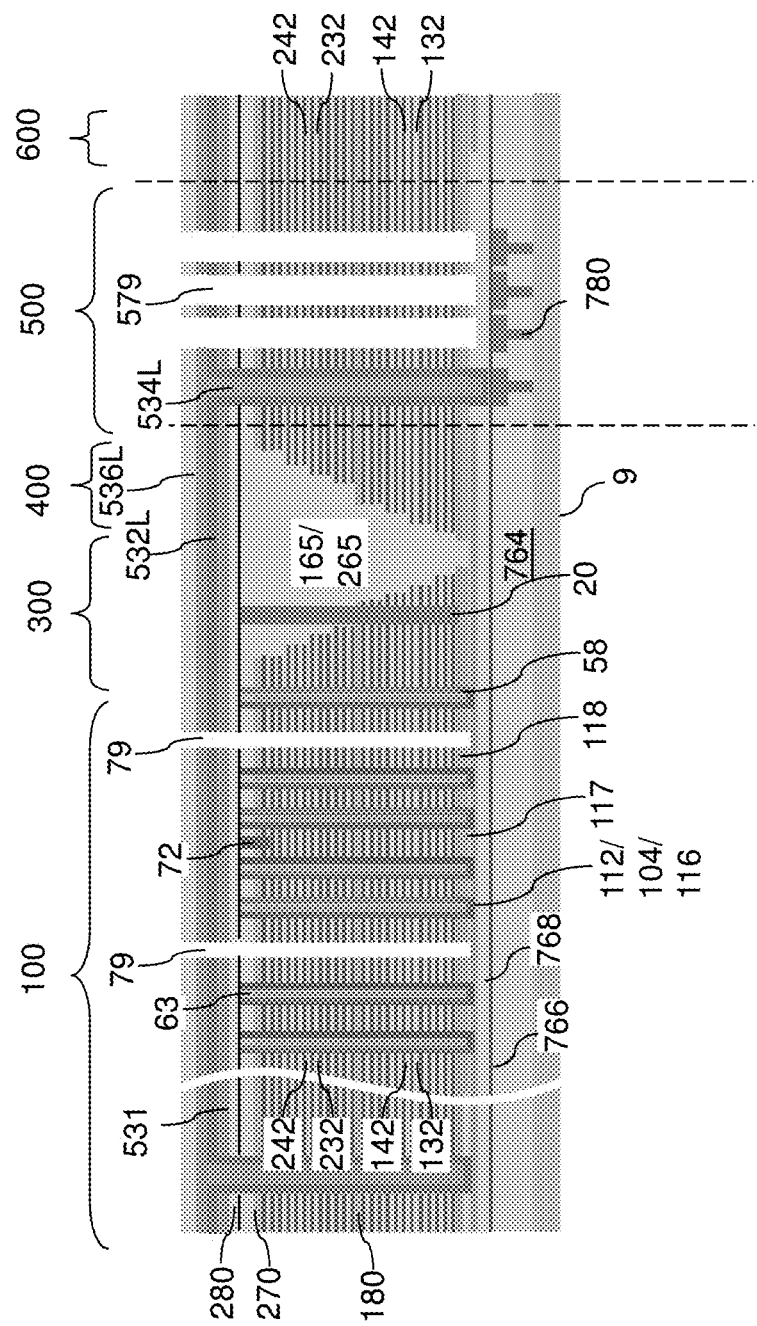
FIG. 13 is a vertical cross-sectional view of the first exemplary structure after simultaneous formation of backside trenches and crack stopper moat trenches according to an embodiment of the present disclosure.

Referring to FIG. 13, a photoresist layer (not shown) can be applied over the first sacrificial dielectric layer 536L, and can be lithographically patterned to form elongated openings in the memory array region 100 and at least one moat opening that encircles the guard ring trench 569 within the edge seal region 500. The pattern in the photoresist layer can be transferred through the first sacrificial dielectric layer 536L, the second sacrificial semiconductor layer 534L, the dielectric spacer material layer 532L, the first sacrificial semiconductor layer 531, the first contact-level dielectric layer 280, each inner alternating stack {(132, 142), (232, 242)} located in the memory array regions 100 and the staircase regions 300, and the outer alternating stack {(132, 142), (232, 242)} located in the edge seal region 500, the kerf region 600, and the edge-side staircase region 400.

Backside trenches 79 extending to the source-level sacrificial layer 104 can be formed through each inner alternating stack {(132, 142), (232, 242)} within the memory array regions 100. At least one moat trench, which is herein referred to as at least one crack stopper moat trench 579, can be formed through the outer alternating stack {(132, 142), (232, 242)} within the edge seal region 500. Each crack stopper moat trench 579 can be subsequently used to protect the inside of the semiconductor die from moisture and impurity ingress in case of any crack in outer portions of the semiconductor die. The at least one crack stopper moat trench 579 can include a plurality of crack stopper moat trenches 579 that encircles the guard ring trench 569.

In one embodiment, an additional subset of the lower-level metal interconnect structures 780 can be configured to provide at least one additional lower-level metallic wall structure in the edge seal region between the top surface of the substrate semiconductor layer 9 and the bottom surface of the silicon nitride layer 766. The at least one additional lower-level metallic wall structure can have a respective annular configuration, and can encircle the entire areas of the lower-level metallic wall structure that underlies the guard ring trench 569. A continuous top surface of a respective additional lower-level metallic wall structure can be physically exposed at the bottom of each crack stopper moat trenches 579. In one embodiment, the backside trenches 79 can laterally extend along the first horizontal direction hd1 (illustrated in FIG. 10B) between neighboring clusters of memory opening fill structures 58 and midway between a neighboring par of drain-select-level isolation structures 72.

Figure 14:
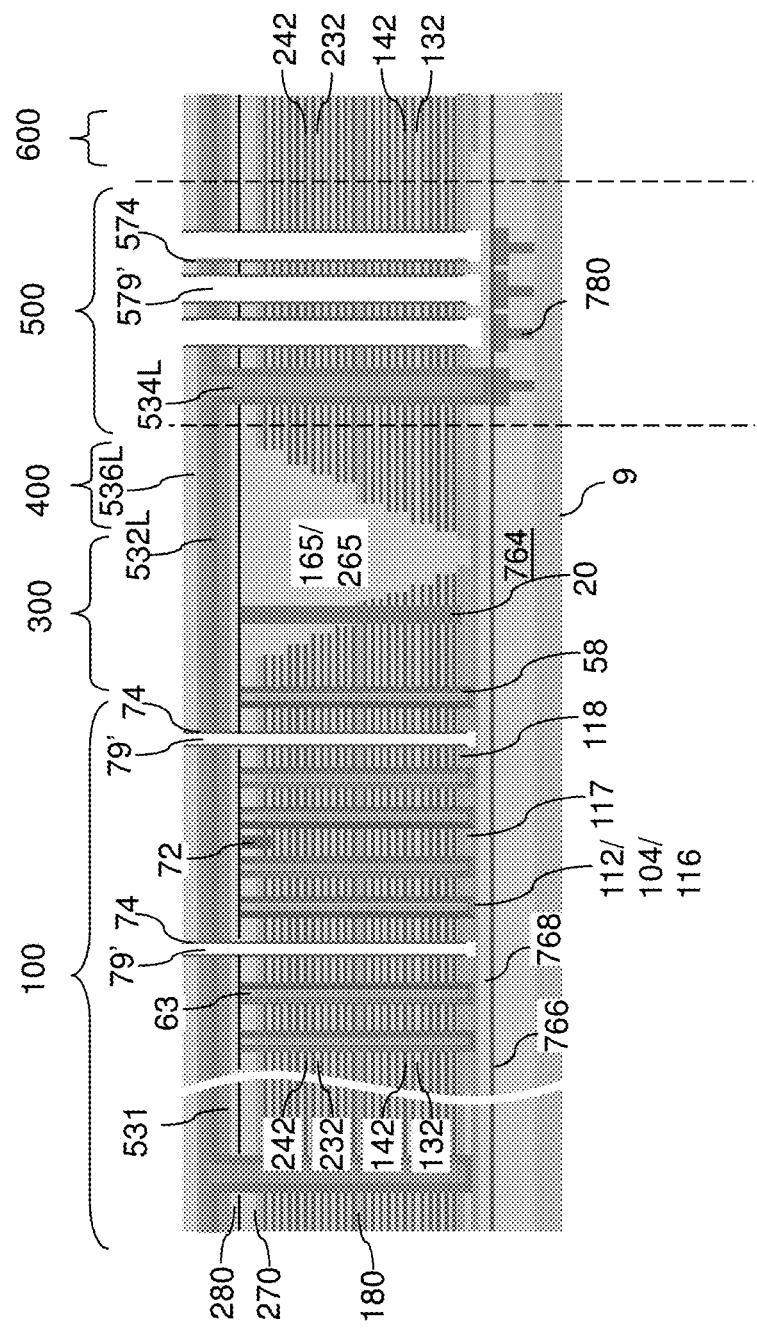
FIG. 14 is a vertical cross-sectional view of the first exemplary structure after formation of dielectric spacers at peripheries of the backside trenches and the crack stopper moat trenches according to an embodiment of the present disclosure.

Referring to FIG. 14, a conformal spacer material layer can be deposited in the backside trenches 79 and the crack stopper moat trenches 579. The conformal spacer material layer includes a material that is different from the material of the source-level sacrificial layer 104. For example, the conformal spacer material layer can include silicon nitride. An anisotropic etch process is performed to remove horizontal portions of the conformal spacer material layer. Remaining portions of the conformal spacer material layer constitute dielectric spacers. Each remaining vertical portion of the conformal spacer material layer in the backside trenches 79 constitutes a backside trench spacer 74, and each remaining vertical portion of the conformal spacer material layer in the at least one crack stopper moat trench 579 constitutes a crack stopper trench spacer 574. The lateral thickness of each backside trench spacer 74 and each crack stopper trench spacer 574 can be in a range from 10 nm to 100 nm, although lesser and greater thicknesses can also be used. Each crack stopper trench spacer 574 comprises an inner dielectric spacer and an outer dielectric spacer that are laterally spaced apart.

Figure 15:
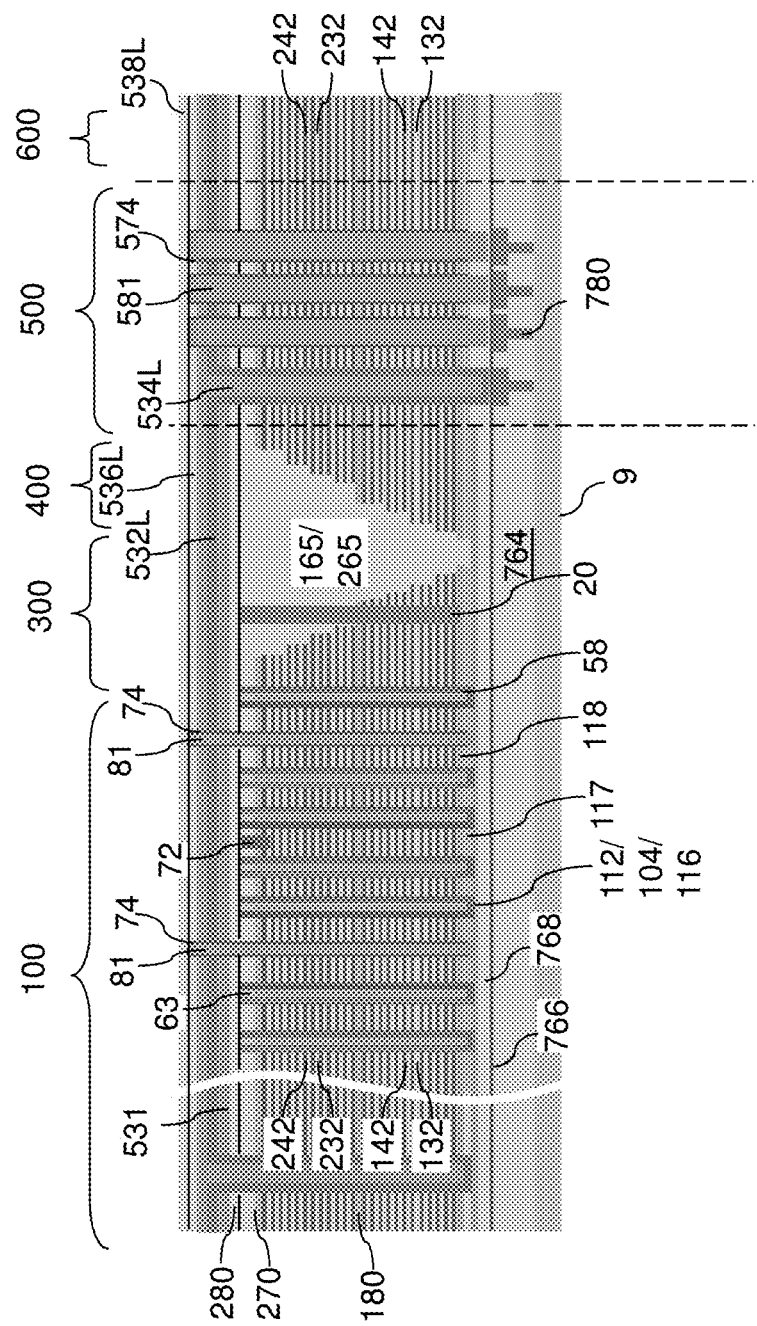
FIG. 15 is a vertical cross-sectional view of the first exemplary structure after formation of sacrificial backside trench fill structures, sacrificial moat trench fill structures, and a second sacrificial dielectric layer according to an embodiment of the present disclosure.

Referring to FIG. 15, a sacrificial fill material can be deposited in unfilled volumes of the backside trenches 79 and the at least one crack stopper moat trench 579. Excess portions of the sacrificial fill material can be removed from above the horizontal plane including the top surface of the first sacrificial dielectric layer 536L by a planarization process such as a recess etch process and/or a chemical mechanical planarization process. Each remaining portion of the sacrificial fill material in the backside trenches 79 constitutes a sacrificial backside trench fill structure 81, and each remaining portion of the sacrificial fill material in the at least one crack stopper moat trench 579 constitutes a sacrificial moat trench fill structure 581. The sacrificial backside trench fill structures 81 and the at least one sacrificial moat trench fill structure 581 can include a sacrificial semiconductor material, which can be, for example, amorphous silicon, polysilicon, or a silicon-germanium alloy.

A second sacrificial dielectric layer 538L can be formed over the first sacrificial dielectric layer 536L. The second sacrificial dielectric layer 538L includes a dielectric material such as undoped silicate glass or a doped silicate glass, and can be formed by a conformal or non-conformal deposition process. For example, the second sacrificial dielectric layer 538L can include undoped silicate glass and can have a thickness in a range from 100 nm to 600 nm, although lesser and greater thicknesses can also be used.

Figure 16:
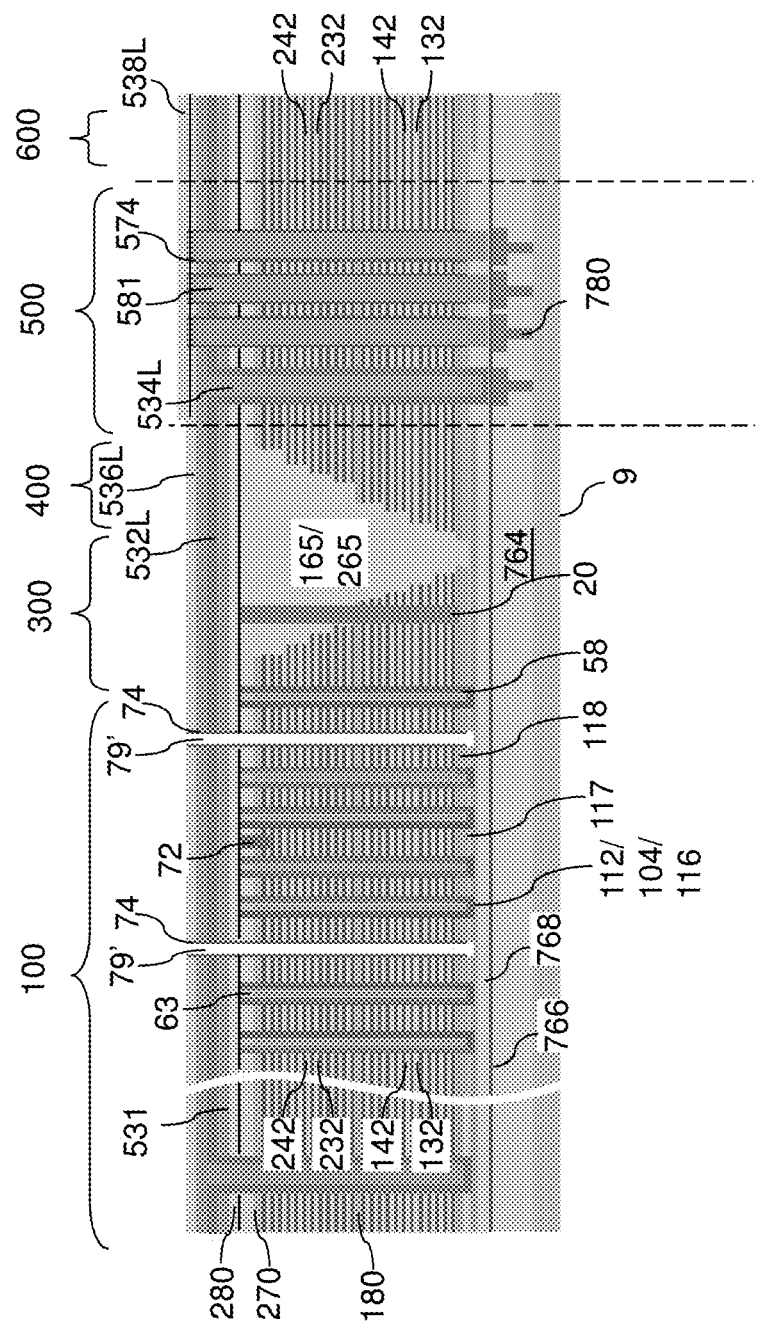
FIG. 16 is a vertical cross-sectional view of the first exemplary structure after patterning of the second sacrificial dielectric layer and removal of the sacrificial backside trench fill structures according to an embodiment of the present disclosure.
Figure 17:
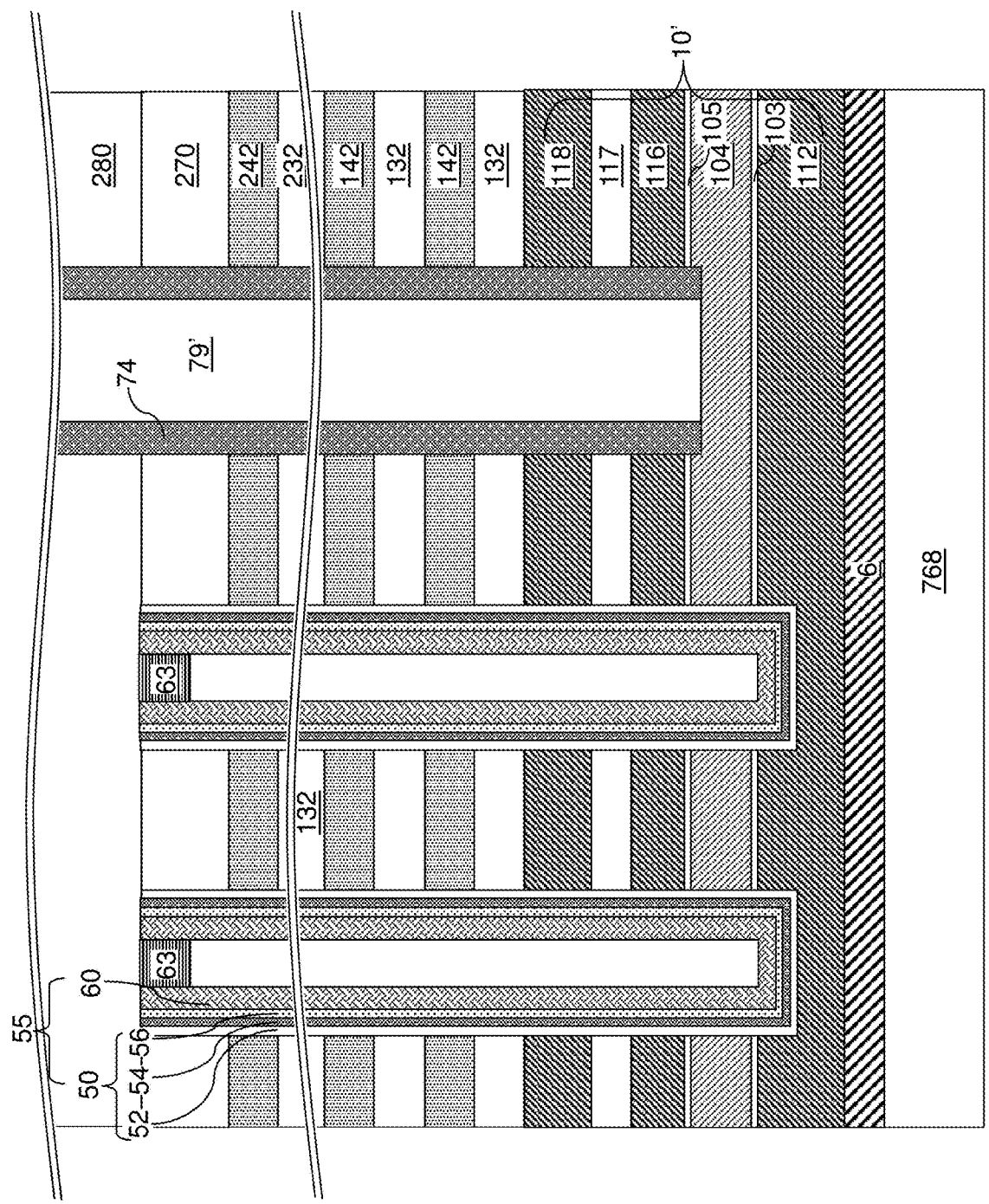
FIG. 17 is a magnified view of a region of a backside trench in the first exemplary structure of FIG. 16.

Referring to FIGS. 16 and 17, portions of the second sacrificial dielectric layer 538L can be removed from the memory array regions 100, the staircase regions 300, and the edge-side staircase region 400. For example, a photoresist layer (not shown) can be applied over the first exemplary structure, and can be lithographically patterned to cover the edge seal region 500 and the kerf region 600, and unmasked portions of the second sacrificial dielectric layer 538L can be removed by an etch process, which may include an isotropic etch process or an anisotropic etch process.

The sacrificial backside trench fill structures 81 can be removed selective to the backside trench spacers 74 and the first sacrificial dielectric layer 536L using a selective etch process. For example, if the sacrificial backside trench fill structures 81 include amorphous silicon, the sacrificial backside trench fill structures 81 can be removed by a wet etch process using hot trimethyl-2 hydroxyethyl ammonium hydroxide ("hot TMY") or tetramethyl ammonium hydroxide (TMAH). A backside cavity 79' is formed within each volume from which a sacrificial backside trench fill structure 81 is removed.

Figure 18:
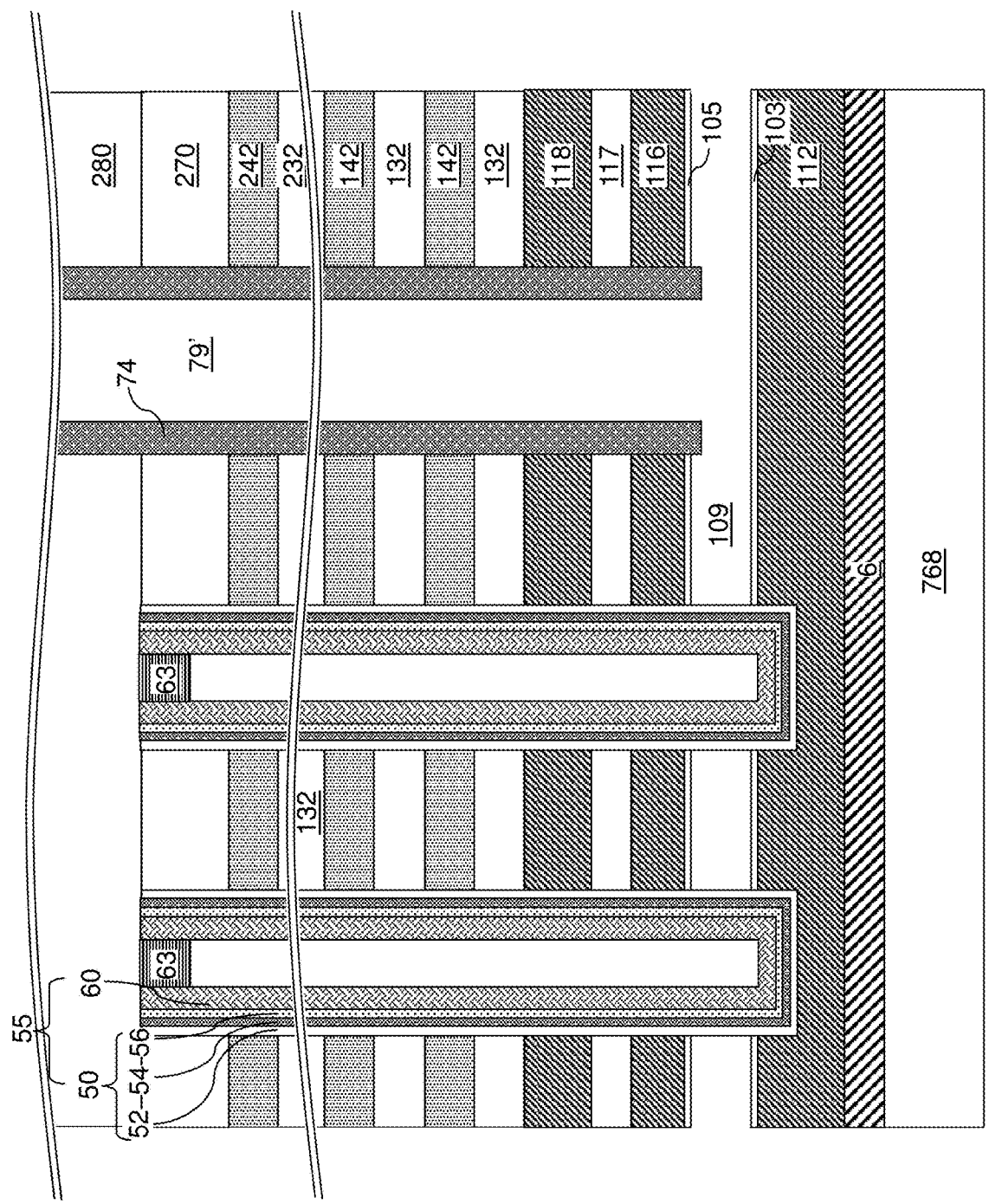
FIG. 18 is a vertical cross-sectional view of a region of the backside trench after formation of a source-level cavity according to an embodiment of the present disclosure.

Referring to FIG. 18, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 19:
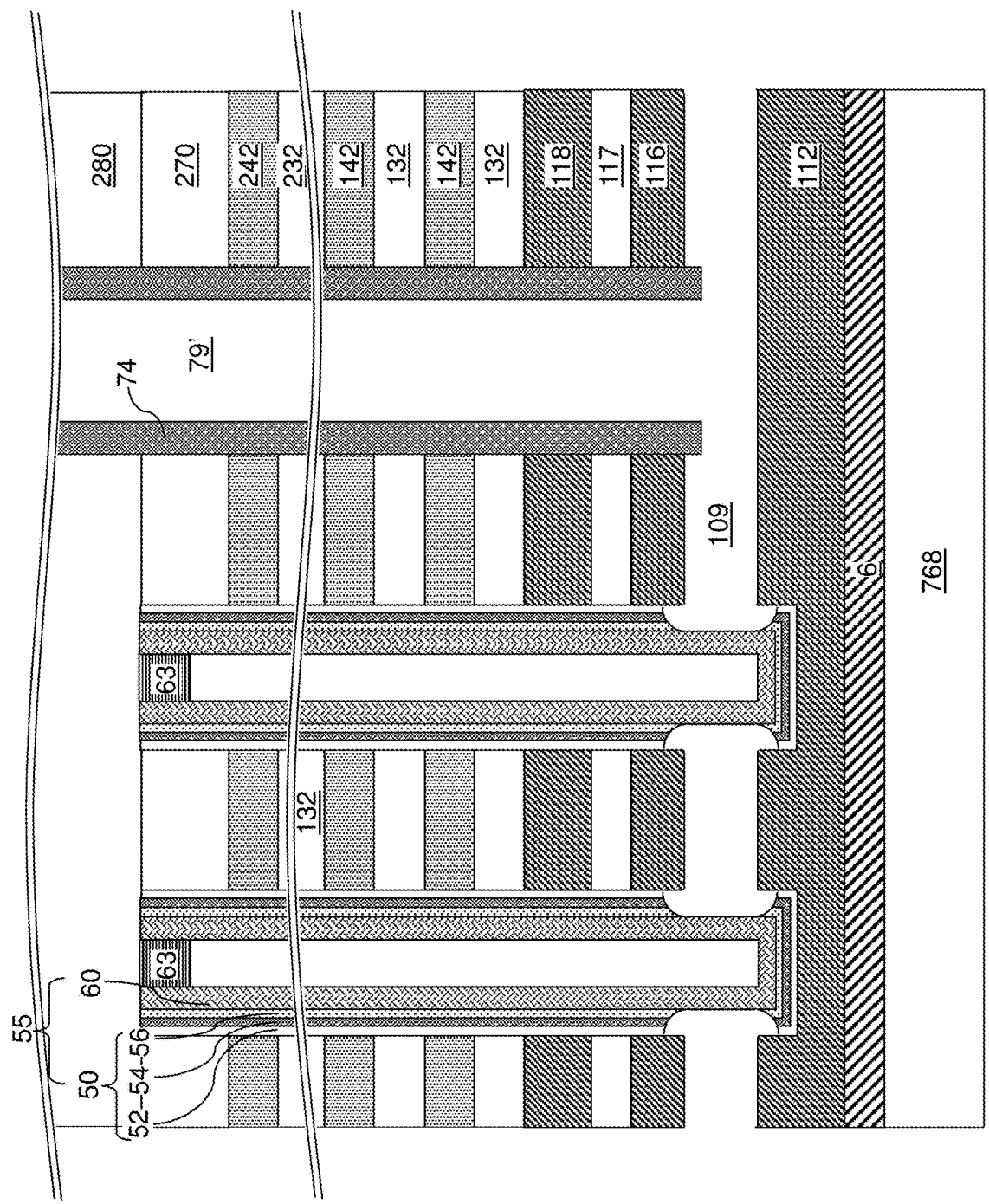
FIG. 19 is a vertical cross-sectional view of a region of the backside trench after physically exposing bottom end portions of vertical semiconductor channels according to an embodiment of the present disclosure.

Referring to FIG. 19, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 can be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 20:
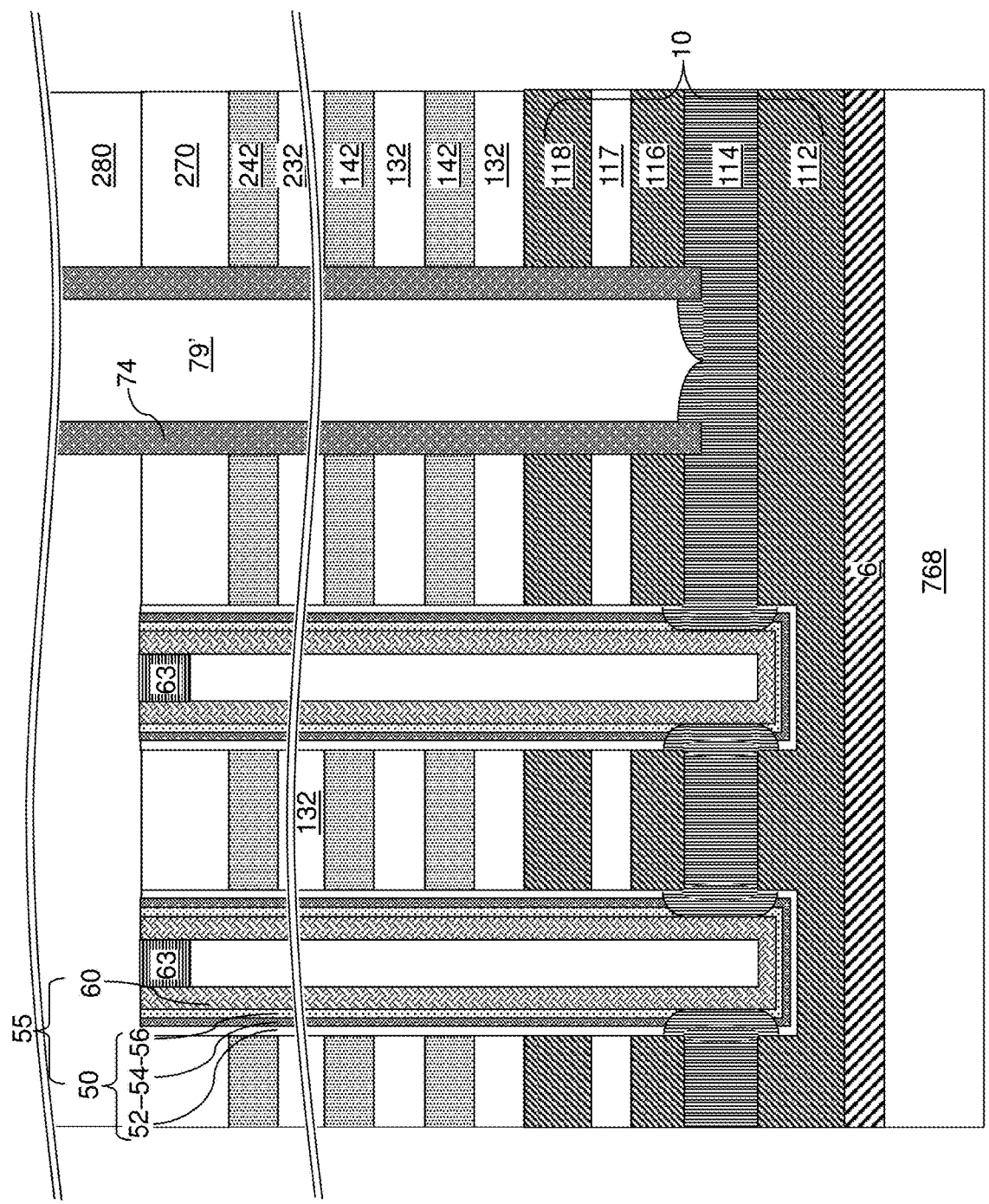
FIG. 20 is a vertical cross-sectional view of a region of the backside trench after formation of a source semiconductor layer according to an embodiment of the present disclosure.

Referring to FIG. 20, a doped semiconductor material having a doping of the second conductivity type can be deposited on the physically exposed semiconductor surfaces around the source cavity 109. The physically exposed semiconductor surfaces include bottom portions of outer sidewalls of the vertical semiconductor channels 60, a bottom surface of the upper source-level semiconductor layer 116, and/or a top surface of the lower source-level semiconductor layer 112.

In one embodiment, the doped semiconductor material having a doping of the second conductivity type can be deposited on the physically exposed semiconductor surfaces around the source cavity 109 by a selective semiconductor deposition process. A semiconductor precursor gas, an etchant, and a dopant precursor gas can be flowed concurrently into a process chamber including the first exemplary structure during the selective semiconductor deposition process. For example, the semiconductor precursor gas can include silane, disilane, or dichlorosilane, the etchant gas can include gaseous hydrogen chloride, and the dopant precursor gas such as phosphine, arsine, or stibine. In this case, the selective semiconductor deposition process grows a doped semiconductor material from physically exposed semiconductor surfaces around the source cavity 109. The deposited doped semiconductor material forms a source semiconductor layer 114, which can contact sidewalls of the vertical semiconductor channels 60 and has a doping of the second conductivity type. The atomic concentration of the dopants of the second conductivity type in the deposited semiconductor material can be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source semiconductor layer 114 as initially formed can consist essentially of semiconductor atoms and dopant atoms of the second conductivity type. Alternatively, at least one non-selective doped semiconductor material deposition process can be used to form the source semiconductor layer 114. Optionally, one or more etch back processes may be used in combination with a plurality of selective or non-selective deposition processes to provide a seamless and/or voidless source semiconductor layer 114.

The duration of the selective semiconductor deposition process can be selected such that the source cavity 109 is filled with the source semiconductor layer 114, and the source semiconductor layer 114 contacts bottom end portions of inner sidewalls of the backside trench spacers 74. In one embodiment, the source semiconductor layer 114 can be formed by selectively depositing a doped semiconductor material from semiconductor surfaces around the source cavity 109. In one embodiment, the doped semiconductor material can include doped polysilicon. Thus, the source-level sacrificial layer 104 can be replaced with the source semiconductor layer 114.

The layer stack including the lower source-level semiconductor layer 112, the source semiconductor layer 114, and the upper source-level semiconductor layer 116 constitutes a buried source layer (112, 114, 116). A p-n junction is present between the source semiconductor layer 114 and the upper source-level semiconductor layer 116. The set of layers including the buried source layer (112, 114, 116), the source-level insulating layer 117, and the source-select-level conductive layer 118 constitutes source-level material layers 10, which replaces the in-process source-level material layers 10'.

Figure 21A:
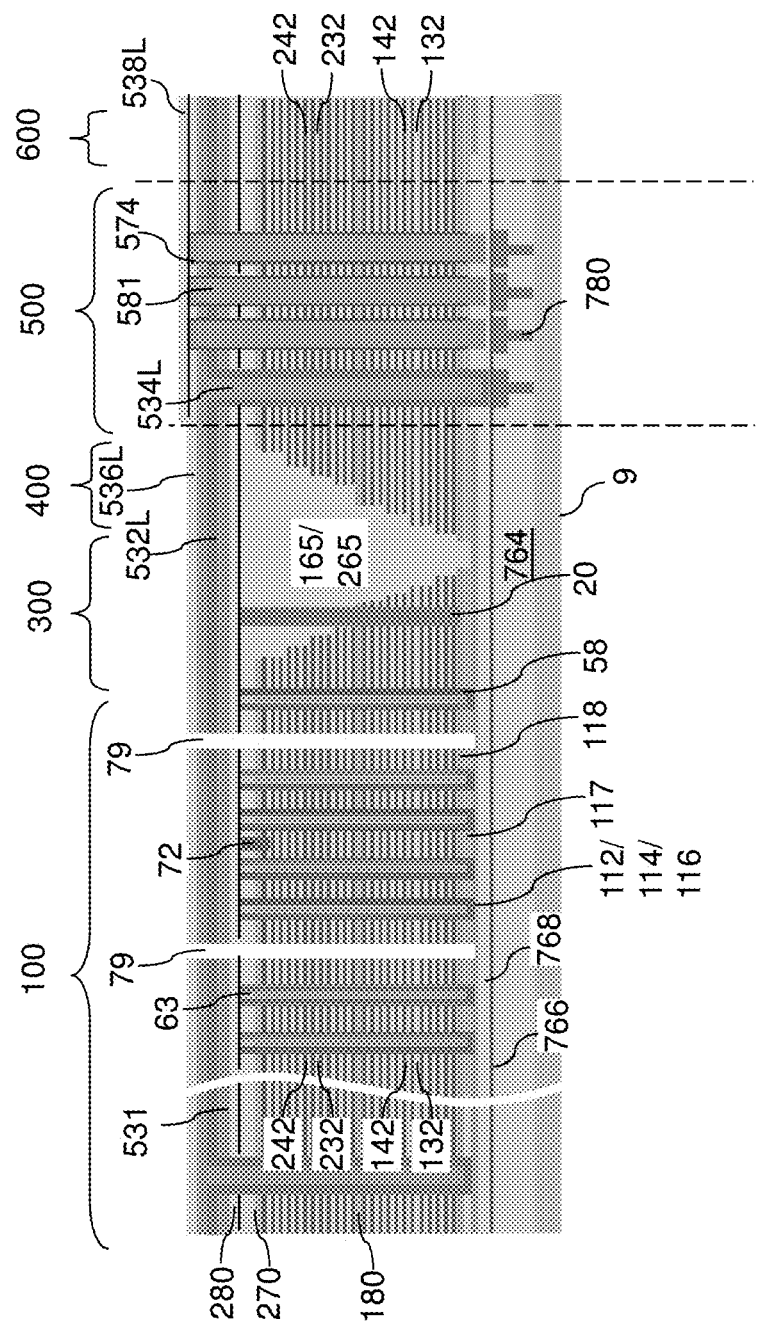
FIG. 21A is a vertical cross-section of the first exemplary structure after formation of semiconductor oxide portions according to an embodiment of the present disclosure.
Figure 21B:
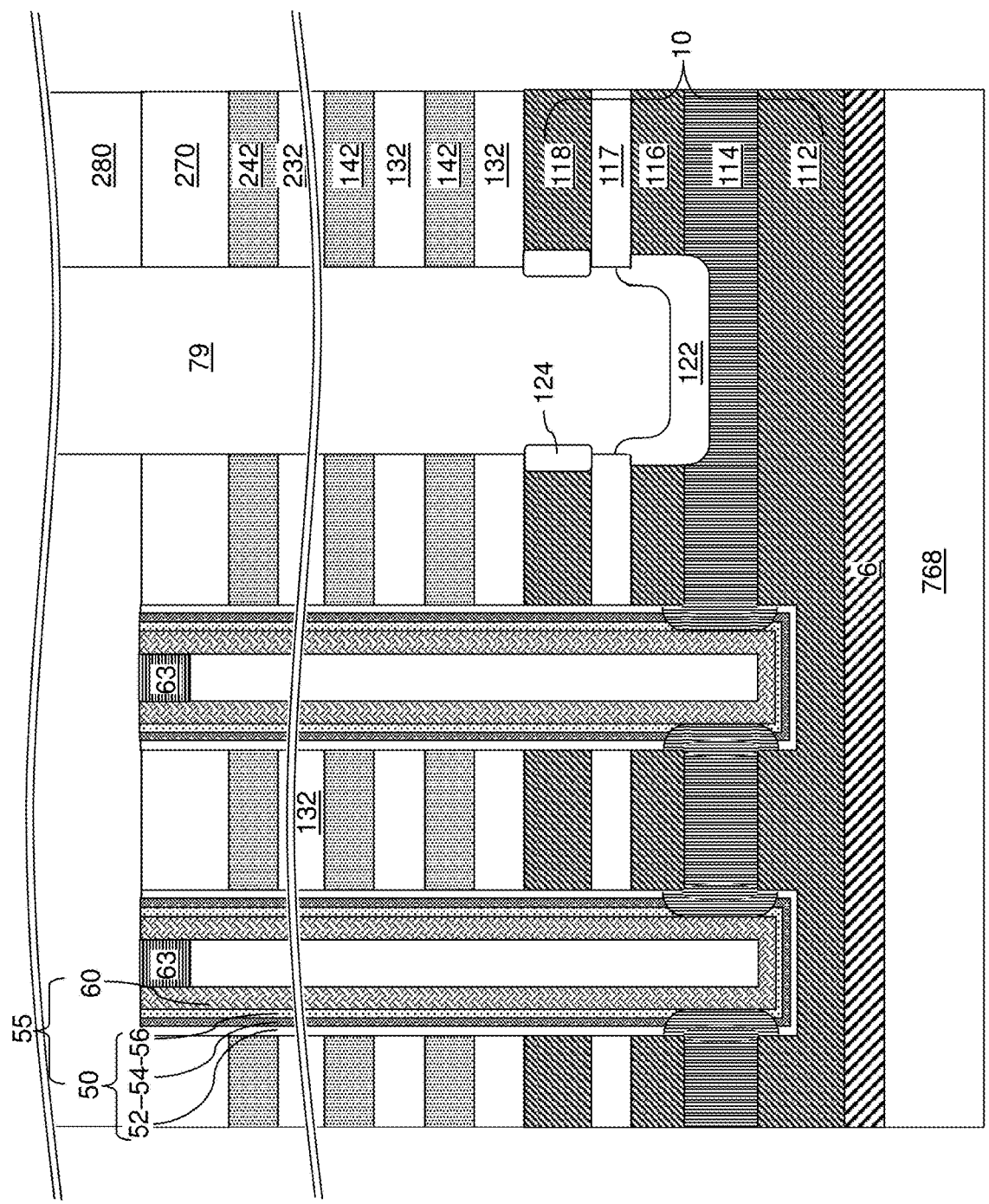
FIG. 21B is a magnified view of a region of the backside trench in the first exemplary structure of FIG. 21A.

Referring to FIGS. 21A and 21B, the backside trench spacers 74 can be removed selective to the insulating layers (132, 232), the first and second insulating cap layers (170, 270), the first contact-level dielectric layer 280, and the source semiconductor layer 114 using an isotropic etch process. For example, if the backside trench spacers 74 include silicon nitride, a wet etch process using hot phosphoric acid can be performed to remove the backside trench spacers 74. In one embodiment, the isotropic etch process that removes the backside trench spacers 74 can be combined with a subsequent isotropic etch process that etches the sacrificial material layers (142, 242) selective to the insulating layers (132, 232), the first and second insulating cap layers (170, 270), the first contact-level dielectric layer 280, and the source semiconductor layer 114.

An oxidation process can be performed to convert physically exposed surface portions of semiconductor materials into dielectric semiconductor oxide portions. For example, surfaces portions of the source semiconductor layer 114 and the upper source-level semiconductor layer 116 can be converted into dielectric semiconductor oxide plates 122, and surface portions of the source-select-level conductive layer 118 can be converted into annular dielectric semiconductor oxide spacers 124. The dielectric semiconductor oxide plates 122 and the annular dielectric semiconductor oxide spacers 124 are illustrated in FIG. 21B, and are not illustrated in FIG. 21A for clarity.

Figure 22A:
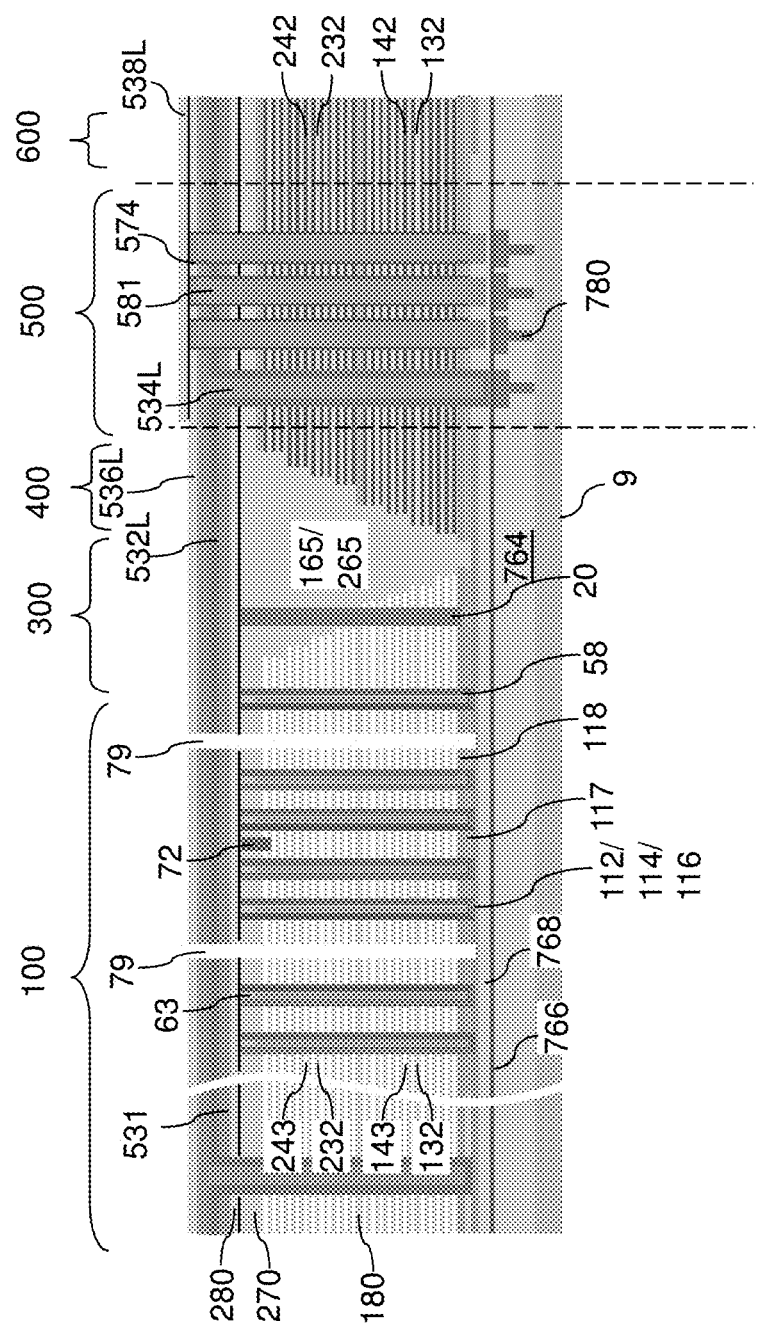
FIG. 22A is a vertical cross-section of the first exemplary structure after formation of backside recesses according to an embodiment of the present disclosure.
Figure 22B:
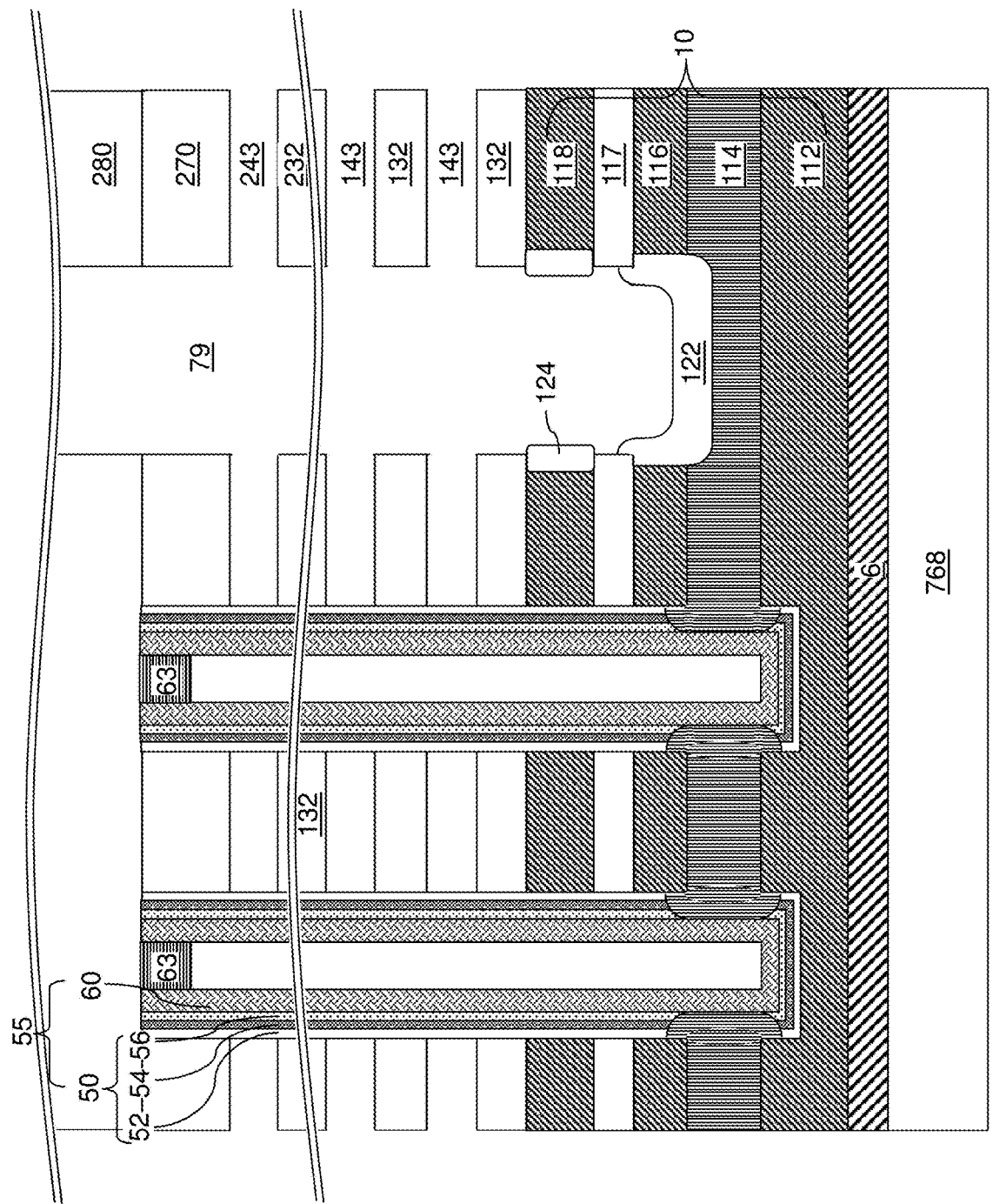
FIG. 22B is a magnified view of a region of the backside trench in the first exemplary structure of FIG. 22A.

Referring to FIGS. 22A and 22B, the sacrificial material layers (142, 242) are can be removed selective to the insulating layers (132, 232), the first and second insulating cap layers (170, 270), the first contact-level dielectric layer 280, and the source semiconductor layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 can be introduced into the backside trenches 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trench 79. For example, if the sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) of each inner alternating stack {(132, 142), (232, 242)} are removed. The backside recesses (143, 243) include first backside recesses 143 that are formed in volumes from which the first-tier sacrificial material layers 142 of each inner alternating stack {(132, 142), (232, 242)} are removed, and second backside recesses 243 that are formed in volumes from which the second-tier sacrificial material layers 242 of each inner alternating stack {(132, 142), (232, 242)} are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232) within an inner alternating stack {(132, 142), (232, 242)}. In one embodiment, each of the backside recesses (143, 243) can have a uniform height throughout. The sacrificial material layers (142, 242) of the outer alternating stack {(132, 142), (232, 242)} are protected by the retro-stepped dielectric material portions (165, 265), and thus, remain intact during formation of the backside recesses (143, 243).

Figure 23A:
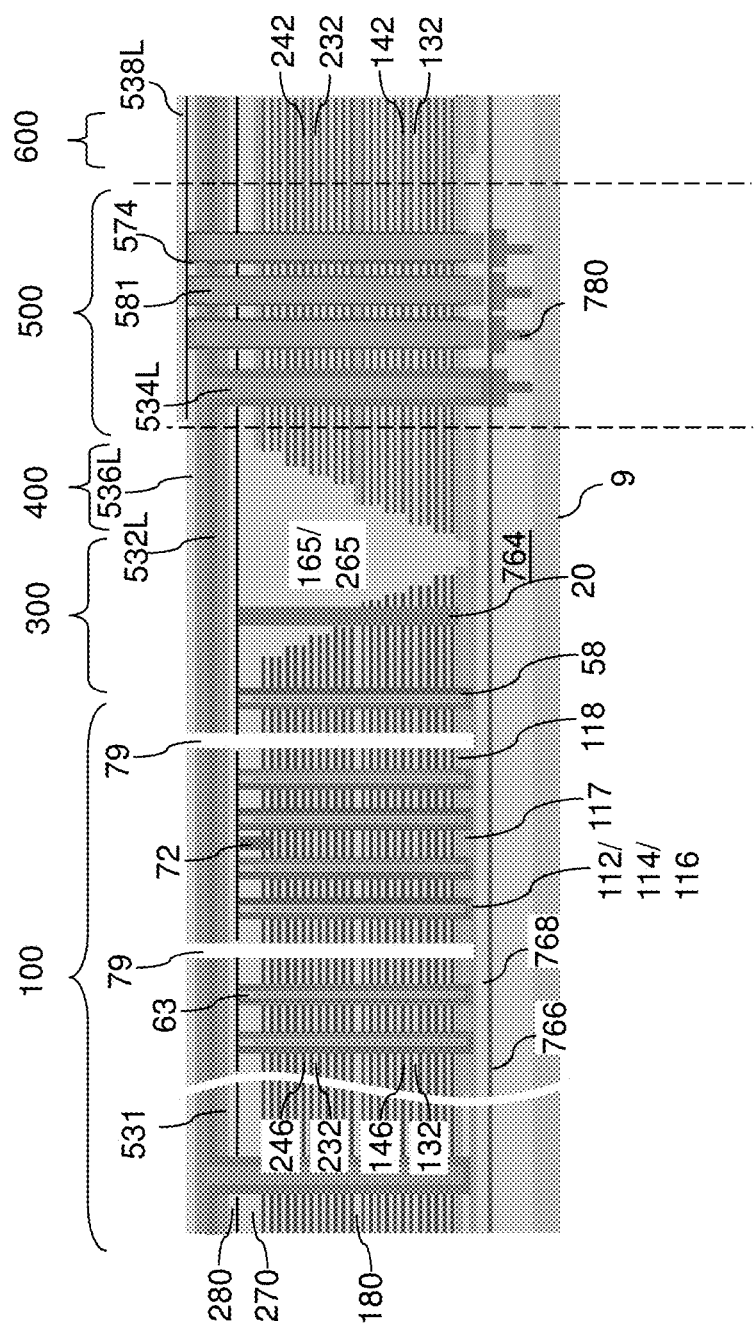
FIG. 23A is a vertical cross-section of the first exemplary structure after formation of electrically conductive layers according to an embodiment of the present disclosure.
Figure 23B:
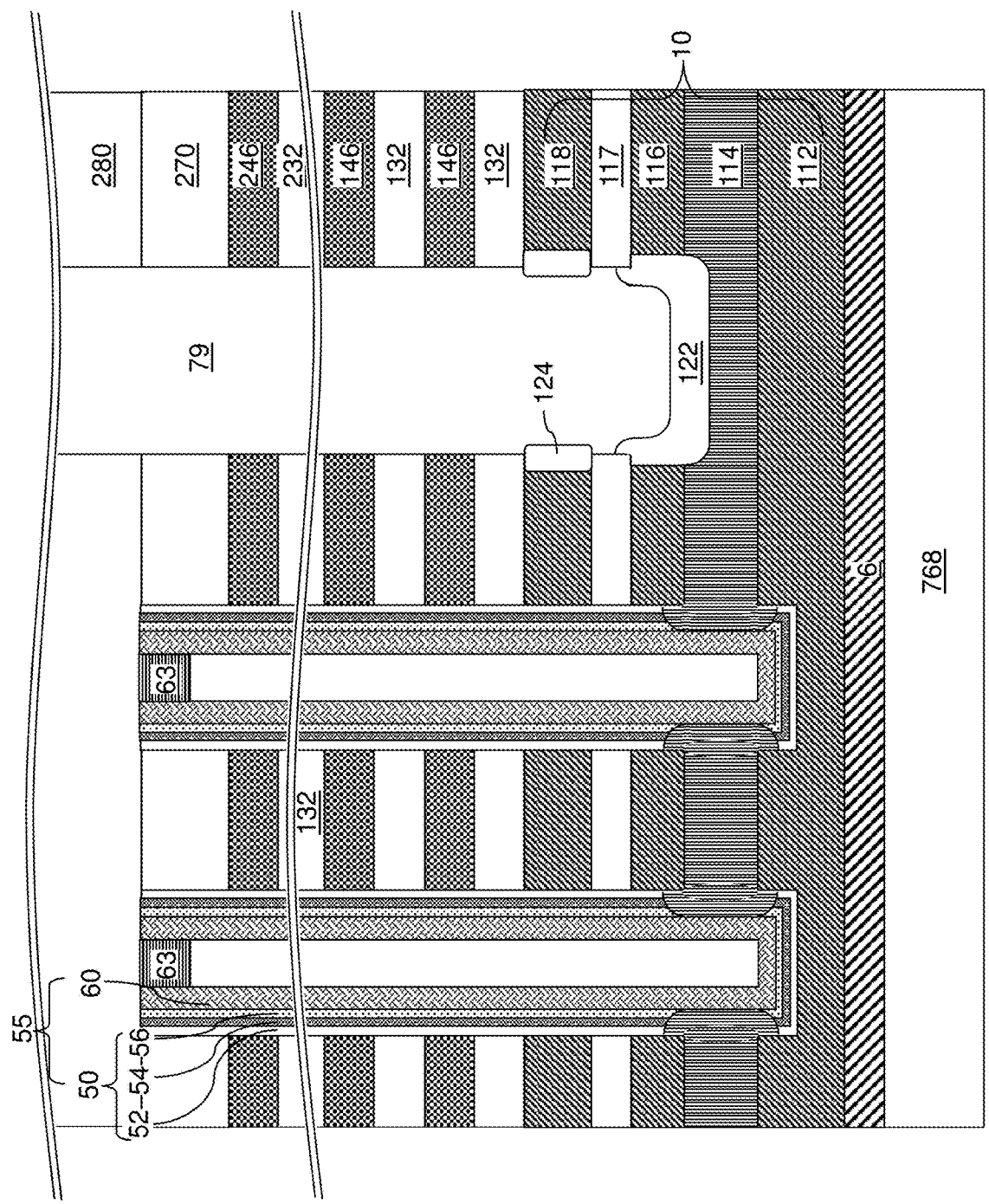
FIG. 23B is a magnified view of a region of the backside trench in the first exemplary structure of FIG. 23A.

Referring to FIGS. 23A and 23B, a backside blocking dielectric layer (not shown) can be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the first contact-level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact-level dielectric layer 280. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first-tier sacrificial material layer 142 can be replaced with an optional portion of the backside blocking dielectric layer and a first electrically conductive layer 146, and each second-tier sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers can be physically exposed to a respective backside trench 79.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 24A:
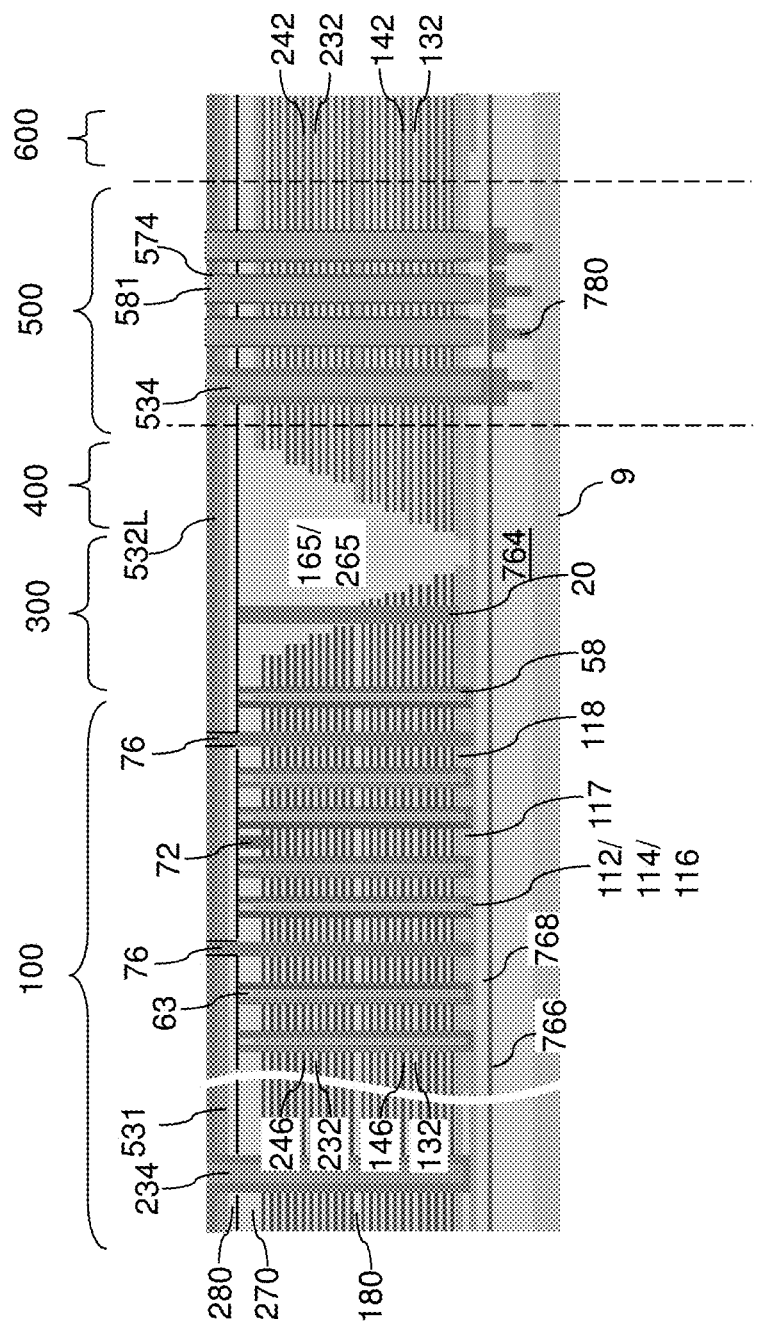
FIG. 24A is a vertical cross-section of the first exemplary structure after removal of the first and second sacrificial dielectric layer and a horizontal portion of the second sacrificial semiconductor layer according to an embodiment of the present disclosure.
Figure 24B:
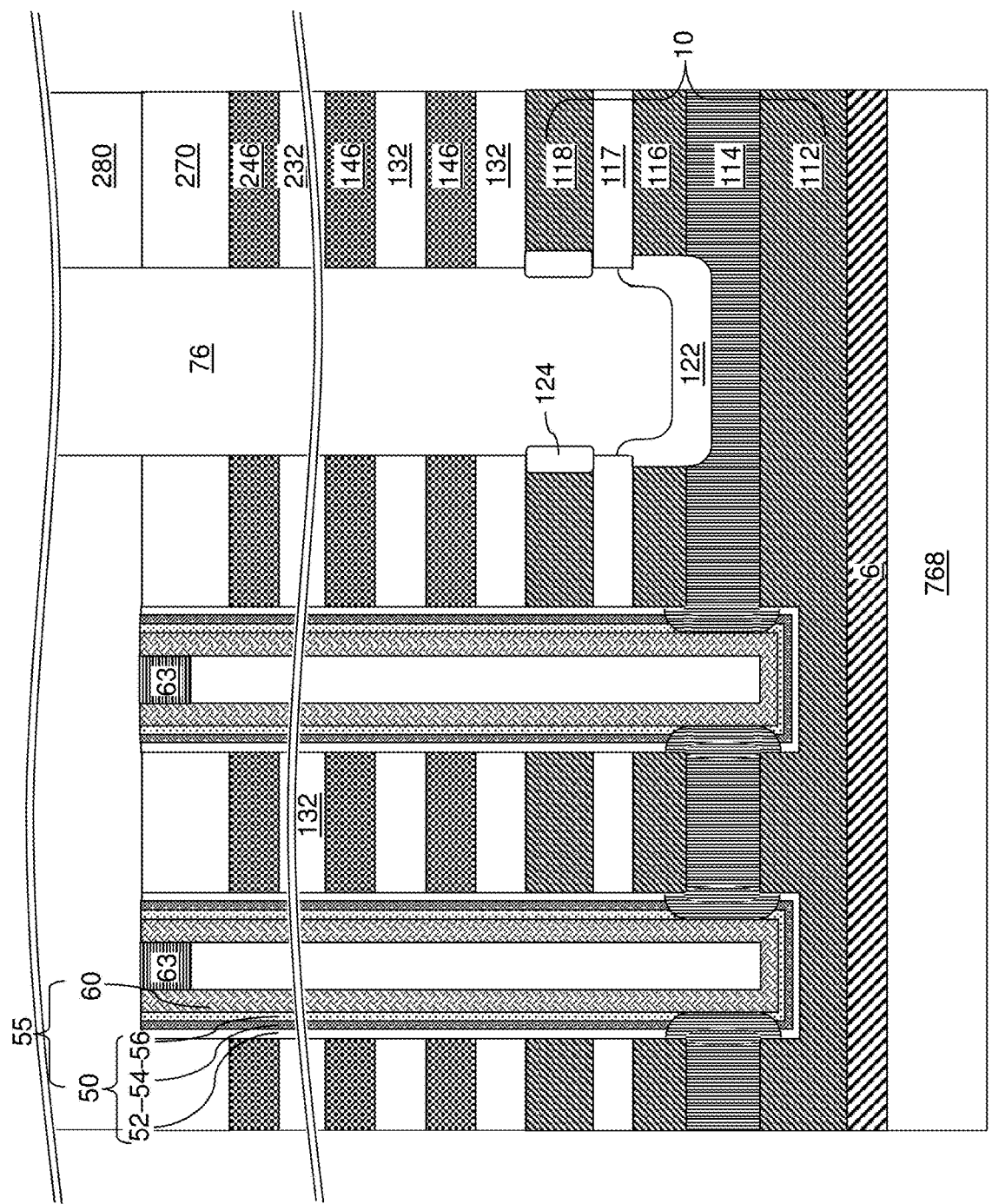
FIG. 24B is a magnified view of a region of the backside trench in the first exemplary structure of FIG. 24A.

Referring to FIGS. 24A and 24B, a dielectric material can be deposited in the backside trenches 79 and over the first and second sacrificial dielectric layers (536L, 538L). The dielectric material layer can include, for example, silicon oxide. A planarization process can be performed to sequentially remove horizontal portions of the deposited dielectric material overlying the first and second sacrificial dielectric layers (536L, 538L), the first and second sacrificial dielectric layers (536L, 538L), and the horizontal portion of the second sacrificial semiconductor layer 534L that overlies a horizontal portion of the dielectric spacer material layer 532L. The planarization process can use at least one chemical mechanical planarization process and/or at least one recess etch process.

Each remaining portion of the deposited dielectric material that fills the backside trenches 79 constitutes a dielectric wall structure 76. Each remaining portion of the second sacrificial semiconductor layer 534L located within volumes of the source contact trenches 269 and laterally surrounded by a respective vertically-extending portion of the dielectric spacer material layer 532L constitutes a sacrificial source contact trench fill structure 234. Each remaining portion of the second sacrificial semiconductor layer 534L located within volumes of the guard ring trench 569 and laterally surrounded by vertically-extending portions of the dielectric spacer material layer 532L constitutes a sacrificial guarding ring fill structure 534. Portions of the crack stopper trench spacers 574 and the sacrificial moat trench fill structures 581 located above the horizontal plane including the top surface of the horizontal portion of the dielectric spacer material layer 532L can be collaterally removed during the planarization process.

Figure 25:
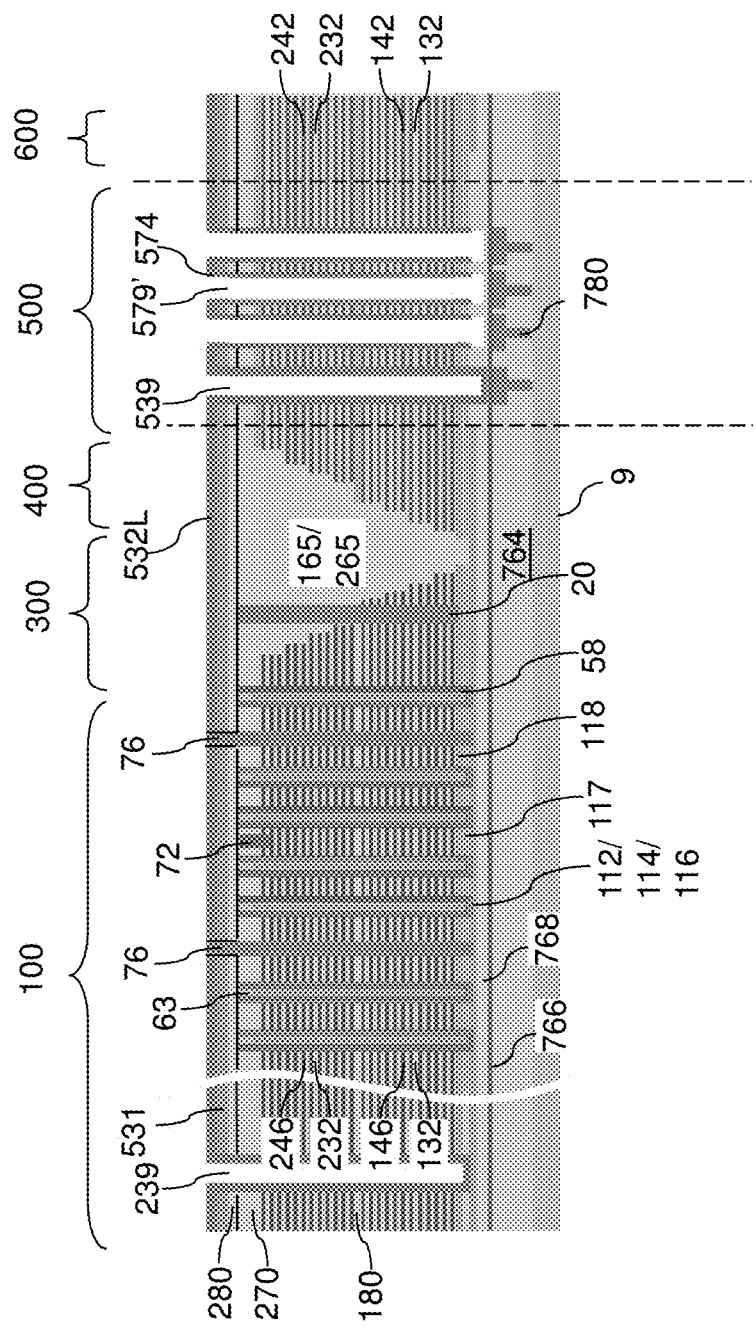
FIG. 25 is a vertical cross-section of the first exemplary structure after removal of the sacrificial moat trench fill structures and vertical portions of the second sacrificial semiconductor layer according to an embodiment of the present disclosure.

Referring to FIG. 25, the sacrificial source contact trench fill structures 234, the sacrificial guarding ring fill structure 534, and the sacrificial moat trench fill structures 581 can be simultaneously removed by an etch process that etches the materials of the sacrificial source contact trench fill structures 234, the sacrificial guarding ring fill structure 534, and the sacrificial moat trench fill structures 581 selective to the material of the dielectric spacer material layer 532L and the crack stopper trench spacers 574. For example, if the sacrificial source contact trench fill structures 234, the sacrificial guarding ring fill structure 534, and the sacrificial moat trench fill structures 581 include amorphous silicon, the etch process can include a wet etch process using hot trimethyl-2 hydroxyethyl ammonium hydroxide ("hot TMY") or tetramethyl ammonium hydroxide (TMAH). A source contact via cavity 239 is formed in each volume from which a sacrificial source contact trench fill structure 234 is removed. A guard ring cavity 539 is formed in the volume from which the sacrificial guard ring fill structure 534 is removed. A moat trench cavity 579' is formed in each volume from which a sacrificial moat trench fill structure 581 is removed. A top surface of a lower-level metallic wall structure, as embodied as a subset of the lower-level metal interconnect structures 780, is physically exposed at the bottom of each moat trench cavity 579'.

Figure 26:
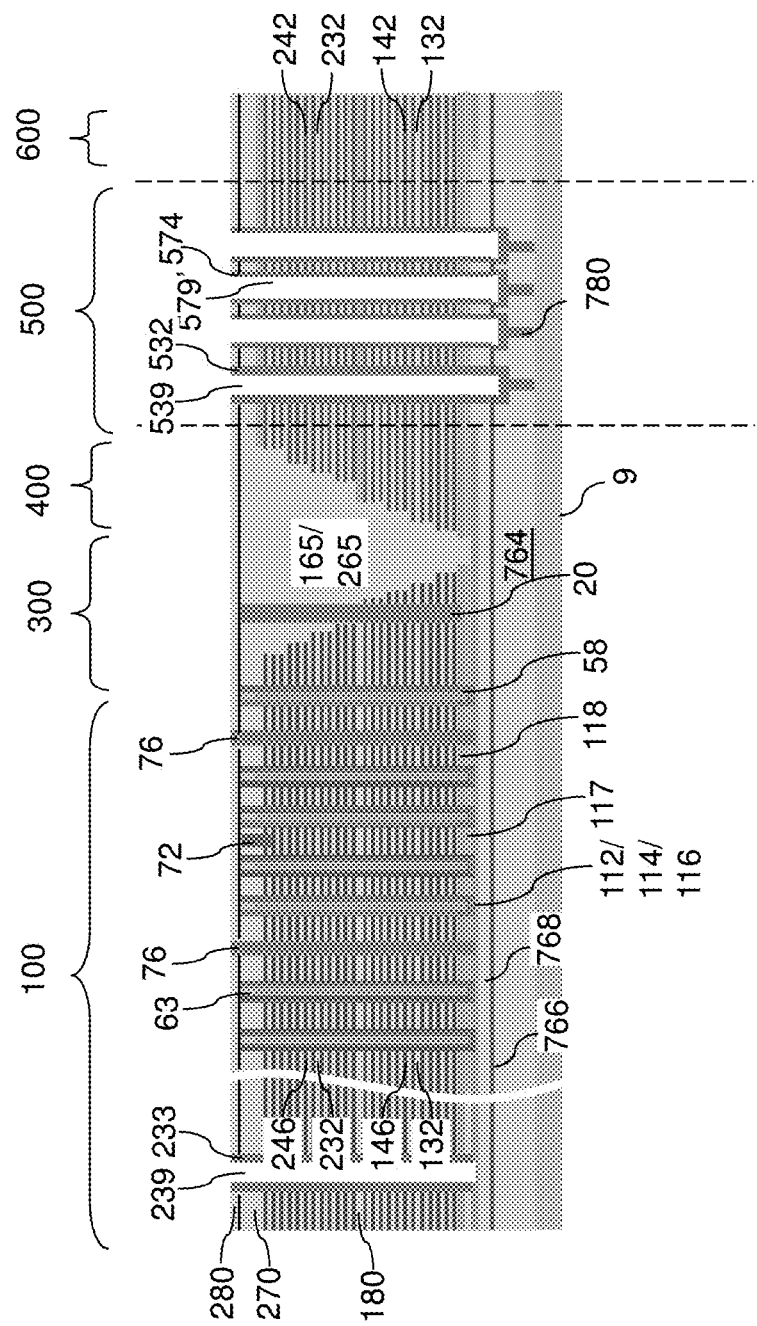
FIG. 26 is a vertical cross-sectional view of the first exemplary structure after removal of horizontal portions of the dielectric spacer material layer and the first sacrificial semiconductor layer according to an embodiment of the present disclosure.

Referring to FIG. 26, an anisotropic etch process is performed to remove horizontal portions of the dielectric spacer material layer 532L at the bottom of each source contact cavity 239 and at the bottom of the guard ring cavity 539. A top surface of a lower-level metallic wall structure is physically exposed at the bottom of the guard ring cavity 539. Horizontal portions of the dielectric spacer material layer 532L overlying the first sacrificial semiconductor layer 531 can be collaterally removed during the anisotropic etch process. Each remaining vertical portion of the dielectric spacer material layer 532L around a respective source contact cavity 239 constitutes a source dielectric spacer 233. The source semiconductor layer 114 is physically exposed at the bottom of each source contact cavity 239. Each remaining vertical portion of the dielectric spacer material layer 532L around the guard ring cavity 539 constitutes a guard ring dielectric spacer 532. Each guard ring dielectric spacer 532 comprises an inner dielectric spacer and an outer dielectric spacer that are laterally spaced apart.

An etch process is subsequently performed to remove the first sacrificial semiconductor layer 531 selective to the materials of the first contact-level dielectric layer 280, the source dielectric spacers 233, the guard ring dielectric spacer 532, the crack stopper trench spacers 574, the source semiconductor layer 114, and the lower-level metallic wall structure (as embodied as subsets of the lower-level metal interconnect structures 780).

Figure 27:
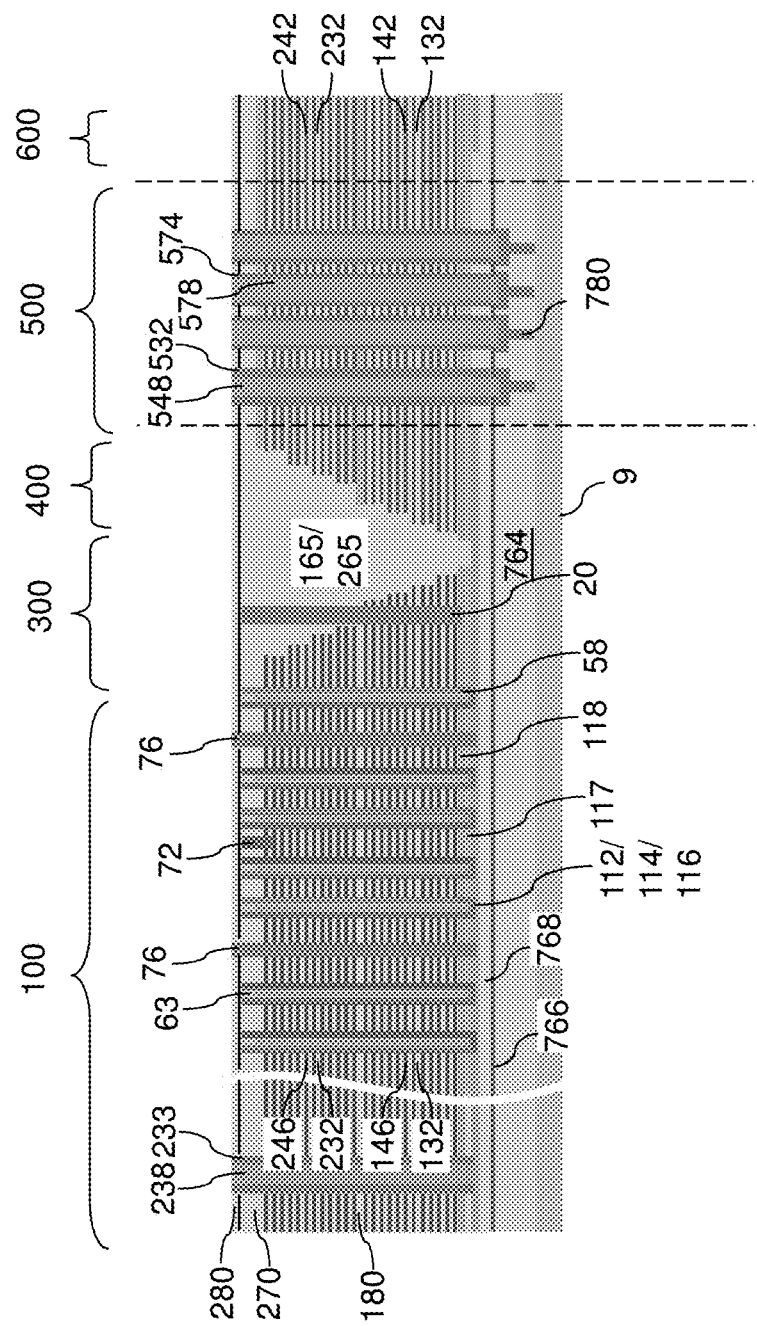
FIG. 27 is a vertical cross-sectional view of the first exemplary structure after formation of a source contact via structure and metallic wall structures according to an embodiment of the present disclosure.

Referring to FIG. 27, at least one conductive material can be simultaneously deposited in the volumes of the source contact cavities 239, the guard ring cavity 539, and the moat trench cavities 579'. The at least one conductive material can include a metallic liner material and a metallic fill material. The metallic liner material can include, for example, TiN, TaN, and/or WN. The metallic liner material can be conformally deposited with a thickness in a range from 6 nm to 100 nm, although lesser and greater thicknesses can also be used. The metallic fill material can fill remaining volumes of the source contact cavities 239, the guard ring cavity 539, and the moat trench cavities 579' that are not filled with the metallic liner material. For example, the metallic fill material can include tungsten, copper, aluminum, ruthenium, cobalt, molybdenum, another elemental metal, an intermetallic alloy thereof, or a combination thereof. Excess portions of the at least one metallic material can be removed from above the horizontal plane including the top surface of the first contact-level dielectric material layer 280 by a planarization process, which can use chemical mechanical planarization and/or a recess etch.

Each remaining portion of the at least one metallic material in each source contact cavity 239 constitutes a source contact via structure 238. The remaining portion of the at least one metallic material in the guard ring cavity 539 constitutes a guard ring metallic wall structure 548. Each remaining portion of the at least one metallic material in the moat trench cavities 579' constitutes a crack stop metallic wall structure 578. Each source contact via structure 238 is formed through a first alternating stack of insulating layers (132, 232) and electrically conductive layers (146, 246), which is formed by replacement of sacrificial material layers (142, 242) in an inner alternating stack {(132, 142), (232, 242)}. The guard ring metallic wall structure 548 and each crack stop metallic wall structure 578 are formed through the outer alternating stack {(132, 142), (232, 242)}, which is also referred to as a second alternating stack {(132, 142), (232, 242)} henceforth. The at least one metallic wall structure (548, 578) that includes the guard ring metallic wall structure 548 and each crack stop metallic wall structure 578 is formed vertically through the second alternating stack {(132, 142), (232, 242)}. The at least one metallic wall structure (548, 578) divides the second alternating stack {(132, 142), (232, 242)} into multiple nested portions.

Figure 28:
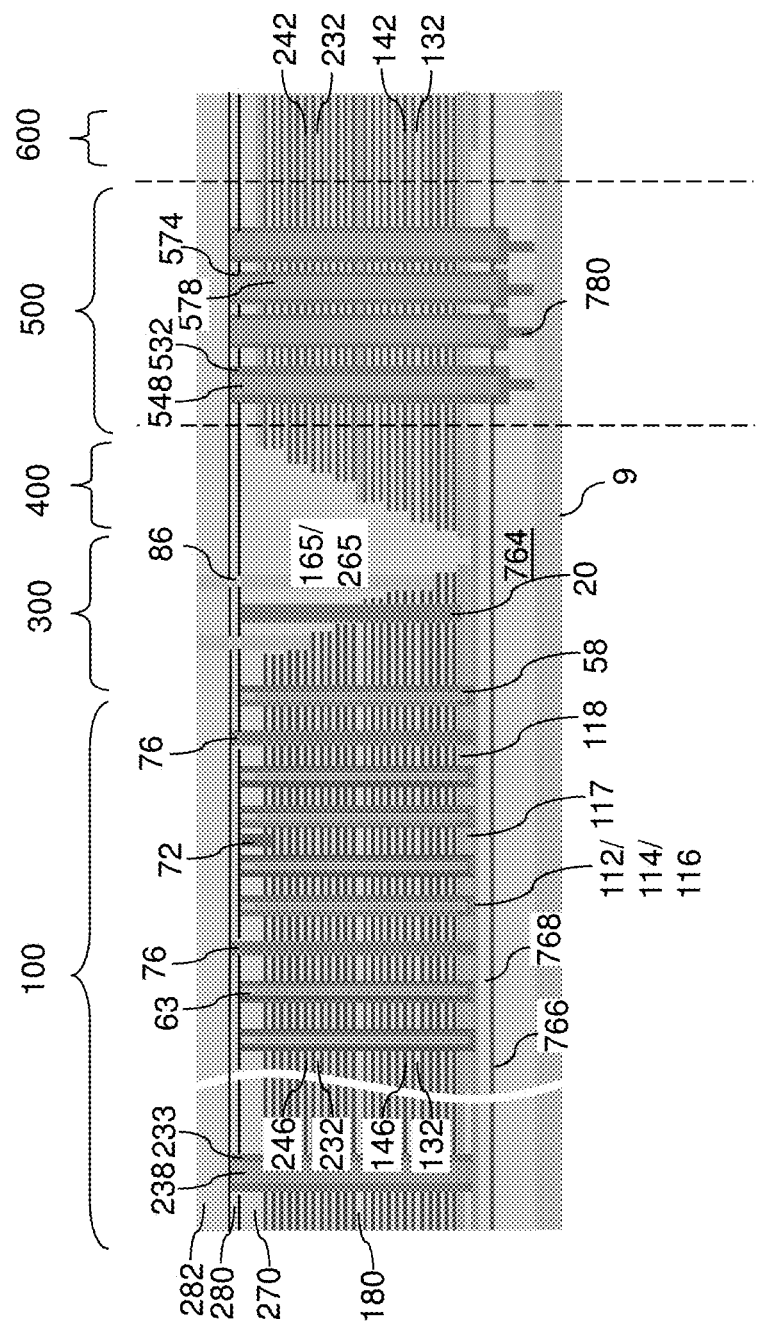
FIG. 28 is a vertical cross-sectional view of the first exemplary structure after formation of staircase-region contact via structures according to an embodiment of the present disclosure.

Referring to FIG. 28, a second contact-level dielectric layer 282 may be formed over the first contact-level dielectric layer 280. The second contact-level dielectric layer 282 includes a dielectric material such as silicon oxide, and can have a thickness in a range from 100 nm to 600 nm, although lesser and greater thicknesses can also be used.

A photoresist layer (not shown) can be applied over the second contact-level dielectric layer 282, and can be lithographically patterned to form staircase region openings in the staircase region 300. An anisotropic etch process is performed to transfer the pattern in the photoresist layer through the second and first contact-level dielectric layers (282, 280) and underlying dielectric material portions. The electrically conductive layers (146, 246) can be used as etch stop structures. Staircase-region contact via cavities can be formed over each electrically conductive layer (146, 246) at the stepped surfaces underlying the first and second retro-stepped dielectric material portions (165, 265). The photoresist layer can be subsequently removed, for example, by ashing.

Staircase-region contact via structures 86 are formed in the staircase-region contact via cavities and on a top surface of a respective one of the electrically conductive layers (146, 246). The staircase-region contact via structures 86 can include word line contact via structures that contact electrically conductive layers (146, 246) that function as word lines for the memory stack structures 55. The staircase-region contact via structures 86 can further include drain-select-level contact via structures that contact a subset of the second electrically conductive layers 246 that function as drain-select-level gate electrodes.

Figure 29:
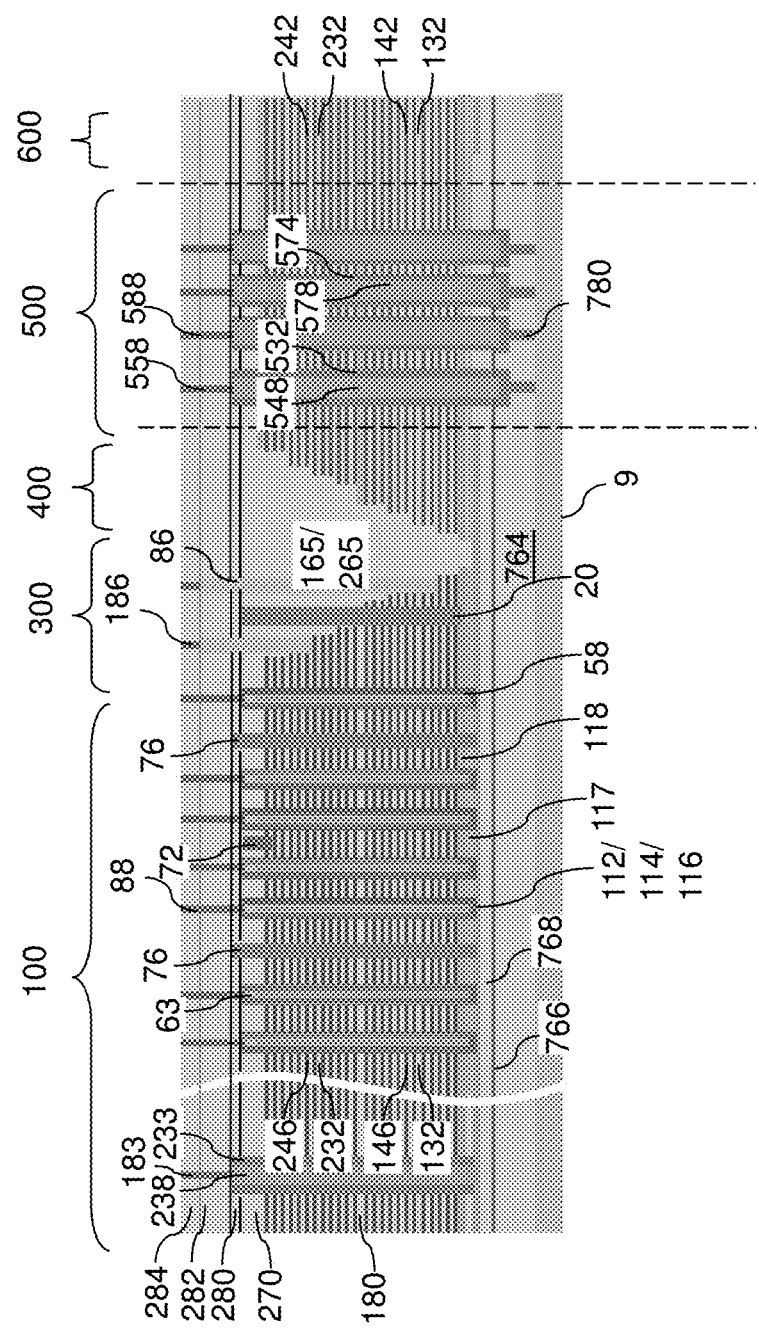
FIG. 29 is a vertical cross-sectional view of the first exemplary structure after formation of additional contact via structures according to embodiments of the present disclosure.

Referring to FIG. 29, a third contact-level dielectric layer 284 may be formed over the second contact-level dielectric layer 282. The third contact-level dielectric layer 284 includes a dielectric material such as silicon oxide, and can have a thickness in a range from 100 nm to 600 nm, although lesser and greater thicknesses can also be used.

A photoresist layer (not shown) can be applied over the second contact-level dielectric layer 282, and can be lithographically patterned to form additional openings in the memory array regions 100, the staircase regions 300, and the edge seal region 500. An anisotropic etch process is performed to transfer the pattern in the photoresist layer through the third, second, and first contact-level dielectric layers (284, 282, 280) and underlying dielectric material portions. The drain regions 63, the staircase-region contact via structures 86, the source contact via structures 238, the guard ring metallic wall structure 548, and the crack stop metallic wall structures 578 can be used as etch stop structures. Various contact via cavities are formed over the drain regions 63, the staircase-region contact via structures 86, the source contact via structures 238, the guard ring metallic wall structure 548, and the crack stop metallic wall structures 578. The photoresist layer can be subsequently removed, for example, by ashing.

At least one conductive material can be deposited in the various contact via cavities, and excess portions of the at least one conductive material can be removed from above the horizontal plane including the top surface of the third contact-level dielectric layer 284. Drain contact via structures 88 are formed on top of the drain regions 63. Staircase-region connection via structures 186 are formed on the staircase-region contact via structures 86. Source connection via structures 183 can be formed on the source contact via structures 238. A guard ring connection via structure 558 is formed on the guard ring metallic wall structure 548. A crack stop connection via structure 588 is formed on each crack stop metallic wall structure 578. The various via structures including the drain contact via structures 88, the staircase-region contact via structures 86, the staircase-region connection via structures 186, the source connection via structures 183, the guard ring connection via structure 558, and the crack stop connection via structures 588 are components of upper-level metal interconnect structures.

Figure 30:
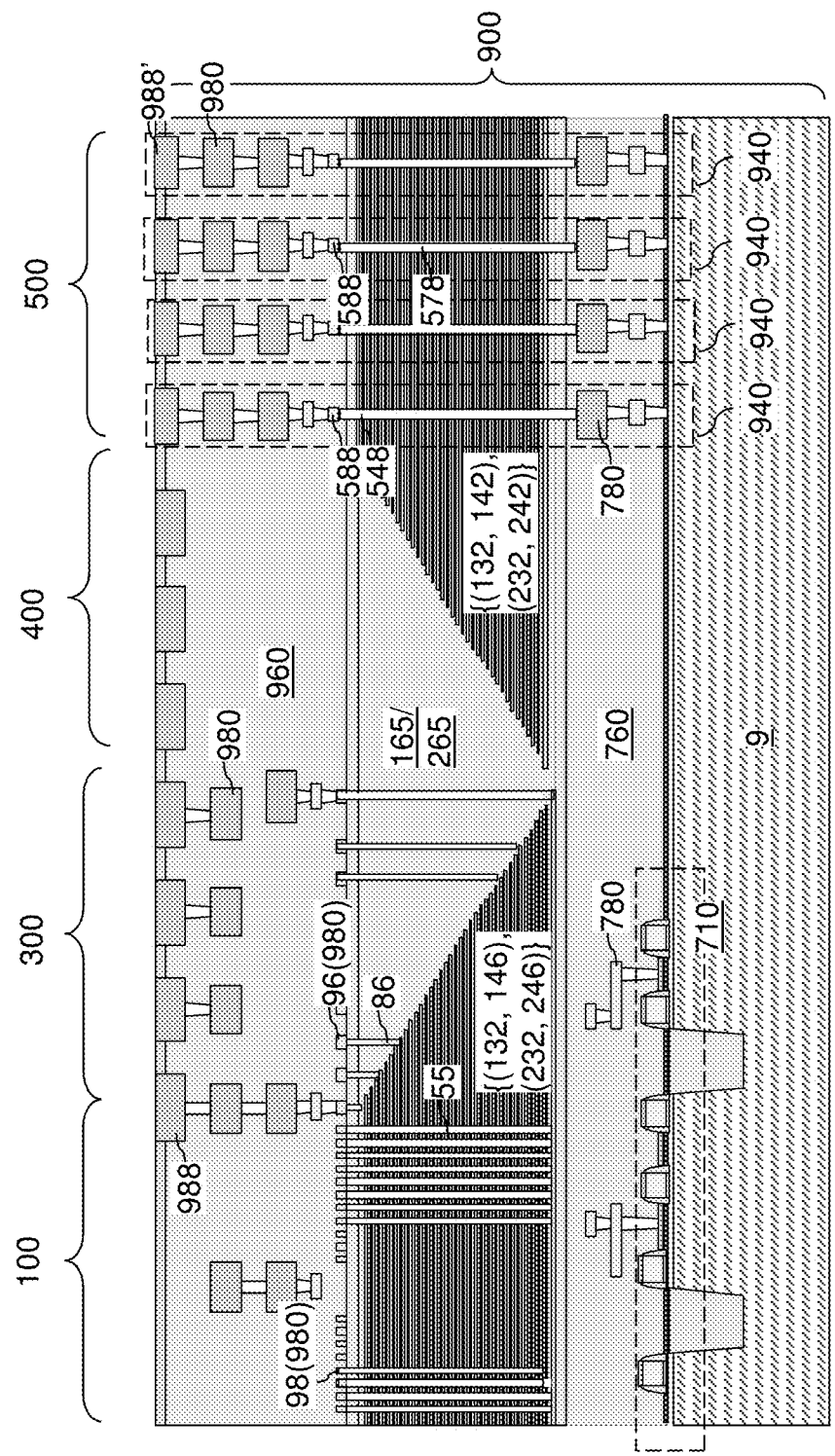
FIG. 30 is a vertical cross-sectional view of the first exemplary structure after completion of formation of a memory die according to an embodiment of the present disclosure.

Referring to FIG. 30, additional dielectric layer (herein referred to as upper-level dielectric material layers 960) can be formed over the contact-level dielectric layers (280, 282, 284), and additional upper-level metal interconnect structures 980 can be formed in the upper-level dielectric material layers 960. The additional upper-level metal interconnect structures 980 can include bit lines 98 contacting a respective one of the drain contact via structures 88, and first-line-level metal structures 96 contacting, and/or electrically connected to, at least one of the staircase-region connection via structures 186 and/or source connection via structures 183. The additional upper-level metal interconnect structures 980 can further include various metal via structures and various metal line structures that are formed over the bit lines 98 and the first-line-level metal structures 96 and included in the upper-level dielectric material layers 960.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, the semiconductor substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon, the electrically conductive layers (146, 246) comprise a plurality of control gate electrodes having a strip shape extending substantially parallel to the top surface of the semiconductor substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the semiconductor substrate 8, and one of the plurality of semiconductor channels including the vertical semiconductor channel 60. The array of monolithic three-dimensional NAND strings comprises a plurality of charge storage elements (as embodied as portions of the memory films 50), each charge storage element located adjacent to a respective one of the plurality of semiconductor channels 60.

Pad cavities are formed in topmost layer of the upper-level dielectric material layers 960 in the memory array regions 100 and the staircase regions 300. Moat trenches that encircle the memory array regions 100 and the staircase regions 300 are formed in the edge seal region 500. The locations of the moat trenches can be selected such that each moat trench overlies a respective metallic wall structure (548 or 578). A respective one of the additional upper-level metal interconnect structures 980 can be exposed at the bottom of each pad cavity. An annular top surface of an underlying continuous one of the upper-level metal interconnect structures 980 can be physically exposed at the bottom of each moat trench.

In one embodiment, the pad cavities can be arranged as a one-dimensional array or as a two-dimensional array, and may have a respective polygonal, circular, elliptical, or generally-curvilinear shape. A conductive material can be deposited in the pad cavities and the moat trenches to form various memory-die bonding pads 988 and memory-die bonding strips 988'. The memory-die bonding pads 988 and the memory-die bonding strips 988' can be formed simultaneously using a same set of deposition steps and patterning steps. The memory-die bonding pads 988 can include source-network memory-die bonding pads electrically connected to the source semiconductor layer 114, word-line-connection memory-die bonding pads that are electrically connected to a respective one of the electrically conductive layers (146, 246) that function word lines, and bit-line-connection upper-level memory-die bonding pads that are electrically connected to the bit lines 98. Each memory-die bonding strip 988' can continuously encircle the memory array region 100 and the staircase region 300, and can overlie a respective one of the metallic wall structures (548 or 578). The first exemplary structure comprises a memory die 900.

The upper-level metal interconnect structures (86, 186, 88, 980, 183, 558, 588, 980) include metal via structures and metal line structures that are stacked over the guard ring metallic wall structure 548 and each crack stop metallic wall structure 578 to provide continuous metal barrier structures that encircle the memory array regions 100 and the staircase regions 300. At least one vertical stack 940 of metallic seal structures (780, 548, 578, 588, 980, 988') is provided in the edge seal region 500. Each of the at least one vertical stack 940 of metallic seal structures (780, 548, 578, 588, 980, 988') comprises a respective subset (558, 588, 980) of the upper-level metal interconnect structures (86, 186, 88, 980, 183, 558, 588, 980) that contiguously extends between the respective metallic wall structure (548 or 578) and a respective memory-die bonding strip 988'. Each of the at least one memory-die bonding strip 988' laterally surrounds, and laterally encloses, the memory-die bonding pads 988. Each of the at least one vertical stack of metallic seal structures (780, 548, 578, 588, 980, 988') comprises a respective memory-die bonding strip 988'.

The collection of all vertical stacks 940 of metallic seal structures (780, 548, 578, 588, 980, 988') and intervening material portions located between neighboring pairs of vertical stacks 940 is herein referred to as an edge seal assembly. The edge seal assembly comprises at least one vertical stack 940 of metallic seal structures (780, 548, 578, 588, 980, 988'), which can be a plurality of vertical stacks 940 of metallic seal structures (780, 548, 578, 588, 980, 988'). Each of the at least one vertical stack 940 of metallic seal structures (780, 548, 578, 588, 980, 988') vertically extends contiguously from a top surface of the semiconductor substrate 8 to a bonding-side surface of the upper-level dielectric material layers 960, and comprises a respective one of the at least one metallic wall structure (548, 578).

In one embodiment, each of the at least one vertical stack 940 of metallic seal structures (780, 548, 578, 588, 980, 988') comprises a respective subset of the lower metal interconnect structures 780 that contiguously extends between the respective metallic wall structure (548 or 578) and the semiconductor substrate 8. In one embodiment, the at least one vertical stack 940 of metallic seal structures (780, 548, 578, 588, 980, 988') comprises a plurality of vertical stacks 940 of metallic seal structures (780, 548, 578, 588, 980, 988'). Each of the plurality of vertical stacks 940 of metallic seal structures (780, 548, 578, 588, 980, 988') laterally surrounds, or is laterally surrounded by, another vertical stack 940 among the plurality of vertical stacks of metallic seal structures (780, 548, 578, 588, 980, 988').

Figure 31:
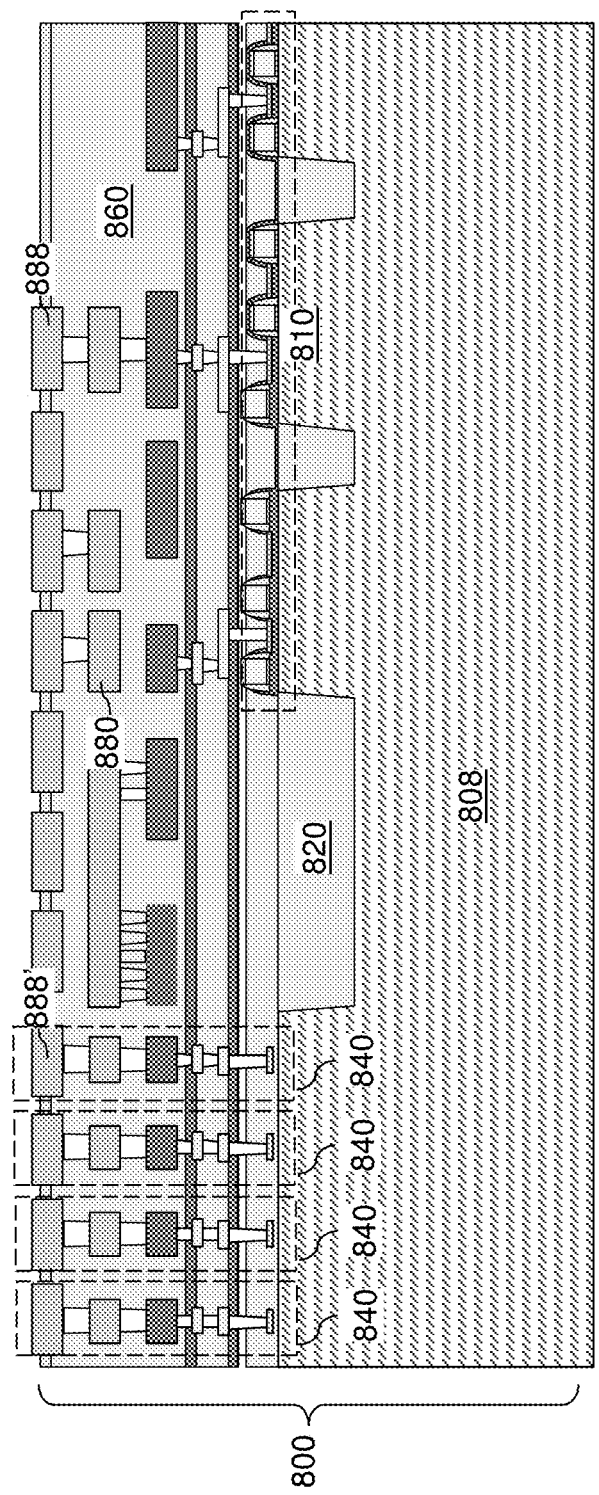
FIG. 31 is a vertical cross-sectional view of a support die according to an embodiment of the present disclosure.

Referring to FIG. 31, a support die 800 is provided, which comprises various semiconductor devices 810 formed on a support-die semiconductor layer 808. The support-die semiconductor layer 808 can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The semiconductor devices 810 includes peripheral circuitry for operation of the three-dimensional memory arrays in the memory die 900. The peripheral circuitry can be configured to control operation of vertical stacks of memory elements in the three-dimensional memory array of the memory die 900. For example, the peripheral circuitry can include a word line driver that drives word lines of the three-dimensional memory array (as embodied as the electrically conductive layers (146, 246)) within the memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to source semiconductor layer 114 the memory die 900, a data buffer and/or latch, or any other semiconductor circuit that can be used to operate the array of memory stack structures 55 in the memory die 900.

Shallow trench isolation structures 820 can be provided in a surface region of the support-die semiconductor layer 808 to provide electrical isolation among semiconductor devices of the peripheral circuitry. The various semiconductor devices 810 can include field effect transistors.

Dielectric material layers are formed over the semiconductor devices 810, which are herein referred to as support-die dielectric material layers 860. Support-die metal interconnect structures 880 are included within the support-die dielectric material layers 860. The support-die metal interconnect structures 880 can include various device contact via structures (e.g., source and drain electrodes which contact the respective source and drain nodes of the device or gate electrode contacts), interconnect-level metal line structures, and interconnect-level metal via structures. Support-die bonding pads 888 and support-die bonding strips 888' can be formed on the topmost level of the support-die metal interconnect structures 880. The support-die bonding pads 888 are provided at a bonding-side surface of support-die dielectric material layers 860 that overlie the peripheral circuit. The support-die metal interconnect structures 880 electrically connect nodes of the peripheral circuit to a respective one of the support-die bonding pads 888. The support-die bonding pads 888 can be configured to mate with the memory-die bonding pads 988 of the memory die 900, and the support-die bonding strips 888' can be configured to mate with the memory-die bonding strips 988'.

At least one vertical stack 840 of support-die metallic seal structures is provided in the support die 800. Each of the at least one vertical stack 840 of support-die metallic seal structures (880, 888') comprises a respective subset of the support-die metal interconnect structures 880 that contiguously extends between the support-die semiconductor layer 808 and a respective support-die bonding strip 888'. Each of the at least one support-die bonding strip 888' laterally surrounds, and laterally encloses, the support-die bonding pads 888. Each of the at least one vertical stack 840 of support-die metallic seal structures (880, 888') comprises a respective support-die bonding strip 888'. In one embodiment, the at least one vertical stack 840 of support-die metallic seal structures (880, 888') comprises a plurality of vertical stacks 840 of support-die metallic seal structures (880, 888'). In one embodiment, the pattern of the at least one vertical stack 840 of support-die metallic seal structures (880, 888') of the support die 800 can be a mirror image of the pattern of the at least one vertical stack 940 of metallic seal structures (780, 548, 578, 588, 980, 988') of the memory die 900.

Figure 32:
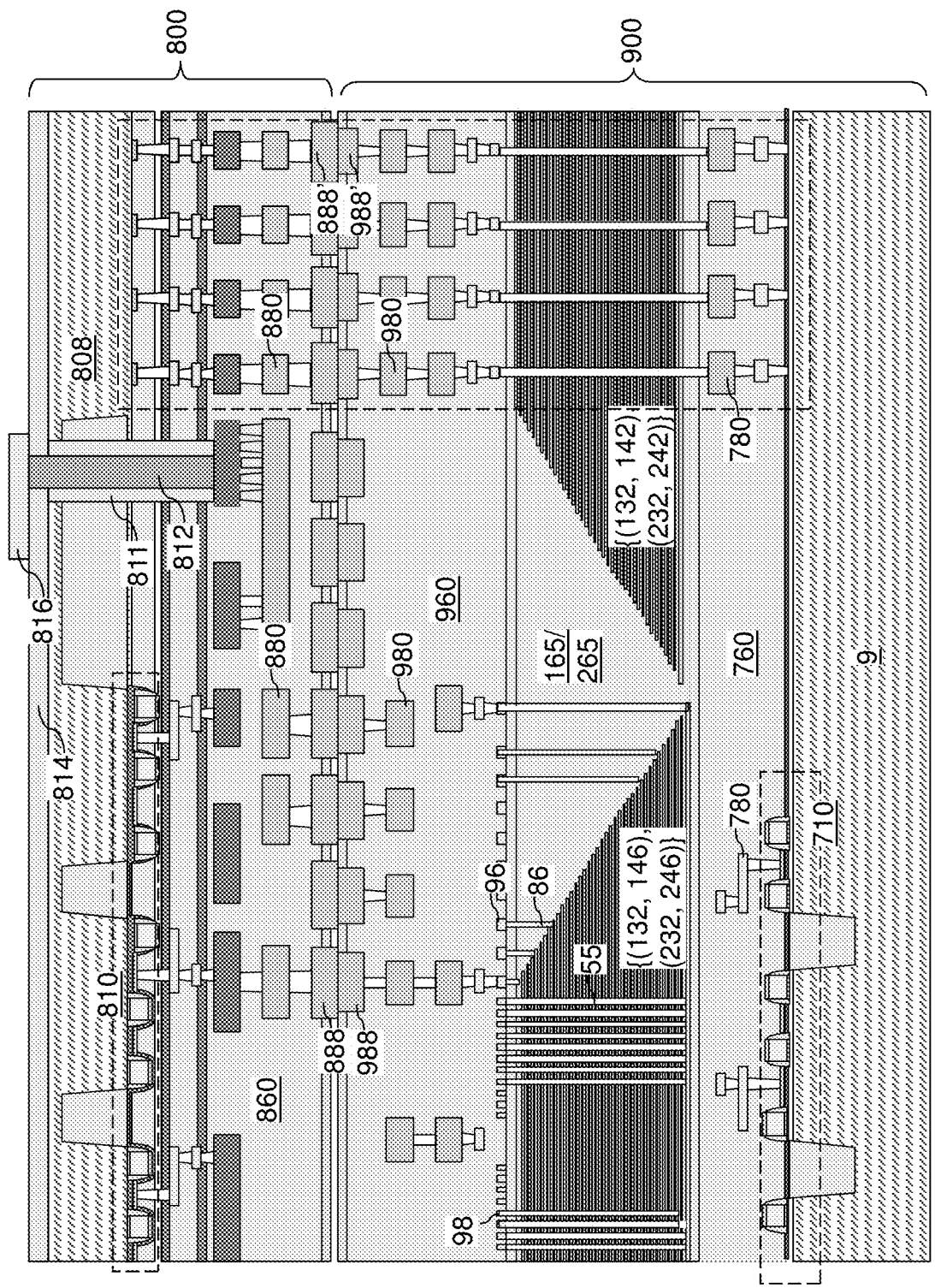
FIG. 32 is a vertical cross-sectional view of the first exemplary structure after bonding the support die to the memory die according to an embodiment of the present disclosure.
Figure 33:
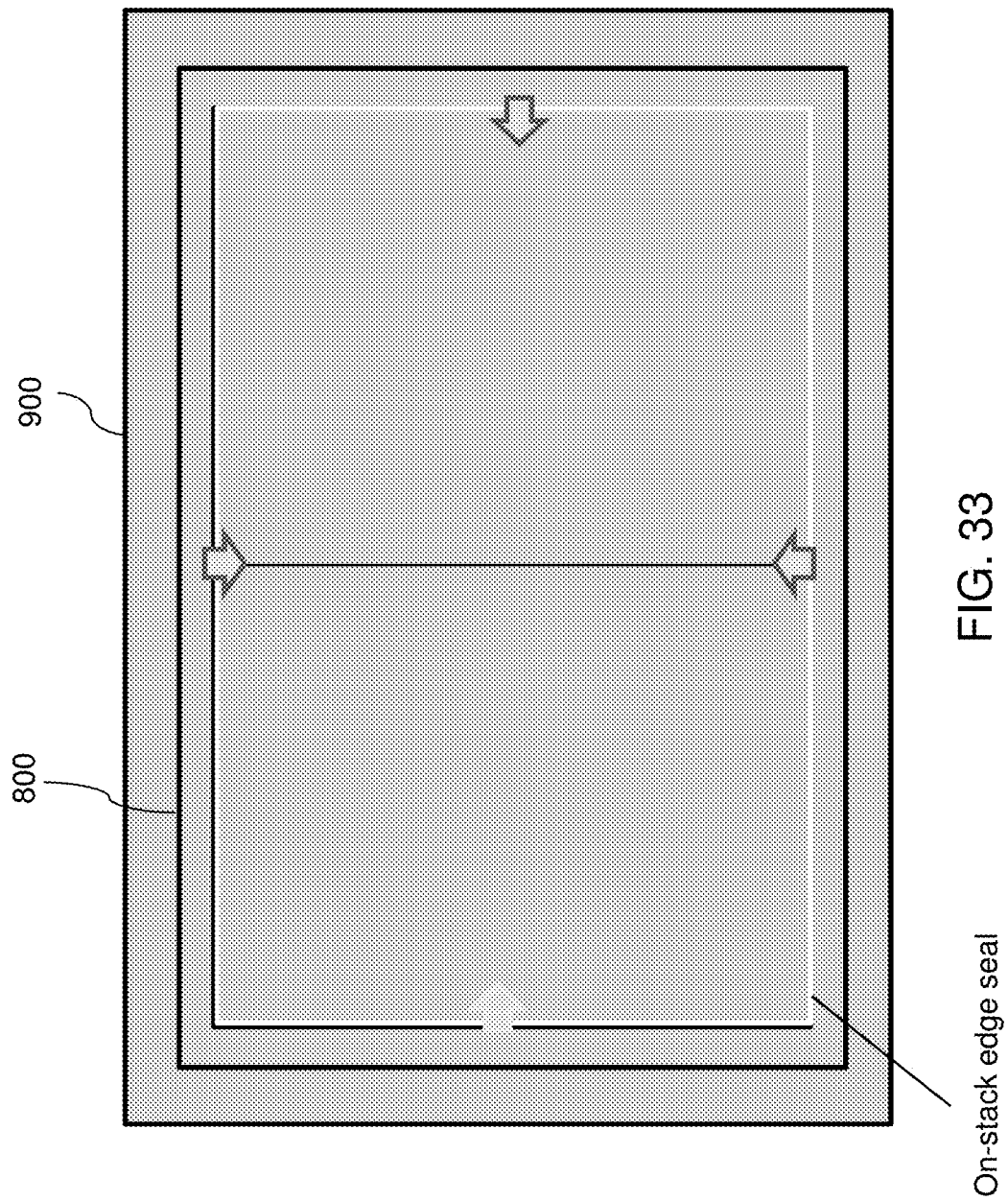
FIG. 33 is a plan view of the first exemplary structure of FIG. 32.

Referring to FIGS. 32 and 33, the memory die 900 and the support die 800 can be bonded to each other using metal-to-metal bonding. Specifically, the memory-die bonding pads 988 can be bonded to the support-die bonding pads 888, and the memory-die bonding strips 988' can be bonded to the support-die bonding strips 888' by metal-to-metal bonding. The support-die semiconductor layer 808 can be subsequently thinned, for example, by grinding. The thickness of the support-die semiconductor layer 808 after grinding can be in a range from 3 microns to 100 microns, although lesser and greater thicknesses can also be used.

A backside insulating layer 814 can be deposited on the backside surface of the support-die semiconductor layer 808. The backside insulating layer 814 can include silicon oxide and/or silicon nitride. Through-substrate via cavities can be formed through the support-die semiconductor layer 808 and optionally through portion of the support-die dielectric material layer 860 on a respective one of the support-die metal interconnect structures 880. A through-substrate insulating spacer 811 and a through-substrate conductive via structure 812 can be formed within each through-substrate via cavity. An external bonding pad 816 can be formed on each of the through-substrate conductive via structures 812.

During bonding of the memory die 900 and the support die 800, each vertical stack 840 of support-die metallic seal structures (880, 888') mates with a respective vertical stack 940 of metallic seal structures (780, 548, 578, 588, 980, 988') to provide an "on-stack" edge seal structure, which is a continuous metallic seal structure that extends between the semiconductor substrate 8 of the memory die 900 to the support-die semiconductor layer 808 of the support die 800. A plurality of nested continuous metallic seal structures can be provided in the bonded assembly of the memory die 900 and the support die 800. Each vertical stack 940 of metallic seal structures (780, 548, 578, 588, 980, 988') is formed through the outer alternating stack {(132, 142), (232, 242)} of insulating layers (132, 232) and sacrificial material layers (232, 242), and thus, is more resistant to deformation than an edge seal structure formed within a silicon oxide material portion.

Figure 34:
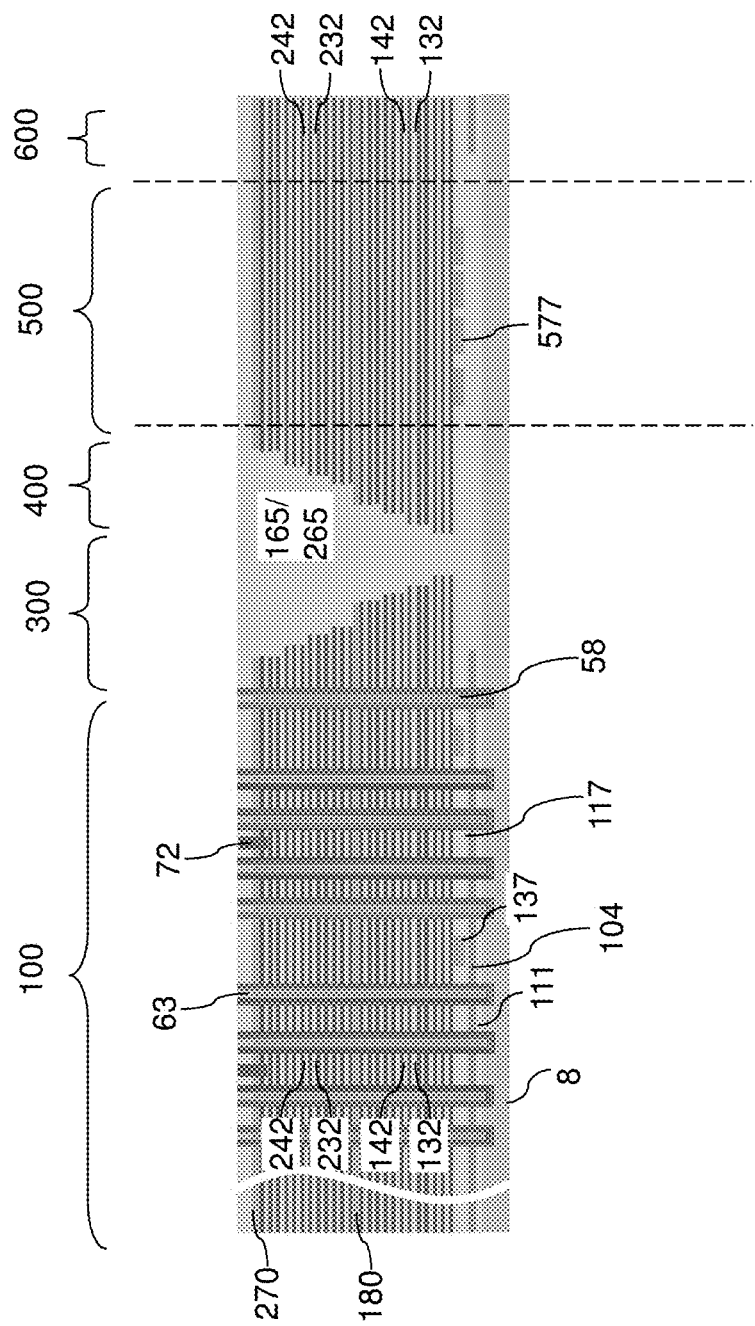
FIG. 34 is a vertical cross-sectional view of a second exemplary structure after formation of memory opening fill structures according to an embodiment of the present disclosure.

Referring to FIG. 34, a second exemplary structure according to an embodiment of the present disclosure can be derived from the first exemplary structure by using a vertical stack including a semiconductor substrate 8, a dielectric source spacer layer 111, a source-level sacrificial layer 104, and a source-level insulating layer 117 in lieu of the combination of a semiconductor substrate 8, semiconductor devices 710, the lower-level dielectric material layers 760, the lower-level metal interconnect structures 780, the optional conductive plate layer 6, and the in-process source-level material layers 10' of the present disclosure. The dielectric source spacer layer 111 includes a dielectric material such as silicon oxide, and can have a thickness in a range from 50 nm to 500 nm, although lesser and greater thicknesses can also be used. Array region sacrificial etch stop structures 137 may be formed in the upper portion of the source-level insulating layer 117 in areas in which backside trenches are to be subsequently formed. Edge seal region sacrificial etch stop structures 577 may be formed in the upper portion of the source-level insulating layer 117 in areas in which vertical stacks of metallic seal structures are to be subsequently formed. Each of the edge seal region sacrificial etch stop structures 577 can laterally enclose the memory array regions 100 and the staircase regions 300, and may be formed as a nested structure.

The processing steps of FIG. 2 through FIGS. 10A-10C can be performed to form at least one inner alternating stack of insulating layers (132, 232) and sacrificial material layers (142, 242) in the memory array regions 100 and the staircase regions 300, and to form an outer alternating stack of insulating layers (132, 232) and sacrificial material layers (142, 242) in the edge seal region 500, the kerf region 600, and the edge-side staircase region 400. In the second exemplary structure, the memory openings 49 and the memory opening fill structures 58 can vertically extend through the source-level sacrificial layer 104 and the dielectric source spacer layer 111, and into an upper portion of the semiconductor substrate 8. Optionally, formation of the support pillar structures 20 may be omitted.

Figure 35:
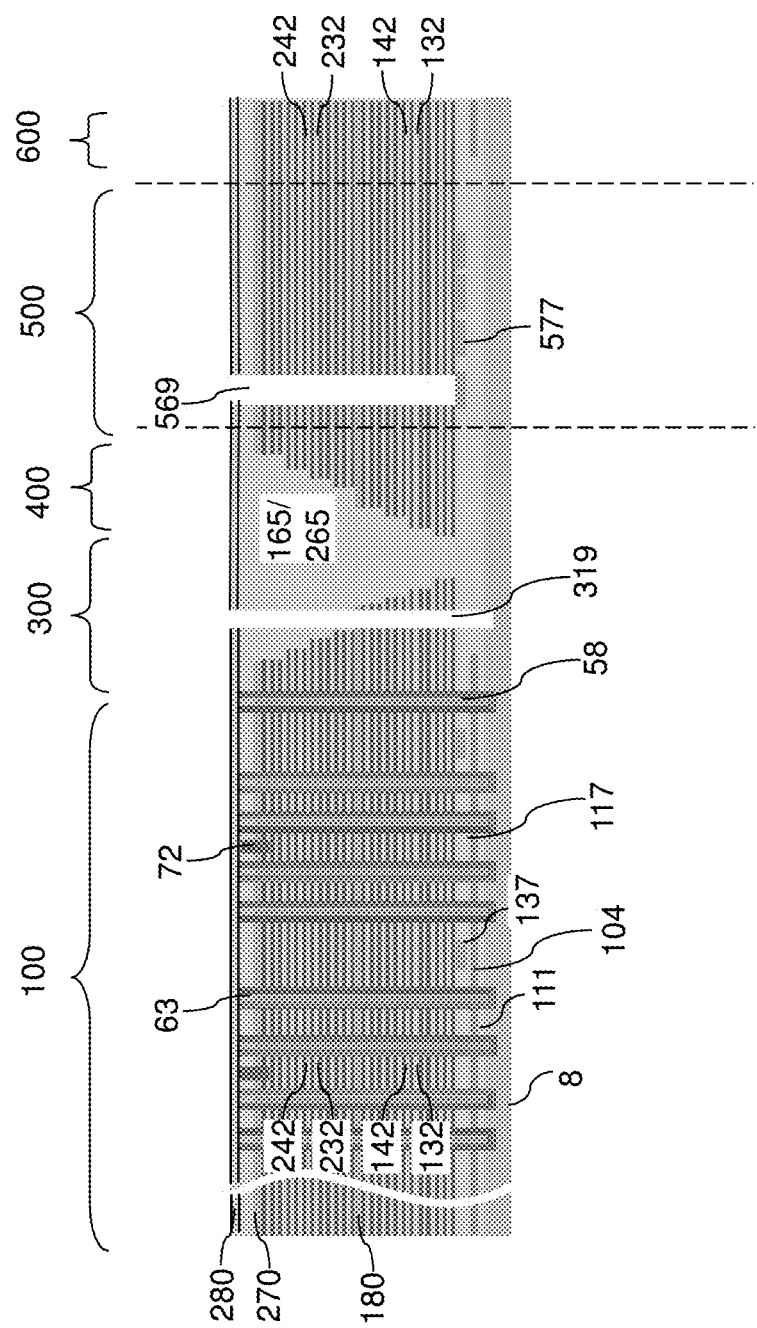
FIG. 35 is a vertical cross-sectional view of the second exemplary structure after formation of a first contact-level dielectric layer, support openings and a guard ring trench according to an embodiment of the present disclosure.

Referring to FIG. 35, a first contact-level dielectric layer 280 can be deposited on top of the second insulating cap layer 270. The first contact-level dielectric layer 280 includes a dielectric material such as silicon oxide, and can be formed by a conformal or non-conformal deposition process. For example, the first contact-level dielectric layer 280 can include undoped silicate glass and can have a thickness in a range from 100 nm to 600 nm, although lesser and greater thicknesses can also be used.

A photoresist layer (not shown) can be applied over the first contact-level dielectric layer 280, and can be lithographically patterned to form openings in the staircase regions 300 and a moat opening that encircles the memory array region 100, the staircase regions 300, and the edge-side staircase region 400 within the edge seal region 500. The pattern in the photoresist layer can be transferred through the first contact-level dielectric layer 280, each inner alternating stack {(132, 142), (232, 242)} located in the memory array regions 100 and the staircase regions 300, and the outer alternating stack {(132, 142), (232, 242)} located in the edge seal region 500, the kerf region 600, and the edge-side staircase region 400. Support openings 319 extending to a top surface of the semiconductor substrate 8 can be formed in the staircase regions 300. A guard ring trench 569 having a shape of a moat trench can be formed through the outer alternating stack {(132, 142), (232, 242)} within the edge seal region 500. In one embodiment, the edge seal region sacrificial etch stop structures 577 can be located in source-level insulating layer 117 within the area of the guard ring trench 569. The edge seal region sacrificial etch stop structures 577 can have an annular configuration that encloses the memory array regions 100 and the staircase regions 300. A continuous top surface of an edge seal region sacrificial etch stop structure 577 can be physically exposed at the bottom of the guard ring trench 569.

Figure 36:
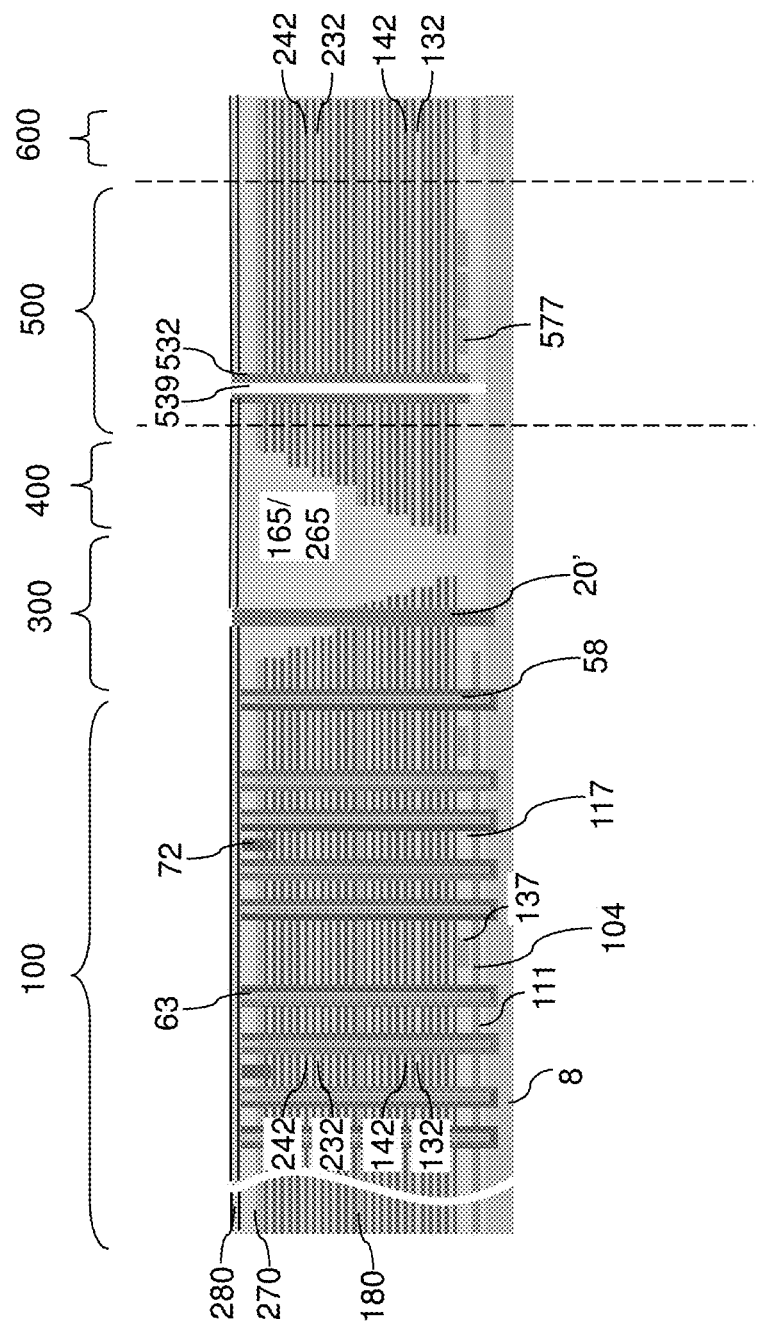
FIG. 36 is a vertical cross-sectional view of the second exemplary structure after formation of dielectric spacers and support pillar structures according to an embodiment of the present disclosure.

Referring to FIG. 36, a dielectric spacer material layer can be conformally deposited in the support openings 319 and the guard ring trench 569. The dielectric spacer material layer comprises a material that is different from the material of the sacrificial material layers (142, 242). For example, the dielectric spacer material layer can include silicon oxide. The thickness of the dielectric spacer material layer can be greater than one half of the width of each support opening 319 and can be less than one half of the width of the guard ring trench 569, i.e., less than one half of the lateral separation distance between a facing pair of an inner sidewall of the guard ring trench 569 and an outer sidewall of the guard ring trench 569.

An anisotropic etch process is performed to remove horizontal portions of the dielectric spacer material layer from above the first contact-level dielectric layer 280 and at the bottom of the guard ring trench 569. Each support opening 319 is filled with a remaining portion of the dielectric spacer material layer, which constitutes a support pillar structure 20' consisting of at least one dielectric material. Remaining vertical portions of the dielectric spacer material layer in the guard ring trench 569 constitute a guard ring dielectric spacer 532. Each guard ring dielectric spacer 532 comprises an inner dielectric spacer and an outer dielectric spacer that are laterally spaced apart.

Figure 37:
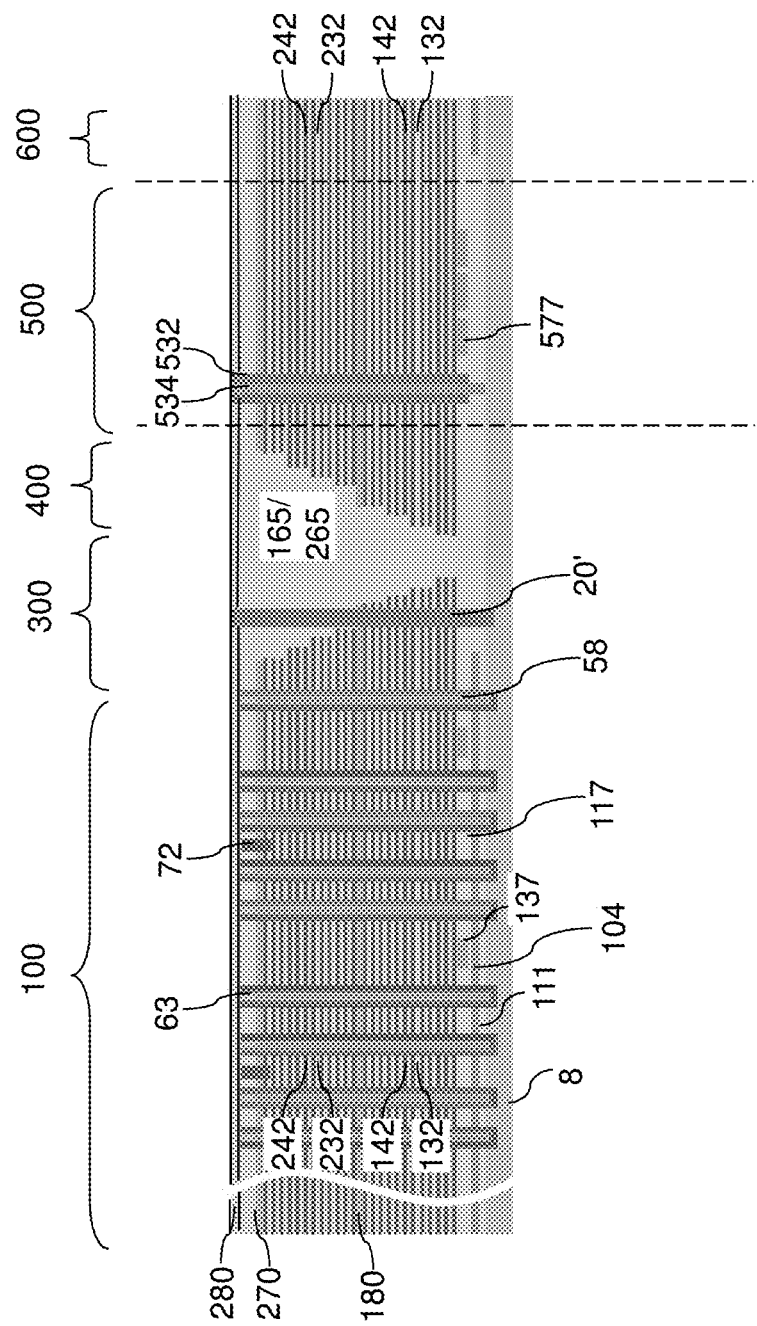
FIG. 37 is a vertical cross-sectional view of the second exemplary structure after formation of a sacrificial guard ring trench fill structure according to an embodiment of the present disclosure.

Referring to FIG. 37, a sacrificial fill material can be deposited in remaining volumes of the guard ring trench 569 to form a sacrificial guarding ring fill structure 534. The sacrificial guard ring fill structure 534 can include a semiconductor material such as amorphous silicon, polysilicon, or a silicon-germanium alloy.

Figure 38:
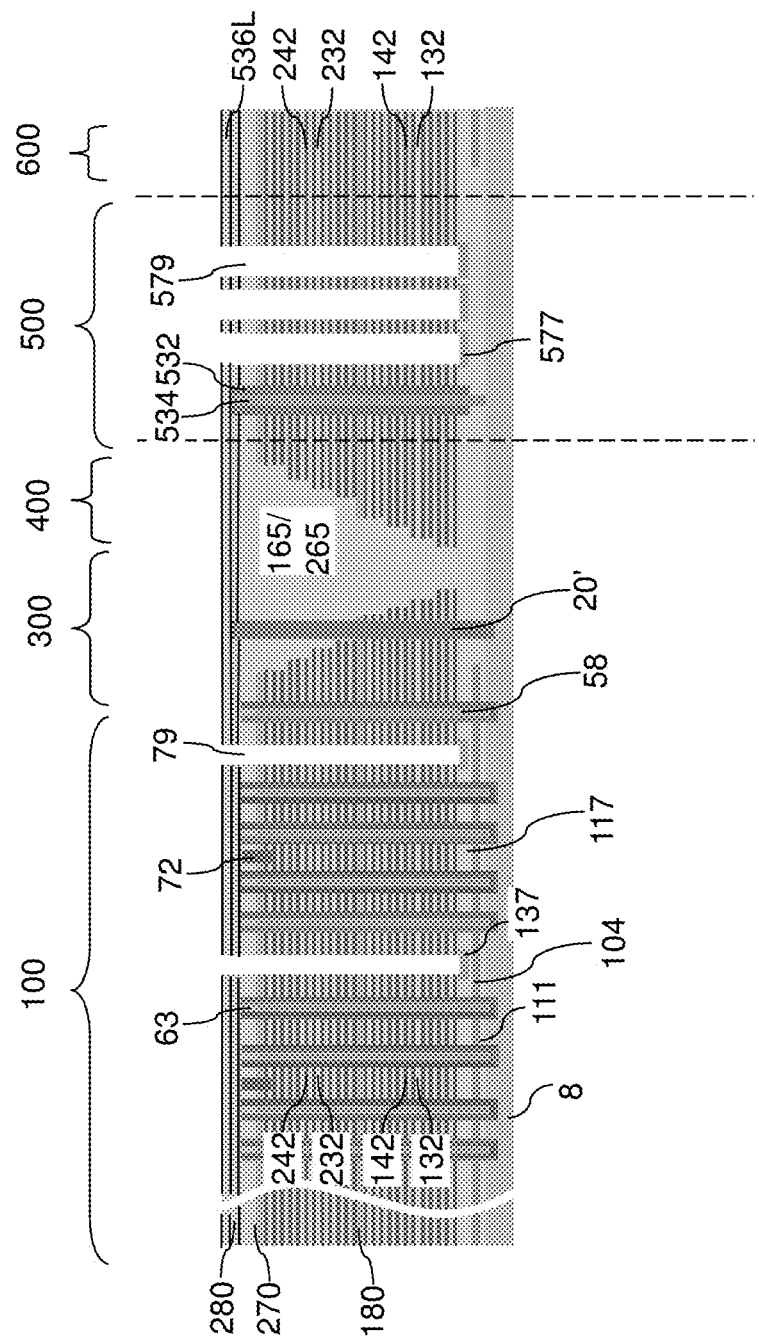
FIG. 38 is a vertical cross-sectional view of the second exemplary structure after formation of a first sacrificial dielectric layer, backside trenches, and crack stopper moat trenches according to an embodiment of the present disclosure.

Referring to FIG. 38, a first sacrificial dielectric layer 536L can be deposited over the first contact-level dielectric layer 280. The first sacrificial dielectric layer 536L includes a dielectric material such as undoped silicate glass or a doped silicate glass, and can be formed by a conformal or non-conformal deposition process. For example, the first sacrificial dielectric layer 536L can include undoped silicate glass and can have a thickness in a range from 100 nm to 600 nm, although lesser and greater thicknesses can also be used.

A photoresist layer (not shown) can be applied over the first sacrificial dielectric layer 536L, and can be lithographically patterned to form elongated openings in the memory array region 100 and at least one moat opening that encircles the guard ring trench 569 within the edge seal region 500. The pattern in the photoresist layer can be transferred through the first sacrificial dielectric layer 536L, the first contact-level dielectric layer 280, each inner alternating stack {(132, 142), (232, 242)} located in the memory array regions 100 and the staircase regions 300, and the outer alternating stack {(132, 142), (232, 242)} located in the edge seal region 500, the kerf region 600, and the edge-side staircase region 400.

Backside trenches 79 extending to the array region sacrificial etch stop structures 137 can be formed through each inner alternating stack {(132, 142), (232, 242)} within the memory array regions 100. At least one moat trench, which is herein referred to as at least one crack stopper moat trench 579, can be formed through the outer alternating stack {(132, 142), (232, 242)} within the edge seal region 500. Each crack stopper moat trench 579 can be subsequently used to protect the inside of the semiconductor die from moisture and impurity ingress in case of any crack in outer portions of the semiconductor die. The at least one crack stopper moat trench 579 can include a plurality of crack stopper moat trenches 579 that encircles the guard ring trench 569. Each of the at least one crack stopper moat trench 579 can be formed on a top surface of a respective edge seal region sacrificial etch stop structure 577.

Figure 39:
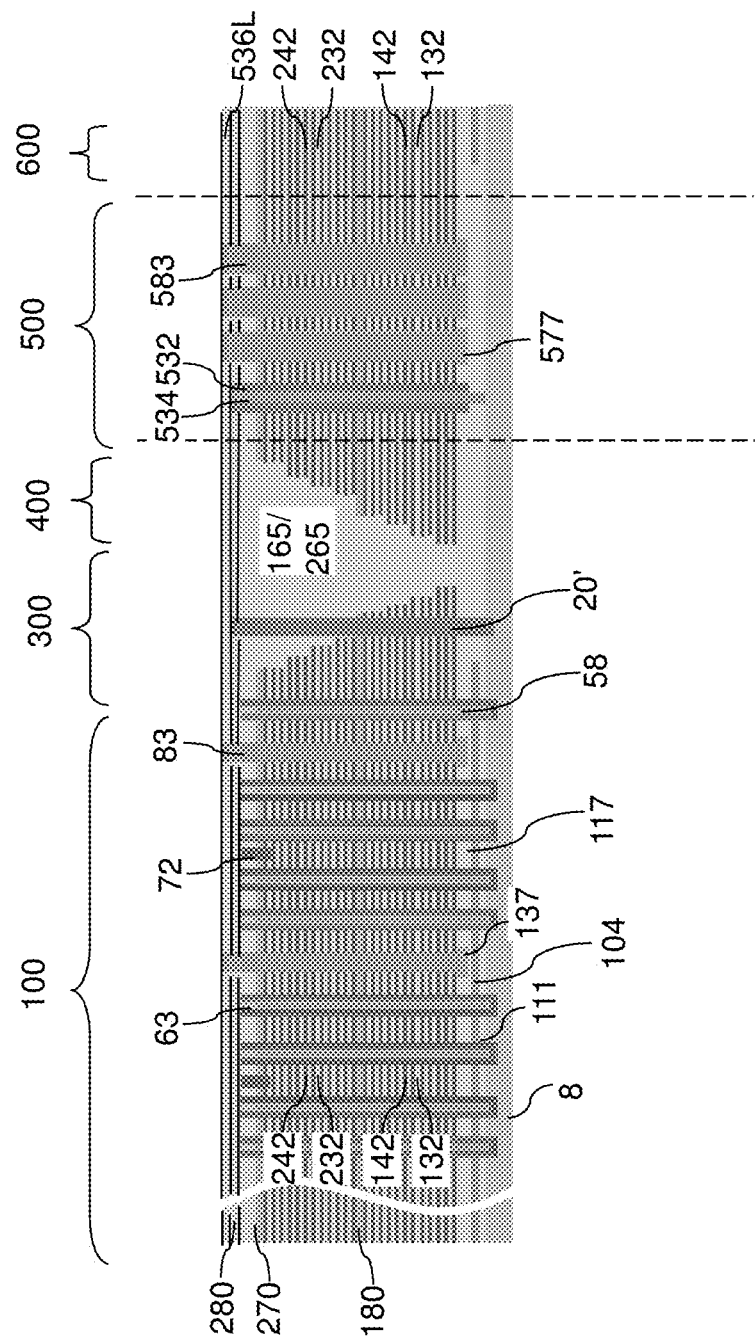
FIG. 39 is a vertical cross-sectional view of the second exemplary structure after formation of temporary backside trench fill structures and temporary moat trench fill structures according to an embodiment of the present disclosure.

Referring to FIG. 39, a temporary fill material that can be subsequently removed selective to the materials of the insulating layers (132, 232) and the sacrificial material layers (142, 242) can be deposited in the backside trenches 79 and the at least one crack stopper moat trenche 579. For example, the temporary fill material can include a semiconductor material such as amorphous silicon, polysilicon, or a silicon-germanium alloy. Excess portions of the temporary fill material can be removed from above the first sacrificial dielectric layer 536L. Temporary backside trench fill structures 83 are formed in the backside trenches, and temporary moat trench fill structures 583 are formed in each crack stopper moat trench 579.

Figure 40:
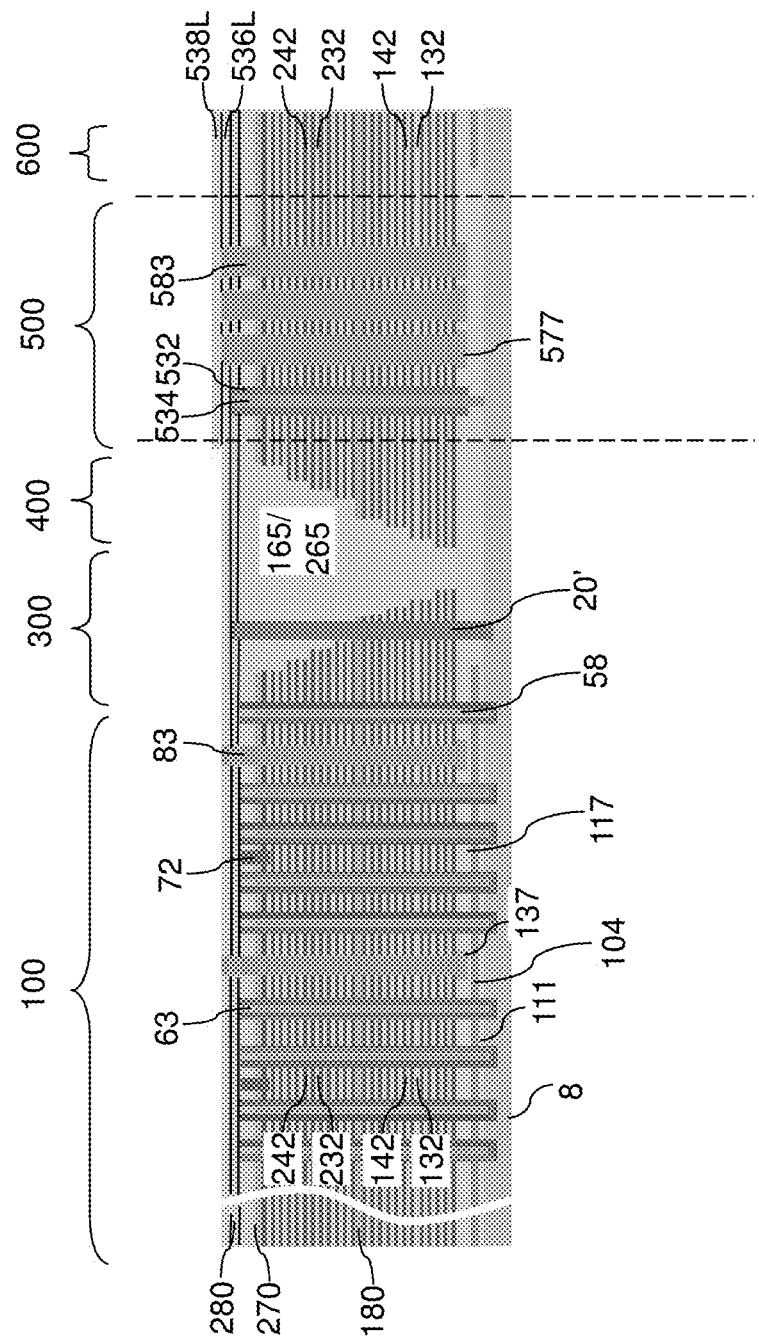
FIG. 40 is a vertical cross-sectional view of the second exemplary structure after formation of a second sacrificial dielectric layer according to an embodiment of the present disclosure.

Referring to FIG. 40, a second sacrificial dielectric layer 538L can be formed over the first sacrificial dielectric layer 536L. The second sacrificial dielectric layer 538L includes a dielectric material such as undoped silicate glass or a doped silicate glass, and can be formed by a conformal or non-conformal deposition process. For example, the second sacrificial dielectric layer 538L can include undoped silicate glass and can have a thickness in a range from 100 nm to 600 nm, although lesser and greater thicknesses can also be used.

Portions of the second sacrificial dielectric layer 538L can be removed from the memory array regions 100, the staircase regions 300, and the edge-side staircase region 400. For example, a photoresist layer (not shown) can be applied over the first exemplary structure, and can be lithographically patterned to cover the edge seal region 500 and the kerf region 600, and unmasked portions of the second sacrificial dielectric layer 538L can be removed by an etch process, which may include an isotropic etch process or an anisotropic etch process.

Figure 41:
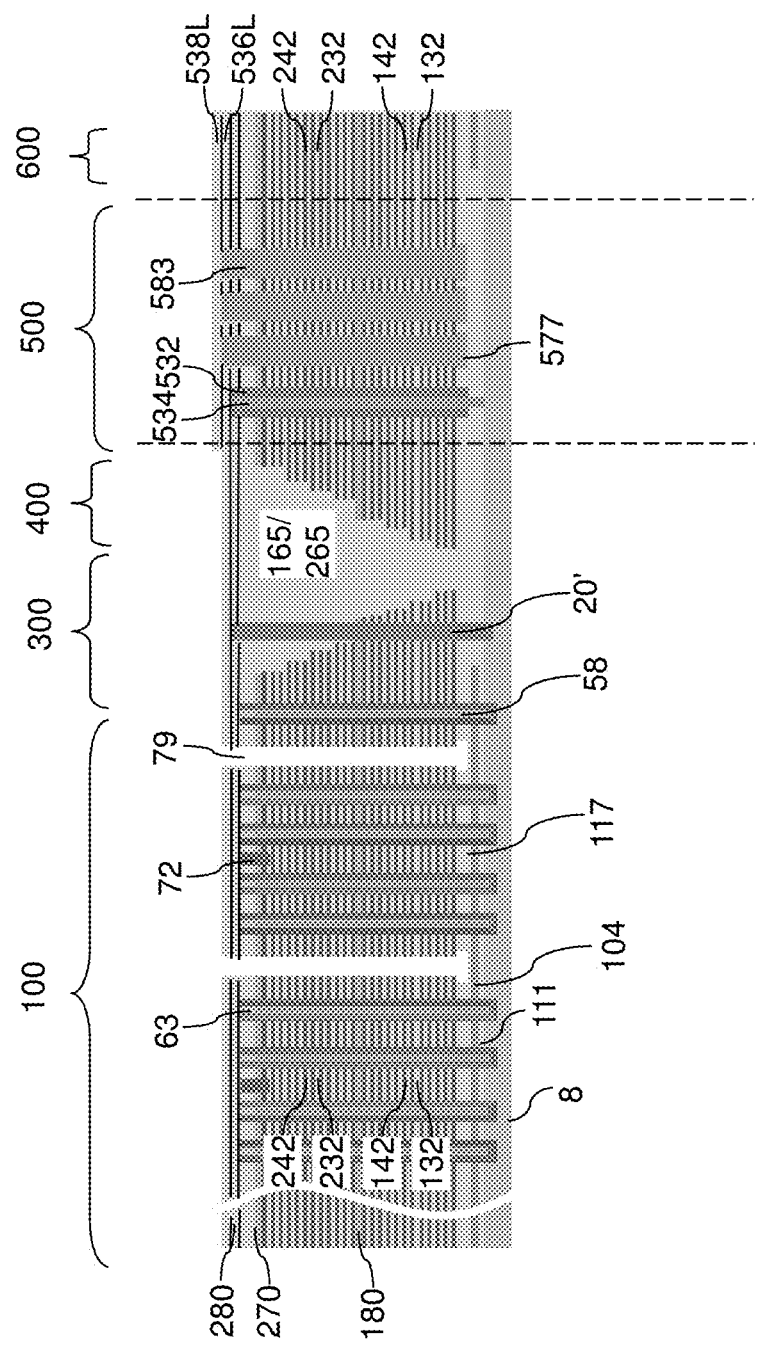
FIG. 41 is a vertical cross-sectional view of the second exemplary structure after removal of the temporary backside trench fill structures according to an embodiment of the present disclosure.

Referring to FIG. 41, the temporary backside trench fill structures 83 can be removed selective to the insulating layers (132, 232), the sacrificial material layers (142, 242), and the first sacrificial dielectric layer 536L using a selective etch process. For example, if the temporary backside trench fill structures 83 include amorphous silicon, the sacrificial backside trench fill structures 81 can be removed by a wet etch process using hot trimethyl-2 hydroxyethyl ammonium hydroxide ("hot TMY") or tetramethyl ammonium hydroxide (TMAH). A backside trench 79 including a respective void is provided within each volume from which a temporary backside trench fill structure 83 is removed. Subsequently, the array region sacrificial etch stop structures 137 can be subsequently removed. In one embodiment, the temporary backside trench fill structures 83 and the array region sacrificial etch stop structures 137 include a respective semiconductor material, and the array region sacrificial etch stop structures 137 can be removed collaterally during removal of the temporary backside trench fill structures 83.

Figure 42:
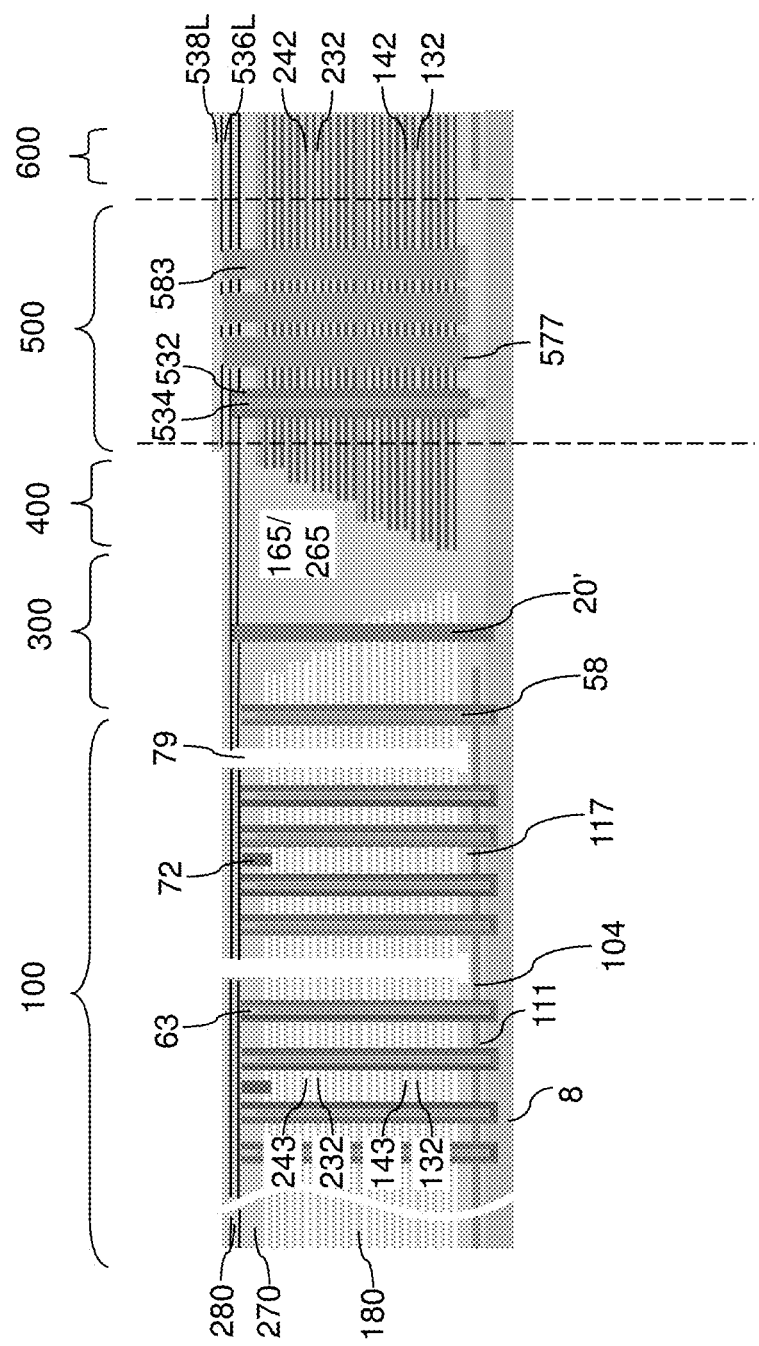
FIG. 42 is a vertical cross-section of the second exemplary structure after formation of backside recesses according to an embodiment of the present disclosure.

Referring to FIG. 42, the processing steps of FIGS. 22A and 22B can be performed to etch the sacrificial material layers (142, 242) selective to the insulating layers (132, 232) of each inner alternating stack {(132, 142), (232, 242)}. Backside recesses (143, 243) are formed in volumes from which the sacrificial material layers (142, 242) of each inner alternating stack {(132, 142), (232, 242)} are removed. The backside recesses (143, 243) include first backside recesses 143 that are formed in volumes from which the first-tier sacrificial material layers 142 of each inner alternating stack {(132, 142), (232, 242)} are removed, and second backside recesses 243 that are formed in volumes from which the second-tier sacrificial material layers 242 of each inner alternating stack {(132, 142), (232, 242)} are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232) within an inner alternating stack {(132, 142), (232, 242)}. In one embodiment, each of the backside recesses (143, 243) can have a uniform height throughout. The sacrificial material layers (142, 242) of the outer alternating stack {(132, 142), (232, 242)} are protected by the retro-stepped dielectric material portions (165, 265), and thus, remain intact during formation of the backside recesses (143, 243).

Figure 43:
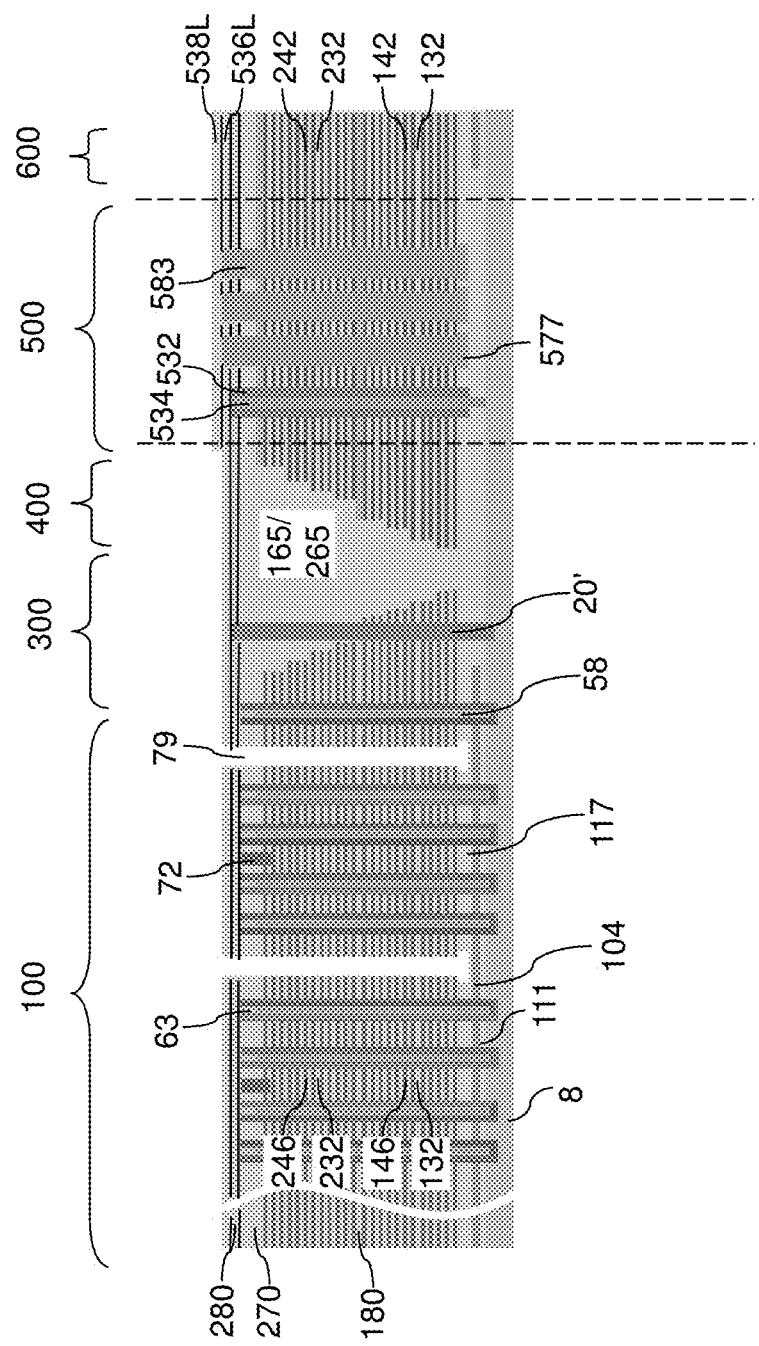
FIG. 43 is a vertical cross-section of the second exemplary structure after formation of electrically conductive layers according to an embodiment of the present disclosure.

Referring to FIG. 43, the processing steps of FIGS. 23A and 23B can be performed to optionally form a backside blocking dielectric layer (not shown) and electrically conductive layers (146, 246) in each inner alternating stack within the memory array regions 100 and the staircase regions 300. The electrically conductive layers (146, 246) include first electrically conductive layers 146 that are formed within the first backside recesses 143 and second electrically conductive layers 246 that are formed within the second backside recesses 243.

Figure 44:
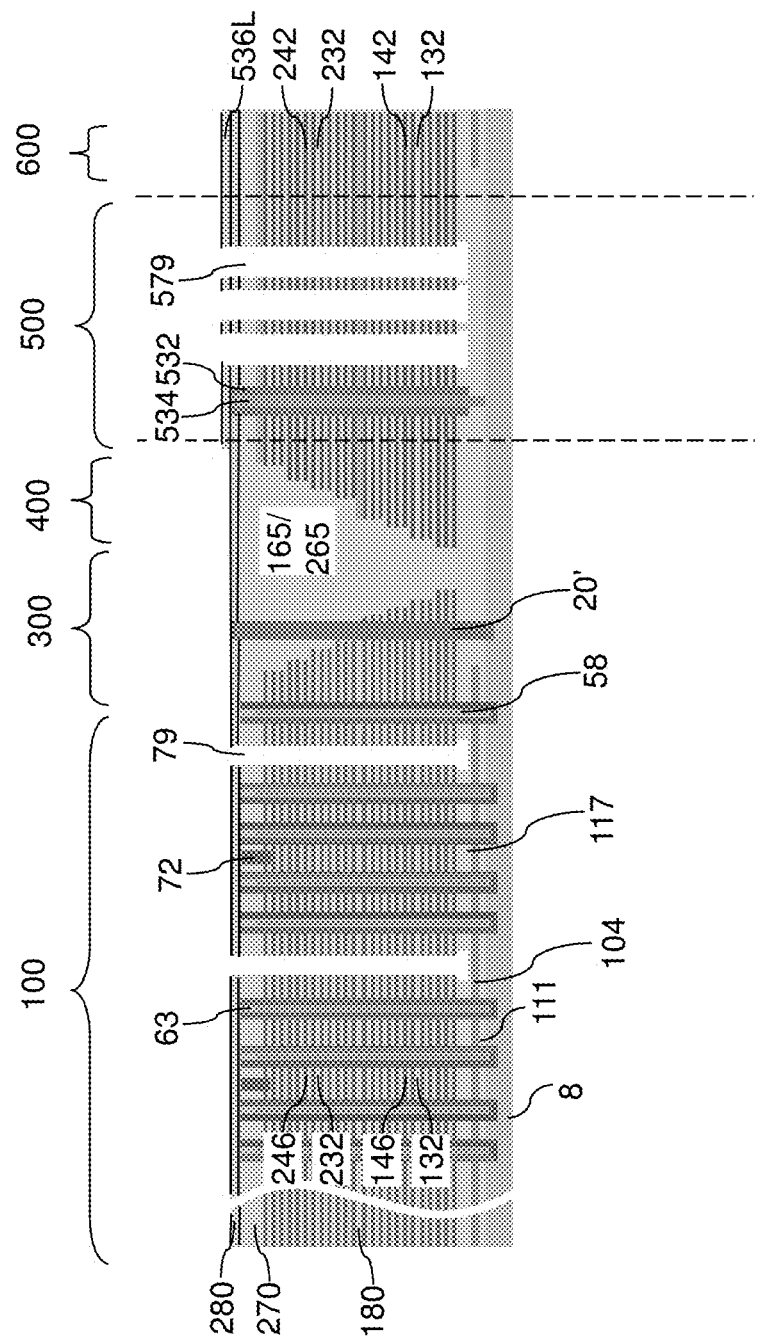
FIG. 44 is a vertical cross-section of the second exemplary structure after removal of temporary moat trench fill structures according to an embodiment of the present disclosure.

Referring to FIG. 44, an anisotropic etch process can be performed to etch the first sacrificial dielectric layer 536L in the memory array regions 100, the staircase regions 300, and the edge-side staircase region 400, and to etch the second sacrificial dielectric layer 538L in the edge seal region 500 and the kerf region 600. In one embodiment, the second sacrificial dielectric layer 538L can have about the same thickness as the first sacrificial dielectric layer 536L, and the first sacrificial dielectric layer 536L can be completely removed in the memory array regions 100, the staircase regions 300, and the edge-side staircase region 400, while the first sacrificial dielectric layer 536L remains in the edge seal region 500 and the kerf region 600. Top surfaces of the temporary moat trench fill structures 583 can be physically exposed in the edge seal region 500.

An etch process that etches the material of the temporary moat trench fill structures 583 selective to the materials of the insulating layers (132, 232), the sacrificial material layers (142, 242), and the electrically conductive layers (146, 246) can be performed. For example, if the temporary moat trench fill structures 583 include amorphous silicon, a wet etch process using hot trimethyl-2 hydroxyethyl ammonium hydroxide ("hot TMY") or tetramethyl ammonium hydroxide (TMAH) can be performed to remove the temporary moat trench fill structures 583. The edge seal region sacrificial etch stop structures 577 can be subsequently removed. In one embodiment, the edge seal region sacrificial etch stop structures 577 include a semiconductor material such as amorphous silicon, and is collaterally removed during removal of the temporary moat trench fill structures 583. A crack stopper moat trench 579 is provided within each volume from which a temporary moat trench fill structure 583 and an underlying edge seal region sacrificial etch stop structure 577 is removed.

Figure 45:
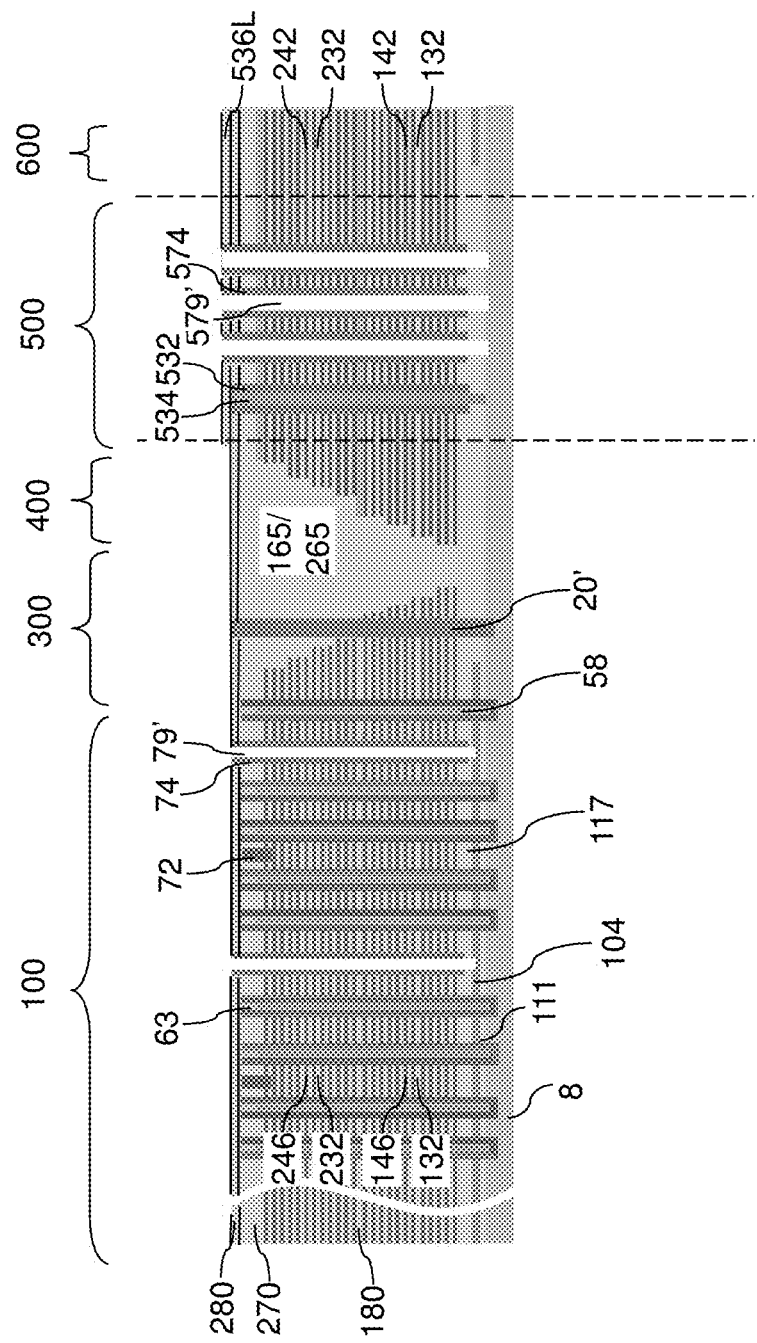
FIG. 45 is a vertical cross-section of the second exemplary structure after formation of dielectric spacers according to an embodiment of the present disclosure.

Referring to FIG. 45, a conformal spacer material layer can be deposited in the backside trenches 79 and the crack stopper moat trenches 579. The conformal spacer material layer includes a material that is different from the material of the source-level sacrificial layer 104. For example, the conformal spacer material layer can include silicon nitride. An anisotropic etch process is performed to remove horizontal portions of the conformal spacer material layer. Remaining portions of the conformal spacer material layer constitute dielectric spacers. Each remaining vertical portion of the conformal spacer material layer in the backside trenches 79 constitutes a backside trench spacer 74, and each remaining vertical portion of the conformal spacer material layer in the at least one crack stopper moat trench 579 constitutes a crack stopper trench spacer 574. The lateral thickness of each backside trench spacer 74 and each crack stopper trench spacer 574 can be in a range from 10 nm to 100 nm, although lesser and greater thicknesses can also be used. Each crack stopper trench spacer 574 comprises an inner dielectric spacer and an outer dielectric spacer that are laterally spaced apart. The anisotropic etch process can be continued until each backside cavity 79' located inside the backside trench spacers 74 vertically extend to a top surface of the source-level sacrificial layer 104 and each moat trench cavity 579' located inside the crack stopper trench spacers 574 vertically extend to a top surface of the semiconductor substrate 8.

Figure 46:
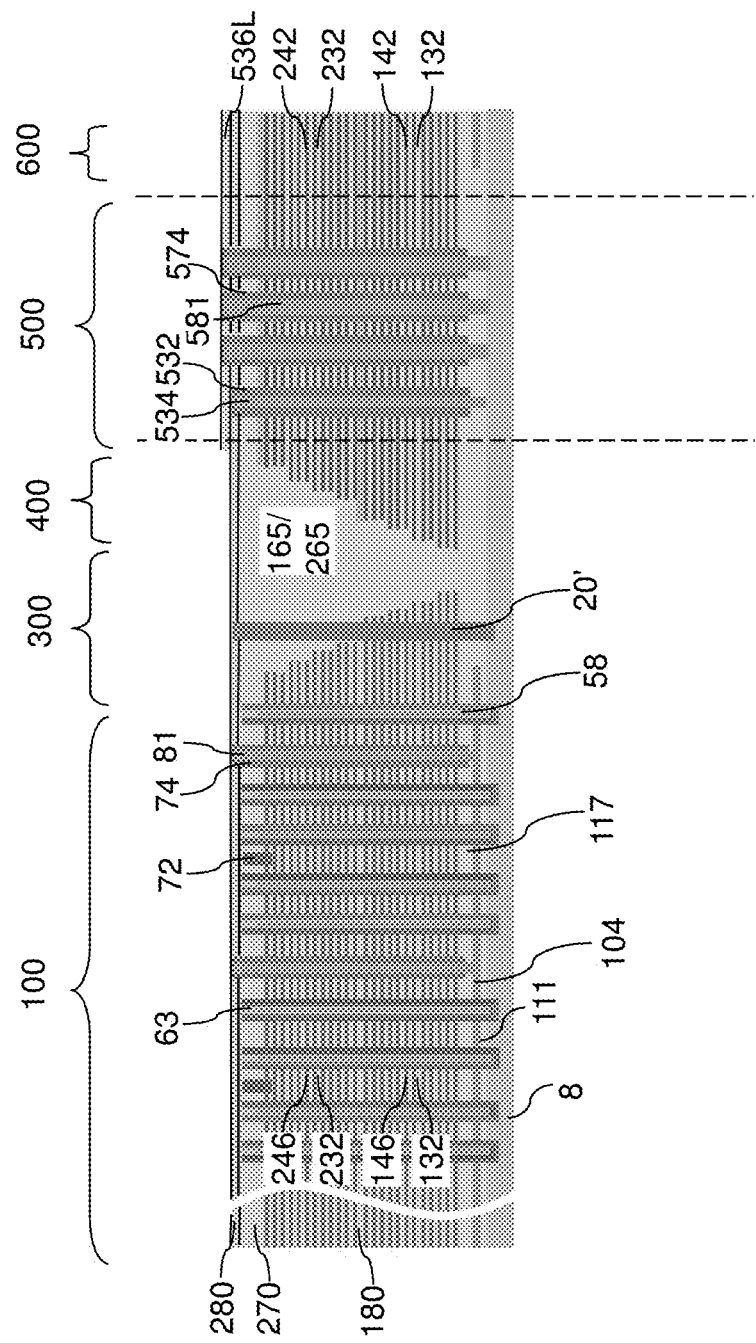
FIG. 46 is a vertical cross-sectional view of the second exemplary structure after formation of sacrificial backside trench fill structures and sacrificial moat trench fill structures according to an embodiment of the present disclosure.

Referring to FIG. 46, a sacrificial fill material can be deposited in the backside cavities 79' and each moat trench cavity 579'. Excess portions of the sacrificial fill material can be removed from above the first contact-level dielectric layer 280 or from above the first sacrificial dielectric layer 536L by a planarization process such as a recess etch process. Each remaining portion of the sacrificial fill material in the backside cavities 79' constitutes a sacrificial backside trench fill structure 81, and each remaining portion of the sacrificial fill material in the at least one moat trench cavity 579' constitutes a sacrificial moat trench fill structure 581. The sacrificial backside trench fill structures 81 and the at least one sacrificial moat trench fill structure 581 can include a sacrificial semiconductor material, which can be, for example, amorphous silicon, polysilicon, or a silicon-germanium alloy.

Figure 47:
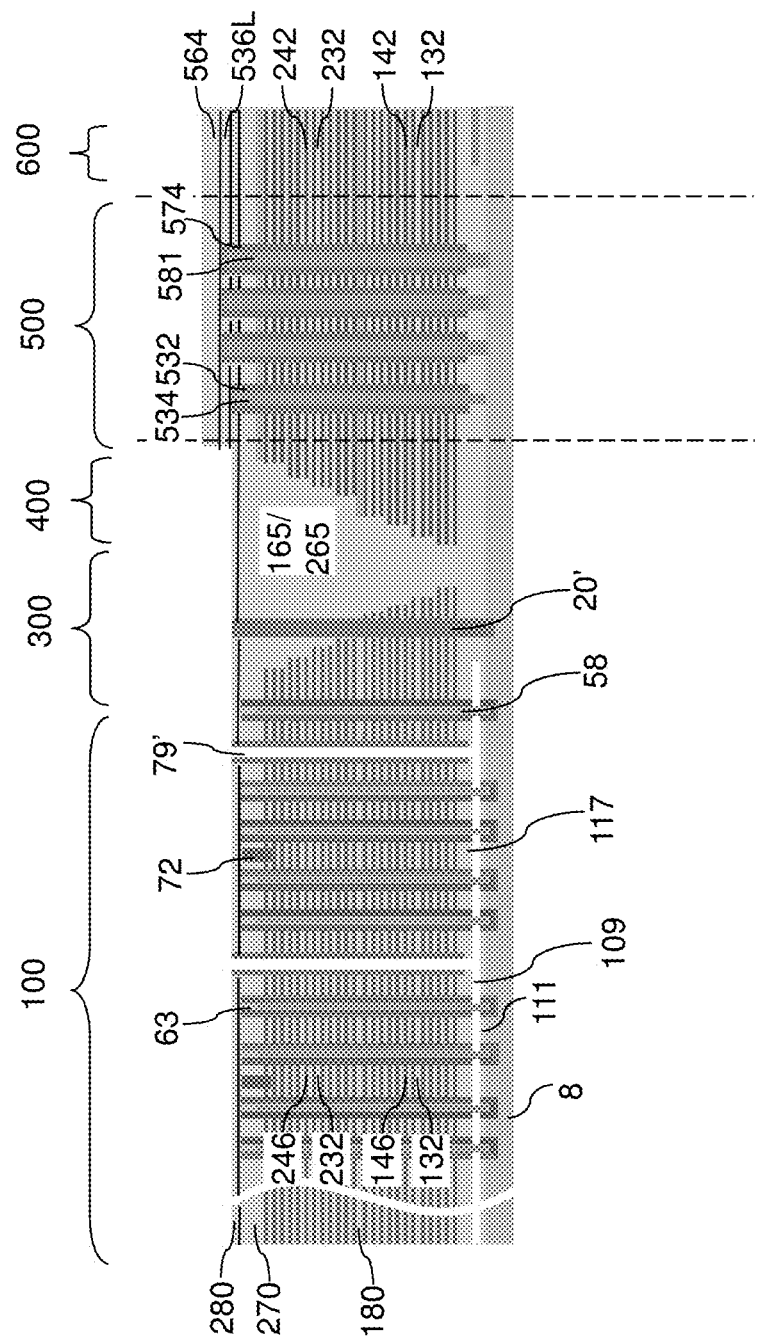
FIG. 47 is a vertical cross-sectional view of the second exemplary structure after formation of a sacrificial dielectric cover layer and removal of the sacrificial backside trench fill structure and a source-level sacrificial layer according to an embodiment of the present disclosure.

Referring to FIG. 47, a sacrificial dielectric cover layer 564 can be formed over the at least one sacrificial moat trench fill structure 581 in the edge seal region 500. For example, a dielectric material such as a silicon oxide layer can be deposited over the at least one sacrificial moat trench fill structure 581, and can be subsequently patterned, for example, by etching the portion of the deposited dielectric material from the areas of the memory array regions 100, the staircase regions 300, and the edge-side staircase region 400.

Subsequently, an isotopic etch process can be performed to remove the sacrificial backside trench fill structures 81 and the source-level sacrificial layer 104. For example, the sacrificial backside trench fill structures 81 and the source-level sacrificial layer 104 can include a semiconductor material such as amorphous silicon, and a wet etch process using hot trimethyl-2 hydroxyethyl ammonium hydroxide ("hot TMY") or tetramethyl ammonium hydroxide (TMAH) can be performed to remove the sacrificial backside trench fill structures 81 and the source-level sacrificial layer 104. Backside cavities 79' are formed in volumes from which the sacrificial backside trench fill structures 81 are removed. A source cavity 109 can be formed in the volume from which the source-level sacrificial layer 104 is removed. Subsequently, the processing steps of FIG. 19 can be performed to remove cylindrical portions of the memory films 50 at the level of the source cavity 109 and to physically expose cylindrical outer surfaces of the vertical semiconductor channels 60 of the memory opening fill structures 58 around the source cavity 109.

Figure 48:
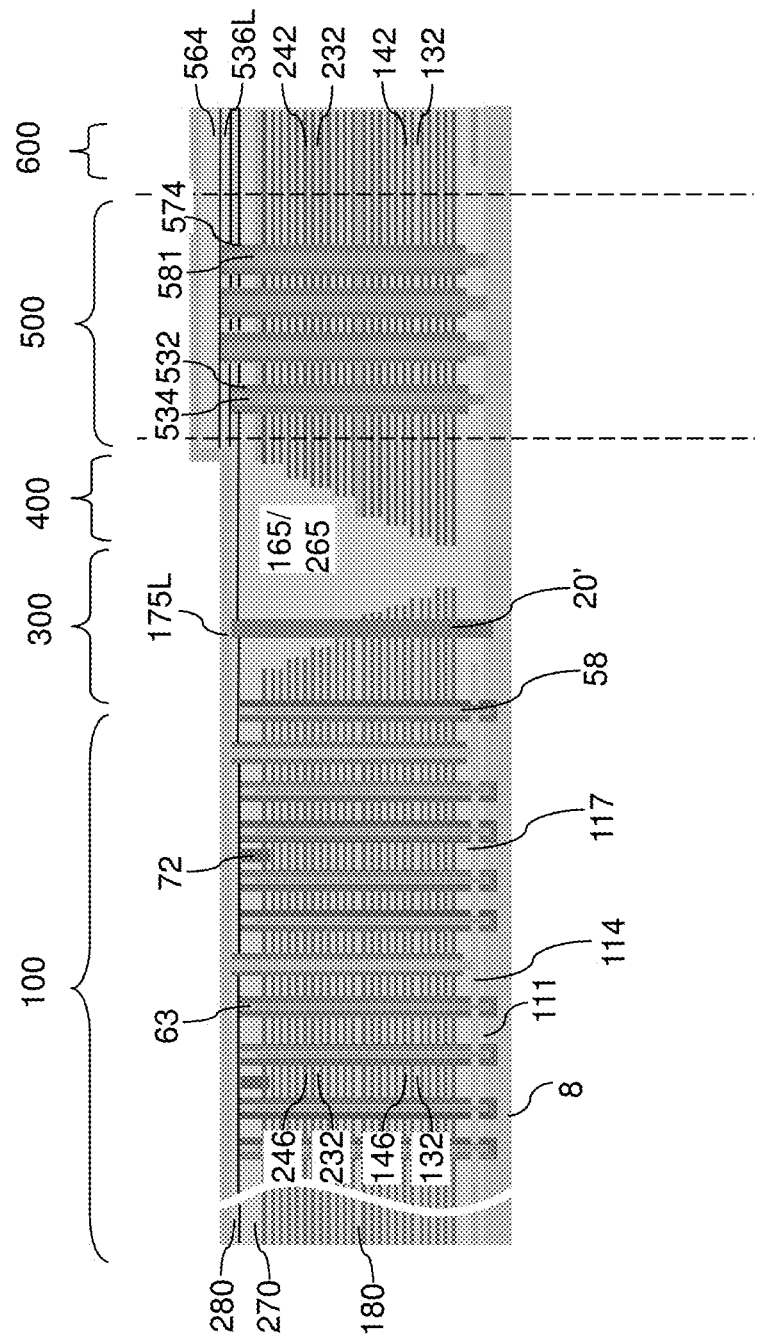
FIG. 48 is a vertical cross-sectional view of the second exemplary structure after deposition of a doped semiconductor material layer according to an embodiment of the present disclosure.

Referring to FIG. 48, a non-selective semiconductor deposition process can be performed to conformally deposit a doped semiconductor material layer having a doping of the second conductivity type. Dopants of the second conductivity type can be introduced into the deposited semiconductor material by in-situ doping. Atomic concentration of dopants of the second conductivity type can be in a range from $5.0 \times 10^{19}/cm^3$ to $2.0 \times 10^{21}/cm^3$, although lesser and greater atomic concentrations can also be used. form a source semiconductor layer 114. The portion of the doped semiconductor material that fills the source cavity 109 constitutes a source semiconductor layer 114. A doped semiconductor material layer 175L is present within the backside cavities 79' and over the first contact-level dielectric layer 280.

Figure 49:
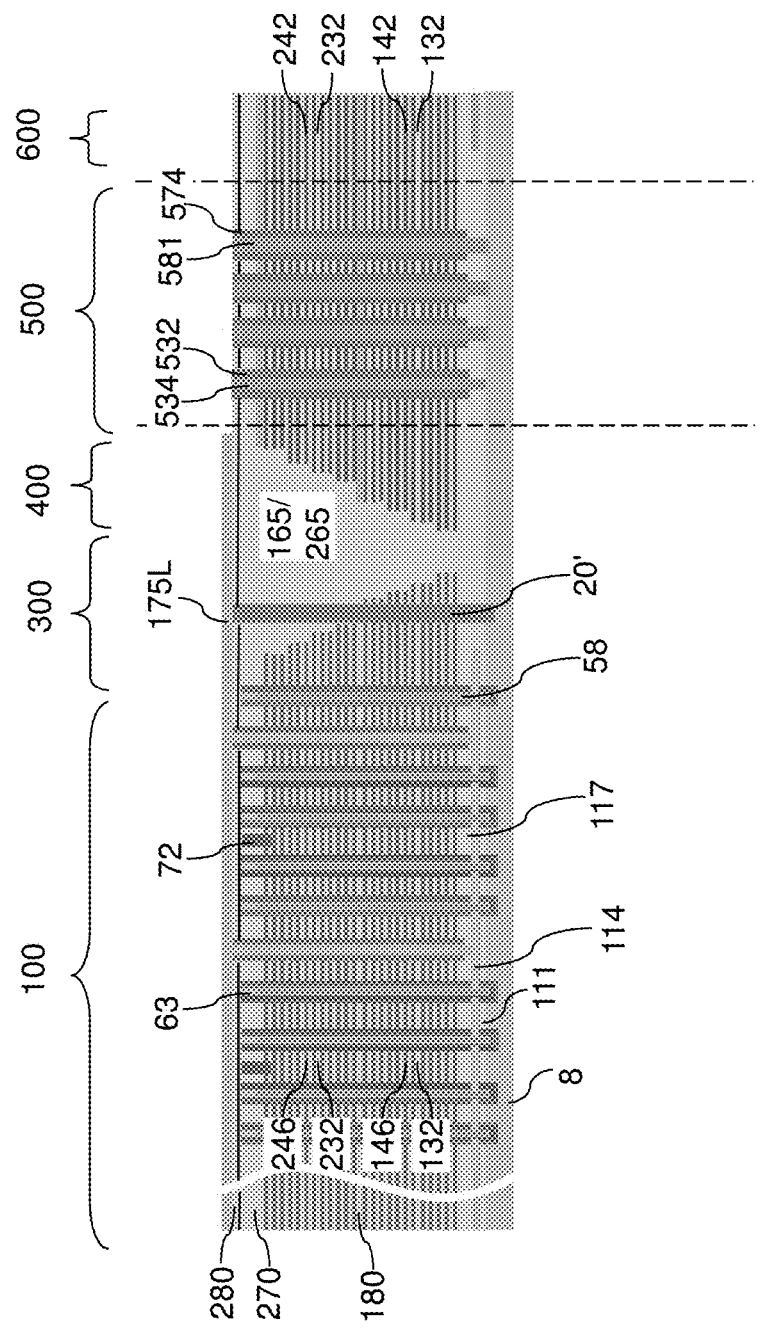
FIG. 49 is a vertical cross-sectional view of the second exemplary structure after removal of a portion of the doped semiconductor material layer, the sacrificial dielectric cover layer, and the first sacrificial dielectric layer according to an embodiment of the present disclosure.

Referring to FIG. 49, portions of the doped semiconductor material layer 175L, the sacrificial dielectric cover layer 564, and the first sacrificial dielectric layer 536L can be removed from the edge seal region 500 and the kerf region 600, for example, by covering the memory array regions 100, the staircase regions 300, and the edge-side staircase region 400 with a patterned photoresist layer (not shown), and by isotropically or anisotropically etching the materials of the doped semiconductor material layer 175L, the sacrificial dielectric cover layer 564, and the first sacrificial dielectric layer 536L. The patterned photoresist layer can be removed, for example, by ashing.

Figure 50:
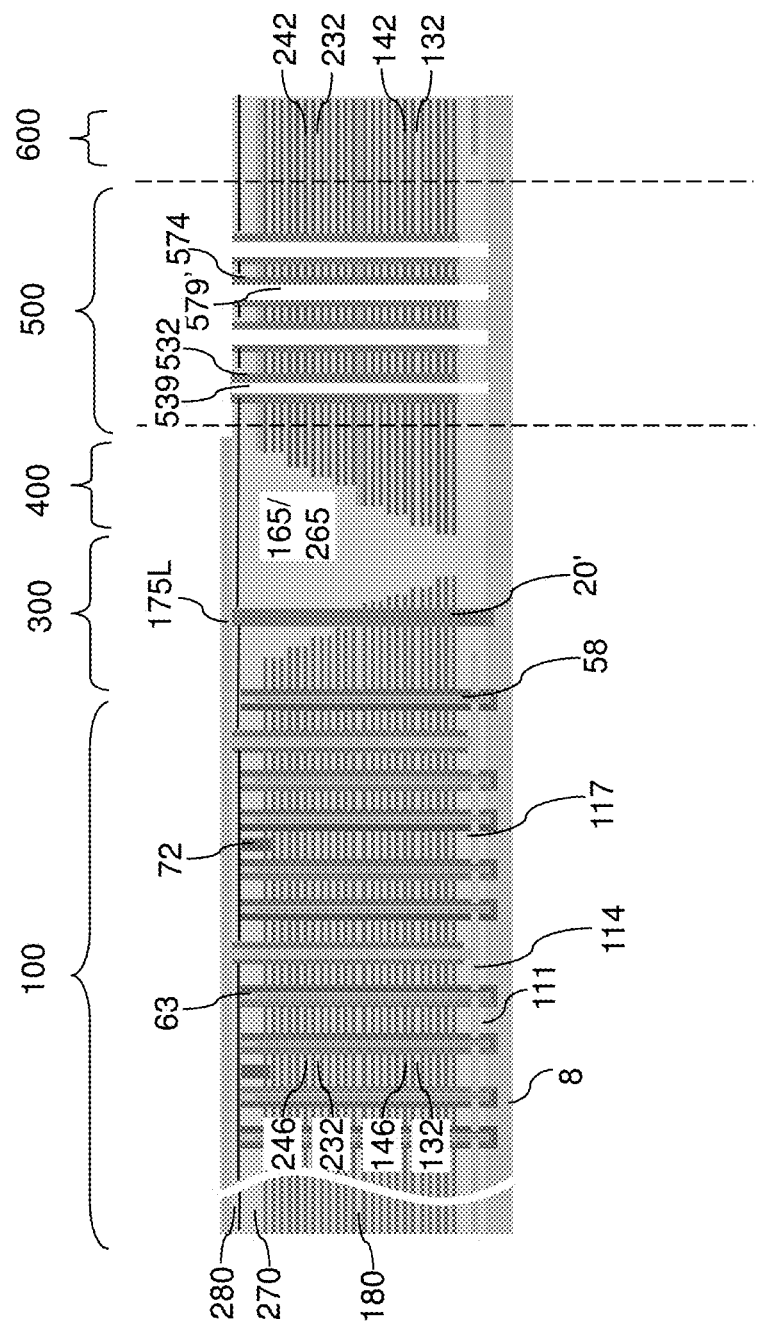
FIG. 50 is a vertical cross-sectional view of the second exemplary structure after removal of the sacrificial moat trench fill structures according to an embodiment of the present disclosure.

Referring to FIG. 50, the sacrificial moat trench fill structures 581 can be removed selective to the crack stopper trench spacers 574. For example, if the sacrificial moat trench fill structures 581 include undoped amorphous silicon, the sacrificial moat trench fill structures 581 can be removed selective to the doped semiconductor material layer 175L by a wet etch process using hot trimethyl-2 hydroxyethyl ammonium hydroxide ("hot TMY") or tetramethyl ammonium hydroxide (TMAH). Undoped amorphous silicon can be etched at a significantly high etch rate than undoped amorphous silicon in such wet etch processes. A moat trench cavity 579' is provided in each volume from which a sacrificial moat trench fill structure 581 is removed.

Figure 51:
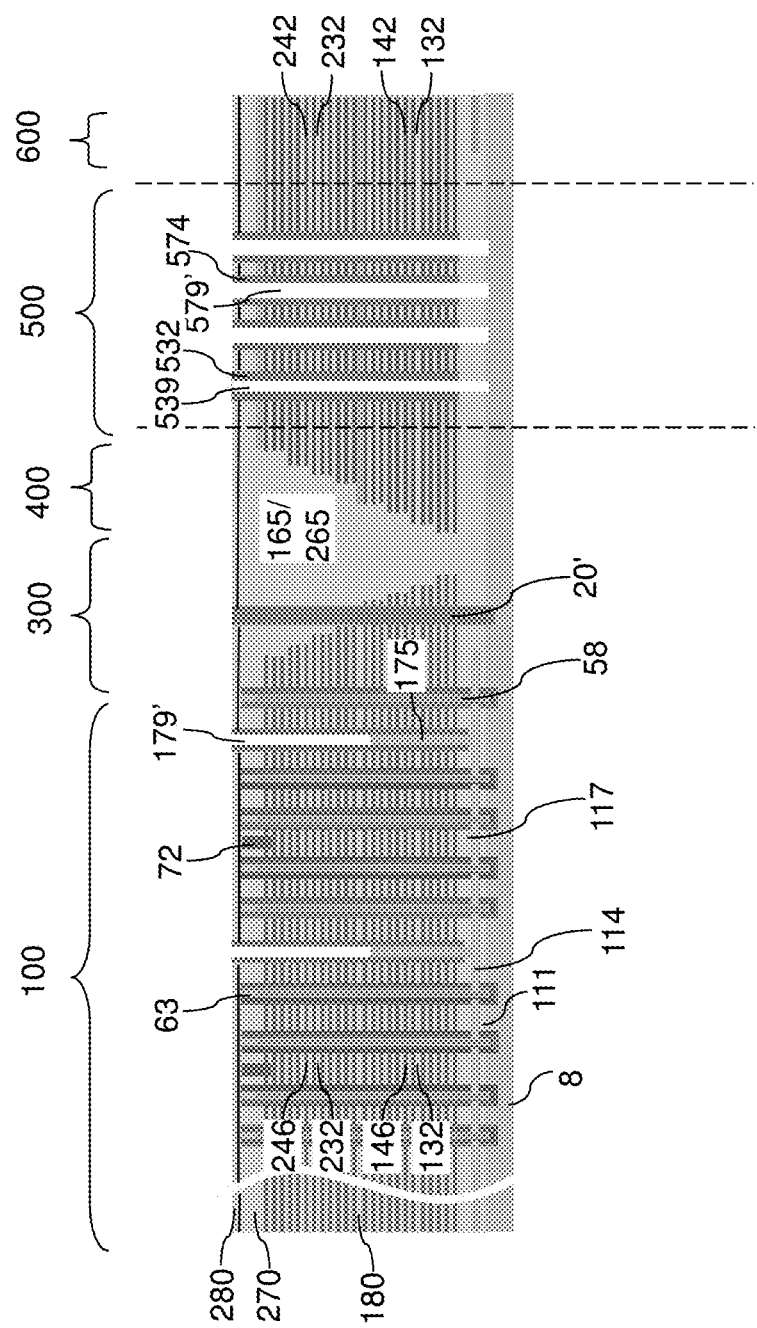
FIG. 51 is a vertical cross-sectional view of the second exemplary structure after vertically recessing the doped semiconductor material layer according to an embodiment of the present disclosure.

Referring to FIG. 51, the doped semiconductor material of the doped semiconductor material layer 175L can be etched from above the top surface of the first contact-level dielectric layer 280 and from an upper portion of the backside cavities 79'. Each remaining portion of the doped semiconductor material of the doped semiconductor material layer 175L located at a lower portion of a respective backside trench 79 is herein referred to as a lower source contact portion 175. An upper portion of each trench cavity 79' can be void, and is herein referred to as an upper backside cavity 179'.

Figure 52:
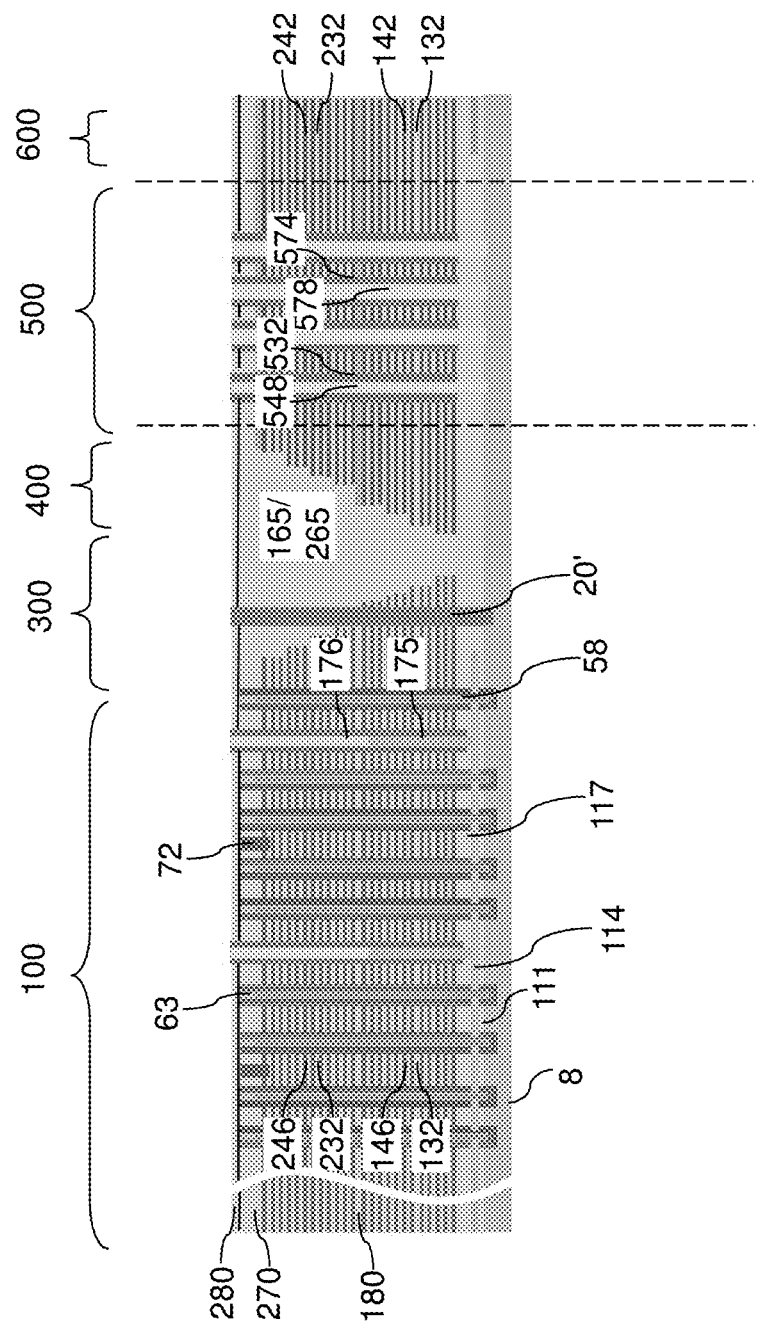
FIG. 52 is a vertical cross-sectional view of the second exemplary structure after formation of upper source contact via portions and metallic wall structures according to an embodiment of the present disclosure.

Referring to FIG. 52, at least one conductive material can be simultaneously deposited in the volumes of the upper backside cavity 179' and the moat trench cavities 579' by performing the processing steps of FIG. 27. The at least one conductive material can include a metallic liner material and a metallic fill material. The metallic liner material can include, for example, TiN, TaN, and/or WN. The metallic liner material can be conformally deposited with a thickness in a range from 6 nm to 100 nm, although lesser and greater thicknesses can also be used. The metallic fill material can fill remaining volumes of the upper backside cavity 179' and the moat trench cavities 579' that are not filled with the metallic liner material. For example, the metallic fill material can include tungsten, copper, aluminum, ruthenium, cobalt, molybdenum, another elemental metal, an intermetallic alloy thereof, or a combination thereof. Excess portions of the at least one metallic material can be removed from above the horizontal plane including the top surface of the first contact-level dielectric material layer 280 by a planarization process, which can use chemical mechanical planarization and/or a recess etch.

Each remaining portion of the at least one metallic material in each upper backside cavity 179' constitutes an upper source contact portion 176. Each contiguous stack of a lower source contact portion 175 and an upper source contact portion 176 constitutes a source contact via structure (175, 176). Each remaining portion of the at least one metallic material in the guard ring cavity 539 constitutes a guard ring metallic wall structure 548. Each remaining portion of the at least one metallic material in a crack stopper moat trench 579 constitutes a crack stop metallic wall structure 578. Each source contact via structure (175, 176) is formed through a first alternating stack of insulating layers (132, 232) and electrically conductive layers (146, 246), which is formed by replacement of sacrificial material layers (142, 242) in an inner alternating stack {(132, 142), (232, 242)}. The guard ring metallic wall structure 548 and each crack stop metallic wall structure 578 are formed through the outer alternating stack {(132, 142), (232, 242)}, which is also referred to as a second alternating stack {(132, 142), (232, 242)} henceforth. The at least one metallic wall structure (548, 578) that includes the guard ring metallic wall structure 548 and each crack stop metallic wall structure 578 is formed vertically through the second alternating stack {(132, 142), (232, 242)}. The at least one metallic wall structure (548, 578) divides the second alternating stack {(132, 142), (232, 242)} into multiple nested portions.

Figure 53:
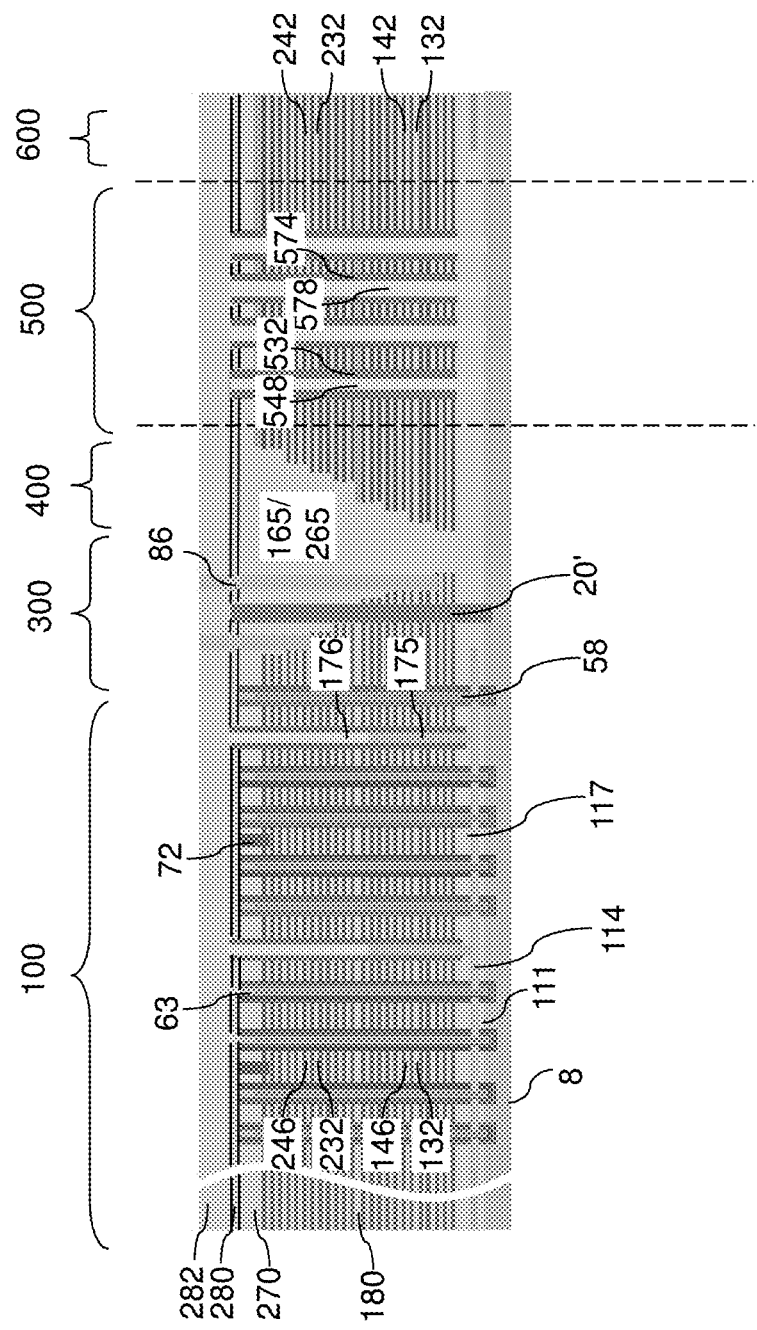
FIG. 53 is a vertical cross-sectional view of the second exemplary structure after formation of a second contact-level dielectric layer and staircase-region contact via structures according to an embodiment of the present disclosure.

Referring to FIG. 53, the processing steps of FIG. 28 can be performed to form a second contact-level dielectric layer 282 and staircase-region contact via structures 86.

Figure 54:
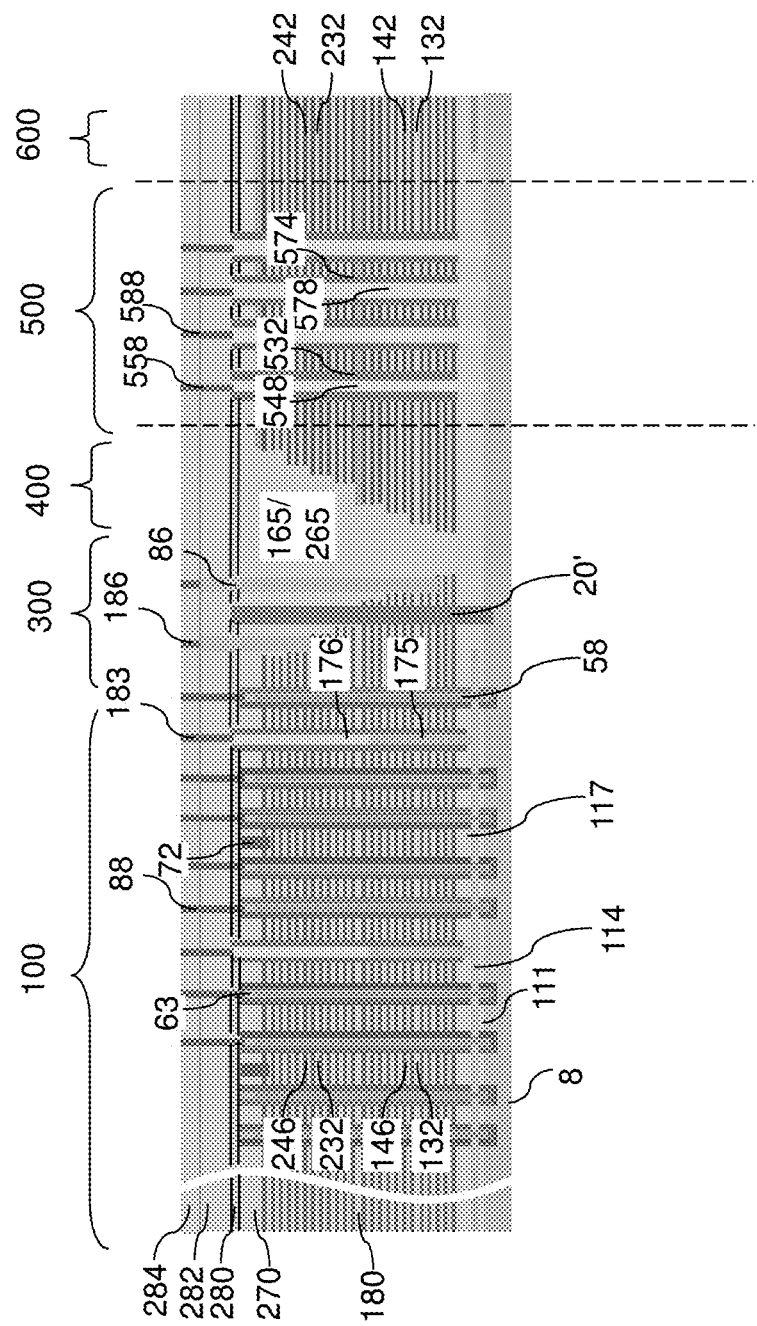
FIG. 54 is a vertical cross-sectional view of the second exemplary structure after formation of additional contact via structures according to embodiments of the present disclosure.

Referring to FIG. 54, the processing steps of FIG. 29 can be performed to form a third contact-level dielectric layer 284 and various conductive via structures, which can include, for example, drain contact via structures 88, the staircase-region connection via structures 186, the source connection via structures 183, the guard ring connection via structure 558, and the crack stop connection via structures 588.

Subsequently, the processing steps of FIG. 30 can be performed to provide a memory die including continuous metal barrier structures that encircle the memory array regions 100 and the staircase regions 300. Referring to FIGS. 30 and 54 collectively, one of the differences between the first exemplary structure and the second exemplary structure is that each metallic wall structure (548, 578) directly contacts the semiconductor substrate 8. At least one vertical stack 940 of metallic seal structures (548, 578, 588, 980, 988') is provided in the edge seal region 500. Each of the at least one vertical stack 940 of metallic seal structures (548, 578, 588, 980,988') comprises a respective subset (558, 588, 980) of the upper-level metal interconnect structures (86, 186, 88, 980, 183, 558, 588, 980) that contiguously extends between the respective metallic wall structure (548 or 578) and a respective memory-die bonding strip 988'. Each of the at least one memory-die bonding strip 988' laterally surrounds, and laterally encloses, the memory-die bonding pads 988. Each of the at least one vertical stack of metallic seal structures (548, 578, 588, 980, 988') comprises a respective memory-die bonding strip 988'.

The collection of all vertical stack 940 of metallic seal structures (548, 578, 588, 980, 988') and intervening material portions located between neighboring pairs of vertical stacks 940 is herein referred to as an edge seal assembly. The edge seal assembly comprises at least one vertical stack 940 of metallic seal structures (548, 578, 588, 980, 988'), which can be a plurality of vertical stacks 940 of metallic seal structures (548, 578, 588, 980, 988'). Each of the at least one vertical stack 940 of metallic seal structures (548, 578, 588, 980, 988') vertically extends contiguously from a top surface of the semiconductor substrate 8 to a bonding-side surface of the upper-level dielectric material layers 960, and comprises a respective one of the at least one metallic wall structure (548, 578).

In one embodiment, each of the at least one vertical stack 940 of metallic seal structures (548, 578, 588, 980, 988') comprises a respective subset of the lower metal interconnect structures 780 that contiguously extends between the respective metallic wall structure (548 or 578) and the semiconductor substrate 8. In one embodiment, the at least one vertical stack 940 of metallic seal structures (548, 578, 588, 980, 988') comprises a plurality of vertical stacks 940 of metallic seal structures (548, 578, 588, 980, 988'). Each of the plurality of vertical stacks 940 of metallic seal structures (548, 578, 588, 980, 988') laterally surrounds, or is laterally surrounded by, another vertical stack 940 among the plurality of vertical stacks of metallic seal structures (548, 578, 588, 980, 988').

Subsequently, the processing steps of FIG. 31 can be performed to provide a support die 800. The support die 800 can be bonded to the memory die 900 derived from the second exemplary structure by performing the processing steps of FIG. 32.

Referring to all drawings and according to various embodiments of the present disclosure, a three-dimensional memory device comprising a memory die 900 is provided, wherein the memory die 900 comprises: a first alternating stack (such as an inner alternating stack located in a memory array region 100 and a staircase region 300) of first insulating layers (132, 232) and electrically conductive layers (146, 246) located over a semiconductor substrate 8; memory stack structures 55 vertically extending through the first alternating stack {(132, 246), (232, 246)} and comprising vertical stacks of memory elements; a second alternating stack (such as an outer alternating stack located in the edge seal region 500) of second insulating layers (132, 232) and spacer dielectric layers (142, 242) that laterally surrounds the first alternating stack {(132, 246), (232, 246)} and is located over the semiconductor substrate 8; memory-die bonding pads 988 included in upper-level dielectric material layers 960 and located on a bonding-side surface of the memory die 900; and an edge seal assembly comprising at least one vertical stack 940 of metallic seal structures (780 if present, 548, 578, 588, 980, 988'), wherein each of the at least one vertical stack 940 of metallic seal structures (780 if present, 548, 578, 588, 980, 988') vertically extends contiguously from a top surface of the semiconductor substrate 8 to the bonding-side surface of the memory die 900 and comprises a respective metallic wall structure (548 or 578) that extends through the second alternating stack {(132, 242), (232, 242)} and laterally encloses the first alternating stack {(132, 142), (232, 242)}, wherein the second alternating stack {(132, 142), (232, 242)} comprises multiple nested portions divided by the respective metallic wall structure (548 or 578).

In one embodiment, each of the at least one vertical stack 940 of metallic seal structures (780 if present, 548, 578, 588, 980, 988') comprises a respective memory-die bonding strip 988' located at the bonding-side surface and laterally surrounds each of the memory-die bonding pads 988.

In one embodiment, the at least one vertical stack 940 of metallic seal structures (780 if present, 548, 578, 588, 980, 988') comprises a plurality of vertical stacks 940 of metallic seal structures (780 if present, 548, 578, 588, 980, 988'); and each of the plurality of vertical stacks 940 of metallic seal structures (780 if present, 548, 578, 588, 980, 988') laterally surrounds, or is laterally surrounded by, another vertical stack 940 among the plurality of vertical stacks of metallic seal structures (780 if present, 548, 578, 588, 980, 988').

In one embodiment, each of the at least one vertical stack 940 of metallic seal structures (780 if present, 548, 578, 588, 980, 988') comprises a respective set of at least one upper-level metal interconnect structure (588, 980) that contiguously extends between the respective metallic wall structure (548 or 578) and the respective memory-die bonding pad 988.

In one embodiment, the memory die 900 comprises at least one dielectric material layer (such as lower-level dielectric material layers 760) located between the semiconductor substrate 8 and the second alternating stack {(132, 242), (232, 242)}; and each of the at least one vertical stack 940 of metallic seal structures (780, 548, 578, 588, 980, 988') comprises a respective set of at least one lower metal interconnect structure 780 that contiguously extends between the respective metallic wall structure (548 or 578) and the semiconductor substrate 8 through the at least one dielectric material layer (such as lower-level dielectric material layers 760).

In one embodiment, each metallic wall structure (548 or 578) directly contacts a surface of the semiconductor substrate 8.

In one embodiment, each metallic wall structure (548 or 578) within the at least one vertical stack 940 contacts, and laterally surrounds, a respective inner dielectric spacer (an inner dielectric spacer of a guard ring dielectric spacer 532 or a crack stopper trench spacer 574), and contacts, and is laterally surrounded by, a respective outer dielectric spacer (an outer dielectric spacer of a guard ring dielectric spacer 532 or a crack stopper trench spacer 574) having a same composition and a same thickness as the respective inner dielectric spacer.

In one embodiment, each of the memory stack structures 55 comprises a memory film 50 and a vertical semiconductor channel 60, the memory film 50 including a respective vertical stack of memory elements; and each metallic wall structure (548 or 578) within the at least one vertical stack 940 protrudes above a horizontal plane including top surfaces of the memory stack structures 55 (such as the horizontal plane including the bottom surface of the first contact-level dielectric layer 280).

In one embodiment, the first alternating stack {(132, 146), (232, 246)} comprises a first staircase region (such as a portion located inside the area of a staircase region 300) in which a lateral extent of layers within the first alternating stack {(132, 146), (232, 246)} decreases stepwise with an increase in a vertical distance from the semiconductor substrate 8; and the second alternating stack {(132, 142), (232, 242)} comprises a second staircase region (such as a portion located inside the area of the edge-side staircase region 400) in which a lateral extent of layers within the second alternating stack {(132, 142), (232, 242)} decreases stepwise with an increase in the vertical distance from the semiconductor substrate 8.

In one embodiment, the memory die 900 comprises a retro-stepped dielectric material portion (165 and/or 265) that laterally encloses, and contacts, the first alternating stack {(132, 146), (232, 246)} and is laterally enclosed by, and contacts, the second alternating stack {(132, 142), (232, 242)}.

In one embodiment, the memory die 900 has a rectangular horizontal cross-sectional shape bounded by four straight sidewalls; and each respective metallic wall structure (548 or 578) comprises four metallic wall segments that are parallel to a respective one of the four straight sidewalls.

In one embodiment, a total number of the first insulating layers (132, 232) in the first alternating stack {(132, 146), (232, 246)} is the same as a total number of the second insulating layers (132, 232) in the second alternating stack {(132, 142), (232, 242)}; and each first insulating layer in the first alternating stack {(132, 146), (232, 246)} is vertically spaced from the semiconductor substrate 8 by a same vertical distance as a respective one of the second insulating layers (132, 232) in the second alternating stack {(132, 142), (232, 242)} is from the semiconductor substrate 8.

In one embodiment, the first insulating layers (132, 232) and the second insulating layers (132, 232) comprise silicon oxide; the electrically conductive layers (146, 246) comprise at least one metallic material; and the spacer dielectric layers (142, 242) comprise silicon nitride.

In one embodiment, the three-dimensional memory device further comprises a support die 800 bonded to the memory die 900, wherein the support die 800 comprises: a peripheral circuit configured to control operation of the vertical stacks of memory elements; support-die bonding pads 888 that are bonded to the memory-die bonding pads 988; and support-die metal interconnect structures 880 electrically connecting nodes of the peripheral circuit to a respective one of the support-die bonding pads 888 and included in support-die dielectric material layers 860.

The various embodiments of the present disclosure provide deformation resistance to the vertical stack 940 of metallic seal structures (780, 548, 578, 588, 980, 988') by forming the vertical stacks 940 in the second alternating stack (such as an outer alternating stack located in the edge seal region 500) of second insulating layers (132, 232) and spacer dielectric layers (142, 242), which is more deformation resistant than a continuous silicon oxide portion.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising a memory die, wherein the memory die comprises:
    a first alternating stack of first insulating layers and electrically conductive layers located over a semiconductor substrate;
    memory stack structures vertically extending through the first alternating stack and comprising vertical stacks of memory elements;
    a second alternating stack of second insulating layers and spacer dielectric layers that laterally surrounds the first alternating stack and is located over the semiconductor substrate;
    memory-die bonding pads included in upper-level dielectric material layers and located on a bonding-side surface of the memory die; and
    an edge seal assembly comprising at least one vertical stack of metallic seal structures, wherein each of the at least one vertical stack of metallic seal structures vertically extends from a top surface of the semiconductor substrate to the bonding-side surface of the memory die and comprises a respective metallic wall structure that extends through the second alternating stack and laterally encloses the first alternating stack.

2. The three-dimensional memory device of claim 1, wherein each of the at least one vertical stack of metallic seal structures comprises a respective memory-die bonding strip located at the bonding-side surface and that laterally surrounds each of the memory-die bonding pads.

3. The three-dimensional memory device of claim 2, wherein:
    the at least one vertical stack of metallic seal structures comprises a plurality of vertical stacks of metallic seal structures; and
    each of the plurality of vertical stacks of metallic seal structures laterally surrounds, or is laterally surrounded by, another vertical stack among the plurality of vertical stacks of metallic seal structures.

4. The three-dimensional memory device of claim 2, wherein each of the at least one vertical stack of metallic seal structures comprises a respective set of at least one upper-level metal interconnect structure that extends between the respective metallic wall structure and the respective memory-die bonding pad.

5. The three-dimensional memory device of claim 4, wherein:
    the memory die comprises at least one dielectric material layer located between the semiconductor substrate and the second alternating stack; and
    each of the at least one vertical stack of metallic seal structures comprises a respective set of at least one lower metal interconnect structure that extends between the respective metallic wall structure and the semiconductor substrate through the at least one dielectric material layer.

6. The three-dimensional memory device of claim 4, wherein each metallic wall structure directly contacts a surface of the semiconductor substrate.

7. The three-dimensional memory device of claim 1, wherein each metallic wall structure within the at least one vertical stack contacts, and laterally surrounds, a respective inner dielectric spacer, and contacts, and is laterally surrounded by, a respective outer dielectric spacer having a same composition and a same thickness as the respective inner dielectric spacer.

8. The three-dimensional memory device of claim 1, wherein:
   each of the memory stack structures comprises a memory film and a vertical semiconductor channel, the memory film including a respective vertical stack of memory elements; and
   each metallic wall structure within the at least one vertical stack protrudes above a horizontal plane including top surfaces of the memory stack structures.

9. The three-dimensional memory device of claim 1, wherein:
   the first alternating stack comprises a first staircase region in which a lateral extent of layers within the first alternating stack decreases stepwise with an increase in a vertical distance from the semiconductor substrate; and
   the second alternating stack comprises a second staircase region in which a lateral extent of layers within the second alternating stack decreases stepwise with an increase in the vertical distance from the semiconductor substrate.

10. The three-dimensional memory device of claim 9, wherein the memory die comprises a retro-stepped dielectric material portion that laterally encloses, and contacts, the first alternating stack and is laterally enclosed by, and contacts, the second alternating stack.

11. The three-dimensional memory device of claim 1, wherein:
   the memory die has a rectangular horizontal cross-sectional shape bounded by four straight sidewalls; and
   each respective metallic wall structure comprises four metallic wall segments that are parallel to a respective one of the four straight sidewalls.

12. The three-dimensional memory device of claim 1, wherein:
   a total number of the first insulating layers in the first alternating stack is the same as a total number of the second insulating layers in the second alternating stack; and
   each first insulating layer in the first alternating stack is vertically spaced from the semiconductor substrate by a same vertical distance as a respective one of the second insulating layers in the second alternating stack is from the semiconductor substrate.

13. The three-dimensional memory device of claim 1, wherein:
   the first insulating layers and the second insulating layers comprise silicon oxide;
   the electrically conductive layers comprise at least one metallic material; and
   the spacer dielectric layers comprise silicon nitride.

14. The three-dimensional memory device of claim 1, further comprising a support die bonded to the memory die, wherein the support die comprises:

peripheral circuitry configured to control operation of the vertical stacks of memory elements;
support-die bonding pads that are bonded to the memory-die bonding pads; and
support-die metal interconnect structures electrically connecting nodes of the peripheral circuitry to a respective one of the support-die bonding pads and included in support-die dielectric material layers.

15. A method of forming a three-dimensional memory device, wherein the method comprises forming a memory die using processing steps of:
   forming a vertically alternating stack of insulating layers and dielectric spacer material layers over a semiconductor substrate;
   patterning the vertically alternating stack into a first alternating stack of first insulating layers and sacrificial material layers and a second alternating stack of second insulating layers and spacer dielectric layers, wherein the second alternating stack laterally encloses, and is laterally spaced from, the first alternating stack;
   forming memory stack structures comprising vertical stacks of memory elements through the first alternating stack;
   replacing the sacrificial material layers with electrically conductive layers while retaining the second alternating stack intact;
   forming at least one metallic wall structure vertically through the second alternating stack;
   forming memory-die bonding pads within dielectric material layers over the first alternating stack; and
   forming an edge seal assembly comprising at least one vertical stack of metallic seal structures, wherein each of the at least one vertical stack of metallic seal structures vertically extends from a top surface of the semiconductor substrate to a bonding-side surface of the dielectric material layers, and comprises a respective one of the at least one metallic wall structure.

16. The method of claim 15, further comprising forming at least one bonding strip concurrently with formation of memory-die bonding pads, wherein:
   each of the at least one bonding strip laterally surrounds the memory-die bonding pads; and
   each of the at least one vertical stack of metallic seal structures comprises a respective memory-die bonding strip that laterally encloses the memory-die bonding pads.

17. The method of claim 16, further comprising forming upper-level metal interconnect structures in the dielectric material layers, wherein each of the at least one vertical stack of metallic seal structures comprises a respective subset of the upper-level metal interconnect structures that extends between the respective metallic wall structure and the respective memory-die bonding pad.

18. The method of claim 17, further comprising forming lower metal interconnect structures within lower-level dielectric material layers over the semiconductor substrate, wherein the vertically alternating stack is formed over the lower-level dielectric material layers,
   wherein each of the at least one vertical stack of metallic seal structures comprises a respective subset of the lower metal interconnect structures that extends between the respective metallic wall structure and the semiconductor substrate.

19. The method of claim 15, wherein:
   the at least one vertical stack of metallic seal structures comprises a plurality of vertical stacks of metallic seal structures; and each of the plurality of vertical stacks of metallic seal structures laterally surrounds, or is laterally surrounded by, another vertical stack among the plurality of vertical stacks of metallic seal structures.

20. The method of claim 15, further comprising:
providing a support die that comprises:
- a peripheral circuit configured to control operation of the vertical stacks of memory elements,
- support-die bonding pads located at a bonding-side surface of support-die dielectric material layers that overlie the peripheral circuit, and
- support-die metal interconnect structures electrically connecting nodes of the peripheral circuit to a respective one of the support-die bonding pads and included in the support-die dielectric material layers, and bonding the support-die bonding pads to the memory-die bonding pads.

* * * * *